(12) United States Patent
Huang

(10) Patent No.: US 10,978,417 B2
(45) Date of Patent: Apr. 13, 2021

(54) WIRING STRUCTURE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/398,016

(22) Filed: Apr. 29, 2019

(65) Prior Publication Data

US 2020/0343212 A1     Oct. 29, 2020

(51) Int. Cl.
| | |
|---|---|
| *H01L 23/00* | (2006.01) |
| *H01L 23/48* | (2006.01) |
| *H01L 23/522* | (2006.01) |
| *H01L 21/768* | (2006.01) |

(52) U.S. Cl.
CPC ........ *H01L 24/32* (2013.01); *H01L 21/76816* (2013.01); *H01L 21/76871* (2013.01); *H01L 23/481* (2013.01); *H01L 23/5226* (2013.01); *H01L 24/43* (2013.01); *H01L 24/48* (2013.01)

(58) Field of Classification Search
None
See application file for complete search history.

(56) References Cited

U.S. PATENT DOCUMENTS

| | | | |
|---|---|---|---|
| 8,288,875 B2 | 10/2012 | Shimizu et al. | |
| 9,425,137 B2 * | 8/2016 | Naganuma | ........ H01L 23/49822 |
| 9,872,401 B2 * | 1/2018 | Tomikawa | ........... H05K 3/4602 |
| 2005/0253248 A1 * | 11/2005 | Shimizu | .................. H01L 24/81 |
| | | | 257/700 |
| 2015/0357277 A1 * | 12/2015 | Nagai | ................... H01L 23/544 |
| | | | 174/255 |
| 2015/0366077 A1 * | 12/2015 | Kawai | ................. H05K 3/4644 |
| | | | 29/832 |
| 2016/0020163 A1 * | 1/2016 | Shimizu | ............ H01L 23/49822 |
| | | | 361/768 |
| 2017/0064841 A1 * | 3/2017 | Han | ....................... H05K 3/007 |
| 2017/0202083 A1 * | 7/2017 | Baek | ................. H01L 23/49534 |
| 2018/0047661 A1 * | 2/2018 | Oshima | ............ H01L 23/49822 |
| 2018/0061765 A1 * | 3/2018 | Gozu | ................... H01L 23/5383 |
| 2018/0184521 A1 * | 6/2018 | Kitajo | ....................... H05K 3/40 |
| 2018/0316083 A1 * | 11/2018 | Chen | .................... H01Q 1/2283 |
| 2019/0067178 A1 * | 2/2019 | Kang | ....................... H01L 24/05 |
| 2019/0333849 A1 * | 10/2019 | Furuichi | ................. H01L 23/13 |
| 2019/0341357 A1 * | 11/2019 | Hu | .................... H01L 23/49822 |

* cited by examiner

*Primary Examiner* — Evren Seven
(74) *Attorney, Agent, or Firm* — Foley & Lardner LLP

(57) ABSTRACT

A wiring structure includes an upper conductive structure, a lower conductive structure and an intermediate layer. The upper conductive structure includes at least one upper dielectric layer and at least one upper circuit layer in contact with the dielectric layer. The lower conductive structure includes at least one lower dielectric layer and at least one lower circuit layer in contact with the lower dielectric layer. The at least one lower dielectric layer of the lower conductive structure is substantially free of glass fiber. The intermediate layer is disposed between the upper conductive structure and the lower conductive structure and bonds the upper conductive structure and the lower conductive structure together. The upper conductive structure is electrically connected to the lower conductive structure.

18 Claims, 37 Drawing Sheets

WIRING STRUCTURE AND METHOD FOR MANUFACTURING THE SAME

BACKGROUND

1. Field of the Disclosure

The present disclosure relates to a wiring structure and a manufacturing method, and to a wiring structure including at least two conductive structures attached or bonded together by an intermediate layer, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of a semiconductor substrate may correspondingly increase, and a yield of the semiconductor substrate may decrease.

SUMMARY

In some embodiments, a wiring structure includes: (a) an upper conductive structure including at least one upper dielectric layer and at least one upper circuit layer in contact with the upper dielectric layer; (b) a lower conductive structure including at least one lower dielectric layer and at least one lower circuit layer in contact with the lower dielectric layer, wherein the at least one lower dielectric layer of the lower conductive structure is substantially free of glass fiber; and (c) an intermediate layer disposed between the upper conductive structure and the lower conductive structure and bonding the upper conductive structure and the lower conductive structure together, wherein the upper conductive structure is electrically connected to the lower conductive structure.

In some embodiments, a wiring structure includes: (a) an upper conductive structure including at least one upper dielectric layer and at least one upper circuit layer in contact with the upper dielectric layer; (b) a lower conductive structure including at least one lower dielectric layer and at least one lower circuit layer in contact with the lower dielectric layer; and (c) an intermediate layer disposed between the upper conductive structure and the lower conductive structure and bonding the upper conductive structure and the lower conductive structure together, wherein the upper conductive structure is electrically connected to the lower conductive structure, a coefficient of thermal expansion (CTE) of the upper conductive structure is less than a CTE of the intermediate layer, and the CTE of the intermediate layer is less than a CTE of the lower conductive structure.

In some embodiments, a wiring structure includes: (a) a low-density stacked structure including at least one dielectric layer and at least one low-density circuit layer in contact with the dielectric layer, wherein the at least one dielectric layer of the low-density stacked structure includes a first insulating film; (b) a high-density stacked structure disposed on the low-density stacked structure, wherein the high-density stacked structure includes at least one dielectric layer and at least one high-density circuit layer in contact with the dielectric layer of the high-density stacked structure; and (c) an intermediate layer disposed between the low-density stacked structure and the high-density stacked structure and bonding the low-density stacked structure and the high-density stacked structure together, wherein the low-density stacked structure is electrically connected to the high-density stacked structure, and the intermediate layer includes a second insulating film.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
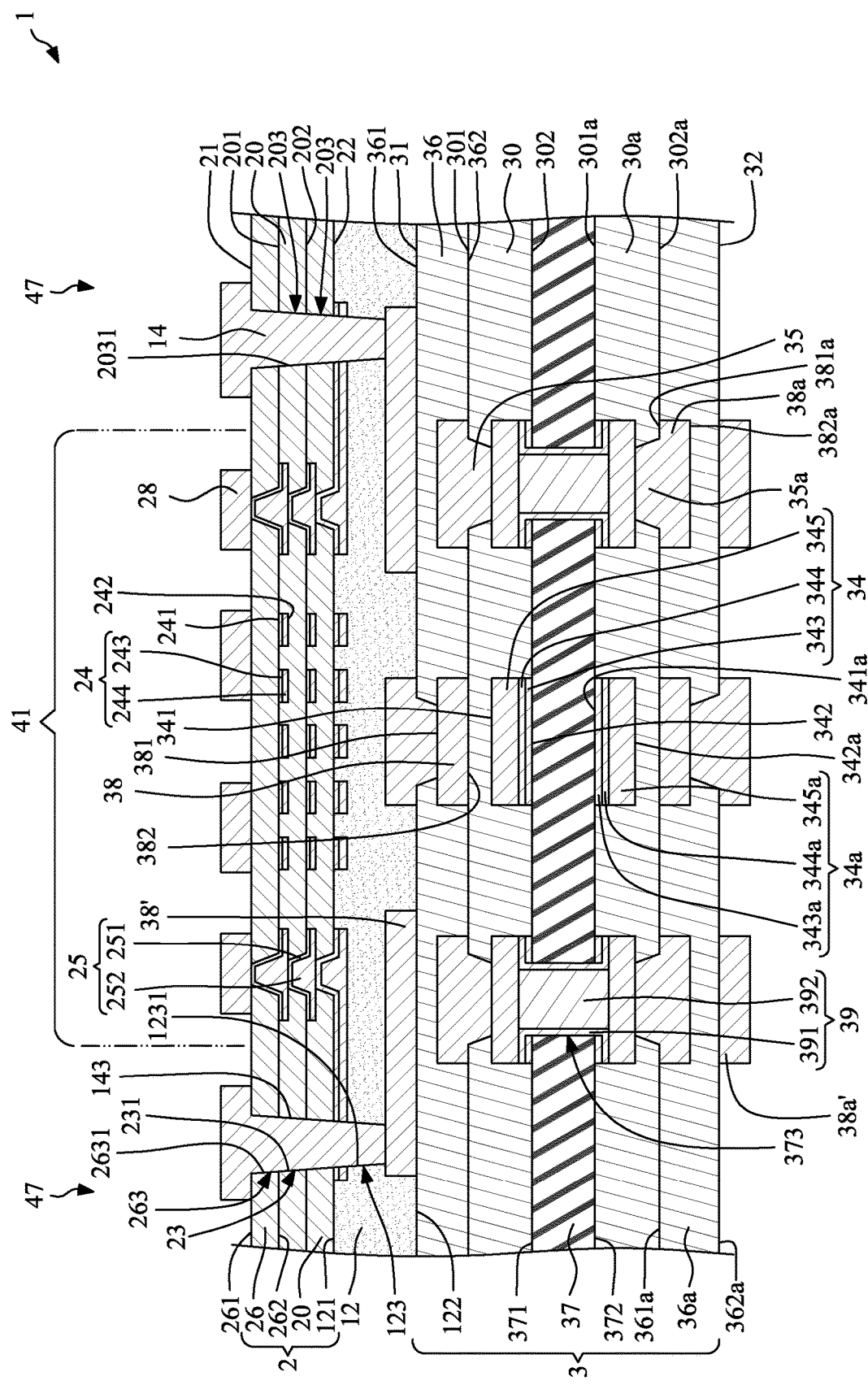
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers ($\mu$m)/10 $\mu$m, the number of the dielectric layers of such core substrate is relatively large. Although the manufacturing cost of such core substrate is low, the manufacturing yield for the circuit layers and the dielectric layers of such core substrate is also low, and, thus, the yield of such core substrate is low. In addition, each dielectric layer is relatively thick, and, thus, such core substrate is relatively thick. In some comparative embodiments, if a package has 10000 I/O counts, such core substrate may include twelve layers of circuit layers and dielectric layers. The manufacturing yield for one layer (including one circuit layer and one dielectric layer) of such core substrate may be 90%. Thus, the yield of such core substrate may be $(0.9)^{12}$=28.24%. In addition, warpage of the twelve layers of circuit layers and dielectric layers may be accumulated, and, thus, the top several layers may have severe warpage. As a result, the yield of such core substrate may be further reduced.

To address the above concerns, in some comparative embodiments, a coreless substrate is provided. The coreless substrate may include a plurality of dielectric layers and a plurality of fan-out circuit layers. In some embodiments, a manufacturing process of a coreless substrate may include the following stages. Firstly, a carrier is provided. Then, a plurality of dielectric layers and a plurality of fan-out circuit layers are formed or stacked on a surface of the carrier. One fan-out circuit layer may be embedded in one corresponding dielectric layer. Then, the carrier is removed. Therefore, the coreless substrate may include a plurality of stacked dielectric layers and a plurality of fan-out circuit layers embedded in the dielectric layers. Since a line width/line space (L/S) of the fan-out circuit layers of such coreless substrate may be less than or equal to 2 $\mu$m/2 $\mu$m, the number of the dielectric layers of such coreless substrate can be reduced. Further, the manufacturing yield for the fan-out circuit layers and the dielectric layers of such coreless substrate is high. For example, the manufacturing yield for one layer (including one fan-out circuit layer and one dielectric layer) of such coreless substrate may be 99%. However, the manufacturing cost of such coreless substrate is relatively high.

At least some embodiments of the present disclosure provide for a wiring structure which has an advantageous compromise of yield and manufacturing cost. In some embodiments, the wiring structure includes an upper conductive structure and a lower conductive structure bonded to the upper conductive structure through an intermediate layer. At least some embodiments of the present disclosure further provide for techniques for manufacturing the wiring structure.

FIG. 1 illustrates a cross-sectional view of a wiring structure 1 according to some embodiments of the present disclosure. The wiring structure 1 includes an upper conductive structure 2, a lower conductive structure 3, an intermediate layer 12 and at least one upper through via 14.

The upper conductive structure 2 includes at least one dielectric layer (including, for example, two first dielectric layers 20 and a second dielectric layer 26) and at least one circuit layer (including, for example, three first circuit layers 24 and a second circuit layer 28 formed of a metal, a metal alloy, or other conductive material) in contact with the dielectric layer (e.g., the first dielectric layers 20 and the second dielectric layer 26). In some embodiments, the upper conductive structure 2 may be similar to a coreless substrate, and may be in a wafer type, a panel type or a strip type. The upper conductive structure 2 may be also referred to as "a stacked structure" or "a high-density conductive structure" or "a high-density stacked structure". The circuit layer (including, for example, the three circuit layers 24) of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, a trace or a pad) in a unit area of the high-density circuit layer is greater than the count of the circuit line in an equal unit area of the low-density circuit layer, such as about 1.2 times or greater, about 1.5 times or greater, or about 2 times or greater. Alternatively, or in combination, a line width/line space (L/S) of the high-density circuit layer is less than a L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2 has a top surface 21 and a bottom surface 22 opposite to the top surface 21, and defines at least one through hole 23, each of which is a single, continuous through hole. The upper conductive structure 2 includes a plurality of dielectric layers (e.g., the two first dielectric layers 20 and the second dielectric layer 26), a plurality of circuit layers (e.g., the three first circuit layers 24 and the second circuit layer 28) and at least one inner via 25. The dielectric layers (e.g., the first dielectric layers 20 and the second dielectric layer 26) are stacked on one another. For example, the second dielectric layer 26 is disposed on the first dielectric layers 20, and, thus, the second dielectric layer 26 is the topmost dielectric layer. In some embodiments, a material of the dielectric layers (e.g., the first dielectric layers 20 and the second dielectric layer 26) is transparent, and can be seen through by human eyes or machine. That is, a mark disposed adjacent to the bottom surface 22 of the upper conductive structure 2 can be recognized or detected from the top surface 21 of the upper conductive structure 2 by human eyes or machine. In some embodiments, a transparent material of the dielectric layers has a light transmission for a wavelength in the visible range (or other pertinent wavelength for detection of a mark) of at least about 60%, at least about 70%, or at least about 80%.

In addition, each of the first dielectric layers 20 has a top surface 201 and a bottom surface 202 opposite to the top surface 201, and defines a through hole 203 having an inner surface 2031. The second dielectric layer 26 has a top surface 261 and a bottom surface 262 opposite to the top surface 261, and defines a through hole 263 having an inner surface 2631. The bottom surface 262 of the second dielectric layer 26 is disposed on and contacts the top surface 201 of the adjacent first dielectric layer 20. Thus, the top surface 21 of the upper conductive structure 2 is the top surface 261 of the second dielectric layer 26, and the bottom surface 22 of the upper conductive structure 2 is the bottom surface 202 of the bottommost first dielectric layer 20.

As shown in FIG. 1, each of the through holes 203 of the first dielectric layers 20 tapers downwardly along a direction from the top surface 21 towards the bottom surface 22 of the upper conductive structure 2; that is, a size of a top portion of the through hole 203 is greater than a size of a bottom portion of the through hole 203. The through hole 263 of the second dielectric layer 26 also tapers downwardly; that is, a size of a top portion of the through hole 263 is greater than a size of a bottom portion of the through hole 263. Further, the through hole 263 of the second dielectric layer 26 is aligned with and in communication with the through holes 203 of the first dielectric layers 20. The bottom portion of the through hole 263 of the second dielectric layer 26 is disposed adjacent to or connected to the top portion of the through hole 203 of the first dielectric layer 20 under the second dielectric layer 26. The size of the bottom portion of the through hole 263 of the second dielectric layer 26 is substantially equal to the size of the top portion of the through hole 203 of the first dielectric layer 20 under the second dielectric layer 26. Thus, the inner surface 2631 of the through hole 263 of the second dielectric layer 26 is coplanar with or aligned with the inner surfaces 2031 of the through holes 203 of the first dielectric layers 20. It is noted that the above-mentioned "coplanar" surfaces need not be flat. In some embodiments, the inner surface 2631 of the through hole 263 of the second dielectric layer 26 and the inner surfaces 2031 of the through holes 203 of the first dielectric layers 20 may be curved surfaces, and are portions of an inner surface 231 of the single, continuous through hole 23 for accommodating the upper through via 14. The through hole 263 of the second dielectric layer 26 and the through holes 203 of the first dielectric layers 20 are collectively configured to form or define a portion of the single through hole 23. As shown in FIG. 1, cross-sectional views of one side of the inner surface 2631 of the through hole 263 of the second dielectric layer 26 and the inner surfaces 2031 of the through holes 203 of the first dielectric layers 20 are segments of a substantially straight line. That is, cross-sectional views of one side of the inner surface 2631 of the through hole 263 of the second dielectric layer 26 and the inner surfaces 2031 of the through holes 203 of the first dielectric layers 20 may extend along the same substantially straight line. The single through hole 23 extends through the upper conductive structure 2; that is, the single through hole 23 extends from the top surface 21 of the upper conductive structure 2 to the bottom surface 22 of the upper conductive structure 2. The single through hole 23 tapers downwardly.

The first circuit layers 24 may be fan-out circuit layers or redistribution layers (RDLs), and an L/S of the first circuit layers 24 may be less than or equal to about 2 µm/about 2 µm, or less than or equal to about 1.8 µm/about 1.8 µm. Each of the first circuit layers 24 has a top surface 241 and a bottom surface 242 opposite to the top surface 241. In some embodiments, the first circuit layer 24 is embedded in the corresponding first dielectric layer 20, and the top surface 241 of the first circuit layer 24 may be substantially coplanar with the top surface 201 of the first dielectric layer 20. In some embodiments, each first circuit layer 24 may include a seed layer 243 and a conductive metallic material 244 disposed on the seed layer 243. As shown in FIG. 1, the bottommost first circuit layer 24 is disposed on and protrudes from the bottom surface 22 of the upper conductive structure 2 (e.g., the bottom surface 202 of the bottommost first dielectric layer 20). In addition, the second circuit layer 28 is disposed on and protrudes from the top surface 21 of the upper conductive structure 2 (e.g., the top surface 261 of the second dielectric layer 26). An L/S of the second circuit layer 28 may be greater than or equal to the L/S of the first circuit layer 24. As illustrated in the embodiment of FIG. 1, a horizontally connecting or extending circuit layer is omitted in the second dielectric layer 26.

The upper conductive structure 2 includes a plurality of inner vias 25. Some of the inner vias 25 are disposed between two adjacent first circuit layers 24 for electrically connecting the two first circuit layers 24. Some of the inner vias 25 are disposed between the first circuit layer 24 and the second circuit layer 28 for electrically connecting the first circuit layer 24 and the second circuit layer 28. In some embodiments, each inner via 25 may include a seed layer 251 and a conductive metallic material 252 disposed on the seed layer 251. In some embodiments, each inner via 25 and the corresponding first circuit layer 24 may be formed integrally as a monolithic or one-piece structure. Each inner via 25 tapers upwardly along a direction from the bottom surface 22 towards the top surface 21 of the upper conductive structure 2. That is, a size (e.g., a width) of a top portion of the inner via 25 is less than a size (e.g., a width) of a bottom portion of the inner via 25 that is closer towards the bottom surface 22. In some embodiments, a maximum width of the inner via 25 (e.g., at the bottom portion) may be less than or equal to about 25 µm, such as about 25 µm, about 20 µm about 15 µm or about 10 µm.

The lower conductive structure 3 includes at least one dielectric layer (including, for example, one first upper dielectric layer 30, one second upper dielectric layer 36, one first lower dielectric layer 30a and one second lower dielectric layer 36a) and at least one circuit layer (including, for example, one first upper circuit layer 34, two second upper circuit layers 38, 38', one first lower circuit layer 34a and two second lower circuit layers 38a, 38a' formed of a metal, a metal alloy, or other conductive material) in contact with the dielectric layer (e.g., the first upper dielectric layer 30, the second upper dielectric layer 36, the first lower dielectric layer 30a and the second lower dielectric layer 36a). In some embodiments, the lower conductive structure 3 may be similar to a core substrate that further includes a core portion 37, and may be in a wafer type, a panel type or a strip type. The lower conductive structure 3 may be also referred to as "a stacked structure" or "a low-density conductive structure" or "a low-density stacked structure". The circuit layer (including, for example, the first upper circuit layer 34, the two second upper circuit layers 38, 38', the first lower circuit layer 34a and the two second lower circuit layers 38a, 38a') of the lower conductive structure 3 may be also referred to as "a low-density circuit layer". As shown in FIG. 1, the lower conductive structure 3 has a top surface 31 and a bottom surface 32 opposite to the top surface 31. The lower conductive structure 3 includes a plurality of dielectric layers (for example, the first upper dielectric layer 30, the second upper dielectric layer 36, the first lower dielectric layer 30a and the second lower dielectric layer 36a), a plurality of circuit layers (for example, the first upper circuit layer 34, the two second upper circuit layers 38, 38', the first lower circuit layer 34a and the two second lower circuit layers 38a, 38a') and at least one inner via (including, for example, a plurality of upper interconnection vias 35 and a plurality of lower interconnection vias 35a).

In some embodiments, the core portion 37 of the lower conductive structure 3 is substantially free of reinforcement material such as glass fiber. That is, the core portion 37 of the lower conductive structure 3 may be devoid of reinforcement material such as glass fiber, and may include a homogeneous material composition of a resin. Alternatively, the core portion 37 of the lower conductive structure 3 may include a small amount of reinforcement material such as glass fiber, for example, about 5% by weight or less, about 3% by weight or less, or about 2% by weight or less. In addition, a material of the core portion 37 may include an insulating film, such as Ajinomoto build-up film (ABF). Further, a Young's modulus of the core portion 37 of the lower conductive structure 3 may be greater than or equal to about 4.0 GPa at 23° C., such as about 4.0 GPa at 23° C. or greater, about 5.0 GPa at 23° C. or greater, or about 7.5 GPa at 23° C. or greater.

The core portion 37 has a top surface 371 and a bottom surface 372 opposite to the top surface 371, and defines a plurality of through holes 373 extending through the core portion 37. An interconnection via 39 is disposed or formed in each through hole 373 for vertical connection. In some embodiments, each interconnection via 39 includes a base metallic layer 391 and an insulation material 392. The base metallic layer 391 is disposed or formed on a side wall of the through hole 373, and defines a central through hole. The insulation material 392 fills the central through hole defined by the base metallic layer 391. In some embodiments, the interconnection via 39 may omit an insulation material, and may include a bulk metallic material that fills the through hole 373.

In some embodiments, at least one dielectric layer (including, for example, one first upper dielectric layer 30, one second upper dielectric layer 36, one first lower dielectric layer 30a and one second lower dielectric layer 36a) of the lower conductive structure 3 is substantially free of reinforcement material such as glass fiber. That is, the dielectric layer (including, for example, one first upper dielectric layer 30, one second upper dielectric layer 36, one first lower dielectric layer 30a and one second lower dielectric layer 36a) of the lower conductive structure 3 may be devoid of reinforcement material such as glass fiber, and may include a homogeneous material composition of a resin. Alternatively, the dielectric layer (including, for example, one first upper dielectric layer 30, one second upper dielectric layer 36, one first lower dielectric layer 30a and one second lower dielectric layer 36a) of the lower conductive structure 3 may include a small amount of reinforcement material such as glass fiber, for example, about 5% by weight or less, about 3% by weight or less, or about 2% by weight or less. In addition, a material of the dielectric layer (including, for example, one first upper dielectric layer 30, one second upper dielectric layer 36, one first lower dielectric layer 30a and one second lower dielectric layer 36a) of the lower conductive structure 3 may include an insulating film, such as ABF. Further, a Young's modulus of the dielectric layer (including, for example, one first upper dielectric layer 30, one second upper dielectric layer 36, one first lower dielectric layer 30a and one second lower dielectric layer 36a) of the lower conductive structure 3 may be greater than or equal to about 4.0 GPa at 23° C., such as about 4.0 GPa at 23° C. or greater, about 5.0 GPa at 23° C. or greater, or about 7.5 GPa at 23° C. or greater. In some embodiments, the lower conductive structure 3 may be a resin coated copper-foil (RCC) substrate. The whole lower conductive structure 3 may be substantially free of reinforcement material such as glass fiber.

The first upper dielectric layer 30 is disposed on the top surface 371 of the core portion 37, and has a top surface 301 and a bottom surface 302 opposite to the top surface 301. Thus, the bottom surface 302 of the first upper dielectric layer 30 contacts the top surface 371 of the core portion 37. The second upper dielectric layer 36 is stacked or disposed on the first upper dielectric layer 30, and has a top surface 361 and a bottom surface 362 opposite to the top surface 361. Thus, the bottom surface 362 of the second upper dielectric layer 36 contacts the top surface 301 of the first upper dielectric layer 30, and the second upper dielectric layer 36 is the topmost dielectric layer. In addition, the first lower dielectric layer 30a is disposed on the bottom surface 372 of the core portion 37, and has a top surface 301a and a bottom surface 302a opposite to the top surface 301a. Thus, the top surface 301a of the first lower dielectric layer 30a contacts the bottom surface 372 of the core portion 37. The second lower dielectric layer 36a is stacked or disposed on the first lower dielectric layer 30a, and has a top surface 361a and a bottom surface 362a opposite to the top surface 361a. Thus, the top surface 361a of the second lower dielectric layer 36a contacts the bottom surface 302a of the first lower dielectric layer 30a, and the second lower dielectric layer 36a is the bottommost dielectric layer. As shown in FIG. 1, the top surface 31 of the lower conductive structure 3 is the top surface 361 of the second upper dielectric layer 36, and the bottom surface 32 of the lower conductive structure 3 is the bottom surface 362a of the second lower dielectric layer 36a.

A thickness of each of the dielectric layers (e.g., the first dielectric layers 20 and the second dielectric layer 26) of the upper conductive structure 2 is less than or equal to about 40%, less than or equal to about 35%, less than or equal to about 30% of a thickness of each of the dielectric layers (e.g., the first upper dielectric layer 30, the second upper dielectric layer 36, the first lower dielectric layer 30a and the second lower dielectric layer 36a) of the lower conductive structure 3. For example, a thickness of each of the dielectric layers (e.g., the first dielectric layers 20 and the second dielectric layer 26) of the upper conductive structure 2 may be less than or equal to about 7 μm, and a thickness of each of the dielectric layers (e.g., the first upper dielectric layer 30, the second upper dielectric layer 36, the first lower dielectric layer 30a and the second lower dielectric layer 36a) of the lower conductive structure 3 may be about 40 μm.

An L/S of the first upper circuit layer 34 may be greater than or equal to about 10 μm/about 10 μm. Thus, the L/S of the first upper circuit layer 34 may be greater than or equal to about five times the L/S of the first circuit layers 24 of the upper conductive structure 2. The first upper circuit layer 34 has a top surface 341 and a bottom surface 342 opposite to the top surface 341. In some embodiments, the first upper circuit layer 34 is formed or disposed on the top surface 371 of the core portion 37, and covered by the first upper dielectric layer 30. The bottom surface 342 of the first upper circuit layer 34 contacts the top surface 371 of the core portion 37. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. Thus, the L/S of the second upper circuit layer 38 may be substantially equal to the L/S of the first upper circuit layer 34, and may be greater than or equal to about five times the L/S of the first circuit layers 24 of the upper conductive structure 2. The second upper circuit layer 38 has a top surface 381 and a bottom surface 382 opposite to the top surface 381. In some embodiments, the second upper circuit layer 38 is formed or disposed on the top surface 301 of the first upper dielectric layer 30, and covered by the second upper dielectric layer 36. The bottom surface 382 of the second upper circuit layer 38 contacts the top surface 301 of the first upper dielectric layer 30. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3.

In addition, in some embodiments, the second upper circuit layer 38' is disposed on and protrudes from the top surface 361 of the second upper dielectric layer 36. In some embodiments, the second upper circuit layer 38 is electrically connected to the second upper circuit layer 38' through the upper interconnection vias 35. That is, the upper interconnection vias 35 are disposed between the second upper circuit layers 38, 38' for electrically connecting the second upper circuit layers 38, 38'. In some embodiments, the second upper circuit layer 38' and the upper interconnection vias 35 are formed integrally as a monolithic or one-piece structure.

An L/S of the first lower circuit layer 34a may be greater than or equal to about 10 μm/about 10 μm. Thus, the L/S of the first lower circuit layer 34a may be greater than or equal to about five times the L/S of the first circuit layers 24 of the upper conductive structure 2. The first lower circuit layer 34a has a top surface 341a and a bottom surface 342a opposite to the top surface 341a. In some embodiments, the first lower circuit layer 34a is formed or disposed on the bottom surface 372 of the core portion 37, and covered by the first lower dielectric layer 30a. The top surface 341a of the first lower circuit layer 34a contacts the bottom surface 372 of the core portion 37. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 μm/about 10 μm. Thus, the L/S of the second lower circuit layer 38a may be substantially equal to the L/S of the first upper circuit layer 34, and may be greater than or equal to about five times the L/S of the first circuit layers 24 of the upper conductive structure 2. The second lower circuit layer 38a has a top surface 381a and a bottom surface 382a opposite to the top surface 381a. In some embodiments, the second lower circuit layer 38a is formed or disposed on the bottom surface 302a of the first lower dielectric layer 30a, and covered by the second lower dielectric layer 36a. The top surface 381a of the second lower circuit layer 38a contacts the bottom surface 302a of the first lower dielectric layer 30a. In some embodiments, the second lower circuit layer 38a is electrically connected to the first lower circuit layer 34a through the lower interconnection vias 35a. That is, the lower interconnection vias 35a are disposed between the second lower circuit layer 38a and the first lower circuit layer 34a for electrically connecting the second lower circuit layer 38a and the first lower circuit layer 34a. In some embodiments, the second lower circuit layer 38a and the lower interconnection vias 35a are formed integrally as a monolithic or one-piece structure. The lower interconnection vias 35a tapers upwardly along a direction from the bottom surface 32 towards the top surface 31 of the lower conductive structure 3.

In addition, in some embodiments, the second lower circuit layer 38a' is disposed on and protrudes from the bottom surface 362a of the second lower dielectric layer 36a. In some embodiments, the second lower circuit layer 38a' is electrically connected to the second lower circuit layer 38a through the lower interconnection vias 35a. That is, the lower interconnection vias 35a are disposed between the second lower circuit layers 38*a*, 38*a*' for electrically connecting the second lower circuit layers 38*a*, 38*a*'. In some embodiments, the second lower circuit layer 38*a*' and the lower interconnection vias 35*a* are formed integrally as a monolithic or one-piece structure.

In some embodiments, each interconnection via 39 electrically connects the first upper circuit layer 34 and the first lower circuit layer 34*a*. The base metallic layer 391 of the interconnection via 39, the second metallic layer 344 of the first upper circuit layer 34 and the second metallic layer 344*a* the first lower circuit layer 34*a* may be formed integrally and concurrently as a monolithic or one-piece structure.

The intermediate layer 12 is interposed or disposed between the upper conductive structure 2 and the lower conductive structure 3 to bond the upper conductive structure 2 and the lower conductive structure 3 together. That is, the intermediate layer 12 adheres to the bottom surface 22 of the upper conductive structure 2 and the top surface 31 of the lower conductive structure 3. In some embodiments, the intermediate layer 12 may be an adhesion layer that is cured from an adhesive material (e.g., includes a cured adhesive material such as an adhesive polymeric material). The intermediate layer 12 has a top surface 121 and a bottom surface 122 opposite to the top surface 121, and defines at least one through hole 123 having an inner surface 1231. The top surface 121 of the intermediate layer 12 contacts the bottom surface 22 of the upper conductive structure 2 (that is, the bottom surface 22 of the upper conductive structure 2 is attached to the top surface 121 of the intermediate layer 12), and the bottom surface 122 of the intermediate layer 12 contacts the top surface 31 of the lower conductive structure 3. Thus, the bottommost first circuit layer 24 of the upper conductive structure 2 and the topmost circuit layer 38' (e.g., the second upper circuit layer 38') of the lower conductive structure 3 are embedded in the intermediate layer 12. In some embodiments, a bonding force between two adjacent dielectric layers (e.g., two adjacent first dielectric layers 20) of the upper conductive structure 2 is greater than a bonding force between a dielectric layer (e.g., the bottommost first dielectric layers 20) of the upper conductive structure 2 and the intermediate layer 12. A surface roughness of a boundary between two adjacent dielectric layers (e.g., two adjacent first dielectric layers 20) of the upper conductive structure 2 is greater than a surface roughness of a boundary between a dielectric layer (e.g., the bottommost first dielectric layers 20) of the upper conductive structure 2 and the intermediate layer 12, such as about 1.1 times or greater, about 1.3 times or greater, or about 1.5 times or greater in terms of root mean squared surface roughness.

In some embodiments, a material of the intermediate layer 12 is transparent, and can be seen through by human eyes or machine. That is, a mark disposed adjacent to the top surface 31 of the lower conductive structure 3 can be recognized or detected from the top surface 21 of the upper conductive structure 2 by human eyes or machine. In some embodiments, the intermediate layer 12 is substantially free of reinforcement material such as glass fiber. That is, the intermediate layer 12 may be devoid of reinforcement material such as glass fiber, and may include a homogeneous material composition of a resin. Alternatively, the intermediate layer 12 may include a small amount of reinforcement material such as glass fiber, for example, about 5% by weight or less, about 3% by weight or less, or about 2% by weight or less. In addition, a material of the intermediate layer 12 may include an insulating film, such as ABF. Further, a Young's modulus of the intermediate layer 12 may be greater than or equal to about 4.0 GPa at 23° C., such as about 4.0 GPa at 23° C. or greater, about 5.0 GPa at 23° C. or greater, or about 7.5 GPa at 23° C. or greater.

In some embodiments, the intermediate layer 12 and the lower conductive structure 3 may both include an insulating film material, such as ABF type material. Further, a coefficient of thermal expansion (CTE) of the upper conductive structure 2 is less than a CTE of the intermediate layer 12, and the CTE of the intermediate layer 12 is less than a CTE of the lower conductive structure 3. Thus, a value of the CTE of the intermediate layer 12 is between a value of the CTE of the upper conductive structure 2 and a value of the CTE of the lower conductive structure 3. In some embodiments, the CTE of the intermediate layer 12 may be less than the CTE of the lower conductive structure 3 but greater than or equal to about 0.8 times (such as greater than or equal to about 0.85 times, about 0.9 times, or about 0.95 times) the CTE of the lower conductive structure 3. Thus, the CTE of the intermediate layer 12 is close to the CTE of the lower conductive structure 3. As a result, a delamination between the intermediate layer 12 and the lower conductive structure 3 may be reduced. In addition, in some embodiments, the CTE of the upper conductive structure 2 may be less than the CTE of the intermediate layer 12 but greater than or equal to about 0.8 times (such as greater than or equal to about 0.85 times, about 0.9 times, or about 0.95 times) the CTE of the intermediate layer 12. Thus, the CTE of the upper conductive structure 2 is close to the CTE of the intermediate layer 12. As a result, a delamination between the upper conductive structure 2 and the intermediate layer 12 may be reduced.

The through hole 123 extends through the intermediate layer 12. In some embodiments, the through hole 123 of the intermediate layer 12 may extend through the bottommost first circuit layer 24 of the upper conductive structure 2 and terminate at or on a topmost circuit layer (e.g., the second upper circuit layer 38') of the lower conductive structure 3. That is, the through hole 123 of the intermediate layer 12 does not extend through the topmost circuit layer (e.g., the second upper circuit layer 38') of the lower conductive structure 3. The through hole 123 of the intermediate layer 12 may expose a portion of the topmost circuit layer (e.g., the top surface of the second upper circuit layer 38') of the lower conductive structure 3.

As shown in FIG. 1, the through hole 123 of the intermediate layer 12 tapers downwardly along a direction from the top surface 121 towards the bottom surface 122 of the intermediate layer 12; that is, a size of a top portion of the through hole 123 is greater than a size of a bottom portion of the through hole 123. Further, the through hole 123 of the intermediate layer 12 is aligned with and in communication with the through holes 203 of the first dielectric layers 20 and the through hole 263 of the second dielectric layer 26. The bottom portion of the through hole 203 of the bottommost first dielectric layer 20 is disposed adjacent to or connected to the top portion of the through hole 123 of the intermediate layer 12. The size of the bottom portion of the through hole 203 of the bottommost first dielectric layer 20 is substantially equal to the size of the top portion of the through hole 123 of the intermediate layer 12. Thus, the inner surface 1231 of the through hole 123 of the intermediate layer 12 is coplanar or aligned with the inner surfaces 2031 of the through holes 203 of the first dielectric layers 20 and the inner surface 2631 of the through hole 263 of the second dielectric layer 26. In some embodiments, inner surface 1231 of the through hole 123 of the intermediate layer 12 may be a curved surface, and is a portion of an inner surface 231 of the single, continuous through hole 23 for accommodating the upper through via 14. The through hole 123 of the intermediate layer 12, the through hole 203 of the first dielectric layer 20 and the through hole 263 of the second dielectric layer 26 are collectively configured to form or define the single through hole 23. Thus, the single through hole 23 includes the through hole 123 of the intermediate layer 12, the through hole 203 of the first dielectric layer 20 and the through hole 263 of the second dielectric layer 26.

As shown in FIG. 1, cross-sectional views of one side of the through hole 123 of the intermediate layer 12, the inner surfaces 2031 of the through holes 203 of the first dielectric layers 20 and the inner surface 2631 of the through hole 263 of the second dielectric layer 26 are segments of a substantially straight line. That is, cross-sectional views of one side of the inner surface 1231 of the through hole 123 of the intermediate layer 12, the inner surfaces 2031 of the through holes 203 of the first dielectric layers 20 and the inner surface 2631 of the through hole 263 of the second dielectric layer 26 may extend along the same substantially straight line. The single through hole 23 extends through the upper conductive structure 2 and the intermediate layer 12; that is, the single through hole 23 extends from the top surface 21 of the upper conductive structure 2 to the bottom portion of the intermediate layer 12 to expose a portion of the topmost circuit layer (e.g., the top surface of the second upper circuit layer 38') of the lower conductive structure 3. The single through hole 23 tapers downwardly. A maximum width (e.g., at the top portion) of the single through hole 23 may be about 25 μm to about 60 μm.

The upper through via 14 is formed or disposed in the corresponding single through hole 23, and is formed of a metal, a metal alloy, or other conductive material. Thus, the upper through via 14 extends through at least a portion of the upper conductive structure 2 and the intermediate layer 12, and is electrically connected to the topmost circuit layer (e.g., the top surface of the second upper circuit layer 38') of the lower conductive structure 3. As shown in FIG. 1, the upper through via 14 extends through and contacts the bottommost first circuit layer 24 of the upper conductive structure 2, and terminates at or on, and contacts a portion of the topmost circuit layer (e.g., the top surface of the second upper circuit layer 38') of the lower conductive structure 3. The upper through via 14 extends from the top surface 21 of the upper conductive structure 2 to the bottom surface 122 of the intermediate layer 12. Thus, the upper through via 14 extends to contact a portion of the lower conductive structure 3, and the upper through via 14 does not extend through the lower conductive structure 3. In some embodiments, a low-density circuit layer (e.g., the second upper circuit layer 38') of the low-density conductive structure (e.g., the lower conductive structure 3) is electrically connected to a high-density circuit layer (e.g., the bottommost first circuit layer 24) of the high-density conductive structure (e.g., the upper conductive structure 2) solely by the upper through via 14 extending through the high-density circuit layer (e.g., the bottommost first circuit layer 24) of the high-density conductive structure (e.g., the upper conductive structure 2). A length (along a longitudinal axis) of the upper through via 14 is greater than a thickness of the high-density conductive structure (e.g., the upper conductive structure 2). Further, the upper through via 14 tapers downwardly; that is, a size of a top portion of the upper through via 14 is greater than a size of a bottom portion of the upper through via 14. Thus, a tapering direction of the inner via 25 of the upper conductive structure 2 is different from a tapering direction of the upper through via 14. In some embodiments, the upper through via 14 is a monolithic structure or a one-piece structure having a homogeneous material composition, and a peripheral surface of the upper through via 14 is a substantially continuous surface without boundaries. The upper through via 14 and the second circuit layer 28 may be formed integrally as a monolithic or one-piece structure. In some embodiments, a maximum width of the upper through via 14 may be less than about 40 μm, such as about 30 μm or about 20 μm.

As shown in FIG. 1, the upper conductive structure 2 includes a high-density region 41 and a low-density region 47. In some embodiments, a density of a circuit line (including, for example, a trace or a pad) in the high-density region 41 is greater than a density of a circuit line in the low-density region 47. That is, the count of the circuit line (including, for example, the trace or the pad) in a unit area within the high-density region 41 is greater than the count of the circuit line in an equal unit area within the low-density region 47. Alternatively, or in combination, an L/S of a circuit layer within the high-density region 41 is less than an L/S of a circuit layer within the low-density region 47. Further, the upper through via 14 is disposed in the low-density region 47 of the high-density conductive structure (e.g., the upper conductive structure 2). In some embodiments, the high-density region 41 may be a chip bonding area.

As shown in the embodiment illustrated in FIG. 1, the wiring structure 1 is a combination of the upper conductive structure 2 and the lower conductive structure 3, in which the first circuit layer 24 of the upper conductive structure 2 has fine pitch, high yield and low thickness; and the circuit layers (e.g., the first upper circuit layer 34, the second upper circuit layers 38, 38', the first lower circuit layer 34a and the second lower circuit layers 38a, 38a') of the lower conductive structure 3 have low manufacturing cost. Thus, the wiring structure 1 has an advantageous compromise of yield and manufacturing cost, and the wiring structure 1 has a relatively low thickness. In some embodiments, if a package has 10000 I/O counts, the wiring structure 1 includes three layers of the first circuit layers 24 of the upper conductive structure 2 and six layers of the circuit layers (e.g., the first upper circuit layer 34, the second upper circuit layers 38, 38', the first lower circuit layer 34a and the second lower circuit layers 38a, 38a') of the lower conductive structure 3. The manufacturing yield for one layer of the first circuit layers 24 of the upper conductive structure 2 may be 99%, and the manufacturing yield for one layer of the circuit layers (e.g., the first upper circuit layer 34, the second upper circuit layers 38, 38', the first lower circuit layer 34a and the second lower circuit layers 38a, 38a') of the lower conductive structure 3 may be 90%. Thus, the yield of the wiring structure 1 may be improved. In addition, the warpage of the upper conductive structure 2 and the warpage of the lower conductive structure 3 are separated and will not influence each other. In some embodiments, a warpage shape of the upper conductive structure 2 may be different from a warpage shape of the lower conductive structure 3. For example, the warpage shape of the upper conductive structure 2 may be a convex shape, and the warpage shape of the lower conductive structure 3 may be a concave shape. In some embodiments, the warpage shape of the upper conductive structure 2 may be the same as the warpage shape of the lower conductive structure 3; however, the warpage of the lower conductive structure 3 will not be accumulated onto the warpage of the upper conductive structure 2. Thus, the yield of the wiring structure 1 may be further improved.

In addition, during a manufacturing process, the lower conductive structure 3 and the upper conductive structure 2 may be tested individually before being bonded together. Therefore, known good lower conductive structure 3 and known good upper conductive structure 2 may be selectively bonded together. Bad (or unqualified) lower conductive structure 3 and bad (or unqualified) upper conductive structure 2 may be discarded. As a result, the yield of the wiring structure 1 may be further improved.

Figure 2:
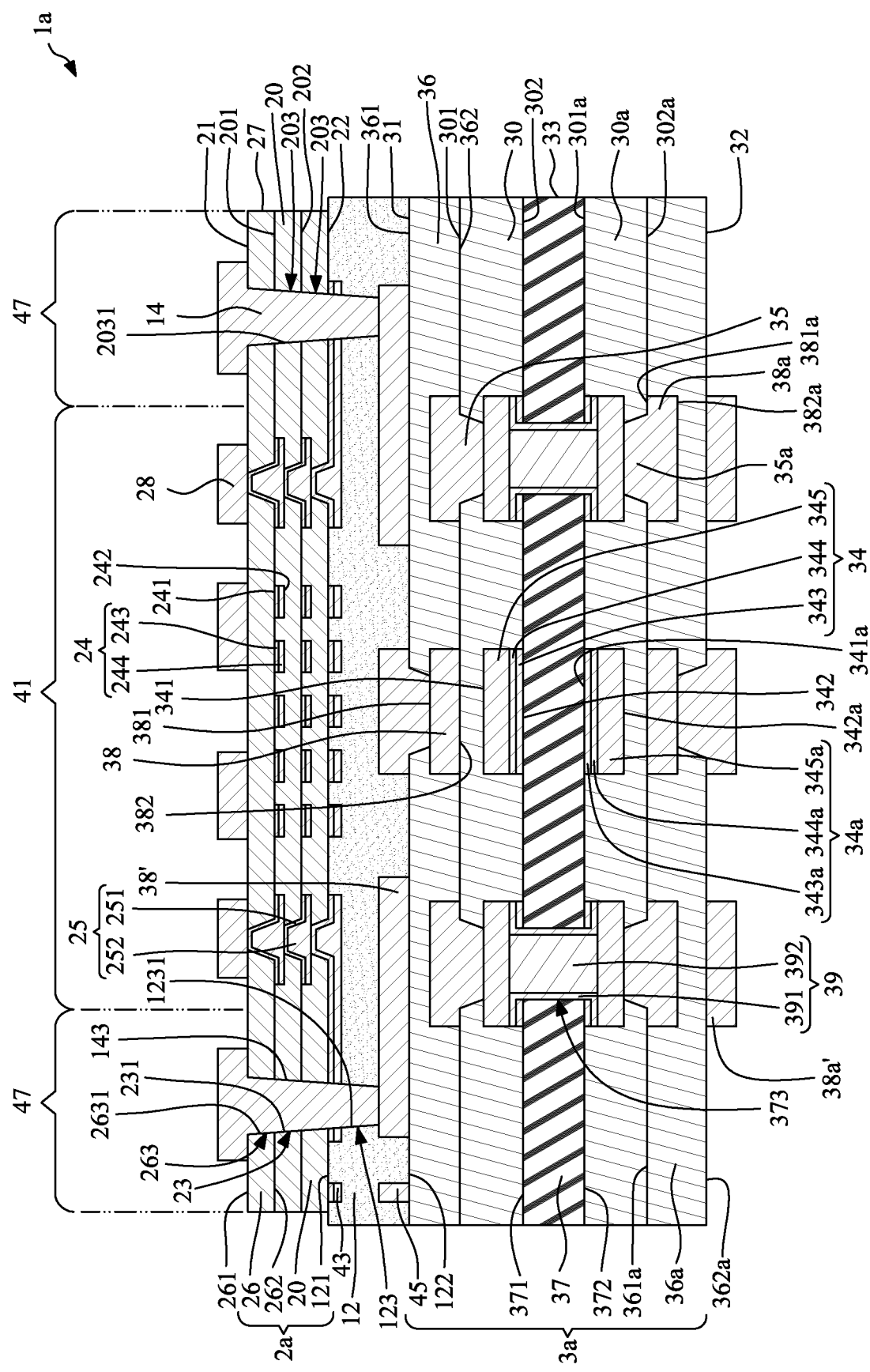
FIG. 2 illustrates a cross-sectional view of a wiring structure according to some embodiments of the present disclosure.

FIG. 2 illustrates a cross-sectional view of a wiring structure 1a according to some embodiments of the present disclosure. The wiring structure 1a is similar to the wiring structure 1 shown in FIG. 1, except for structures of an upper conductive structure 2a and a lower conductive structure 3a. As shown in FIG. 2, the upper conductive structure 2a and the lower conductive structure 3a are both strip structures. Thus, the wiring structure 1a is a strip structure. In some embodiments, the lower conductive structure 3a may be a panel structure that carries a plurality of strip upper conductive structures 2a. Thus, the wiring structure 1a is a panel structure. A length (e.g., about 240 mm) of the upper conductive structure 2a is greater than a width (e.g., about 95 mm) of the upper conductive structure 2a from a top view. Further, a length of the lower conductive structure 3a is greater than a width of the lower conductive structure 3a from a top view. In addition, a lateral peripheral surface 27 of the upper conductive structure 2a is not coplanar with (e.g., is inwardly recessed from or otherwise displaced from) a lateral peripheral surface 33 of the lower conductive structure 3a. In some embodiments, during a manufacturing process, the lower conductive structure 3a and the upper conductive structure 2a may be both known good strip structures. Alternatively, the upper conductive structure 2a may be a known good strip structure, and the lower conductive structure 3a may be a known good panel structure. As a result, the yield of the wiring structure 1a may be further improved.

As shown in FIG. 2, the upper conductive structure 2a includes at least one fiducial mark 43 at a corner thereof, and the lower conductive structure 3a has at least one fiducial mark 45 at a corner thereof. The fiducial mark 43 of the upper conductive structure 2a is aligned with a fiducial mark 45 of the lower conductive structure 3a during a manufacturing process, so that the relative position of the upper conductive structure 2a and the lower conductive structure 3a is secured. In some embodiments, the fiducial mark 43 of the upper conductive structure 2a is disposed on and protrudes from the bottom surface 22 of the upper conductive structure 2a (e.g., the bottom surface 202 of the bottommost first dielectric layer 20). The fiducial mark 43 and the bottommost first circuit layer 24 may be at, or part of, the same layer, and may be formed concurrently. Further, the fiducial mark 45 of the lower conductive structure 3a is disposed on and protrudes from the top surface 31 of the lower conductive structure 3a (e.g., the top surface 361 of the second upper dielectric layer 36). The fiducial mark 45 and the second upper circuit layer 38' may be at, or part of, the same layer, and may be formed concurrently.

Figure 2A:
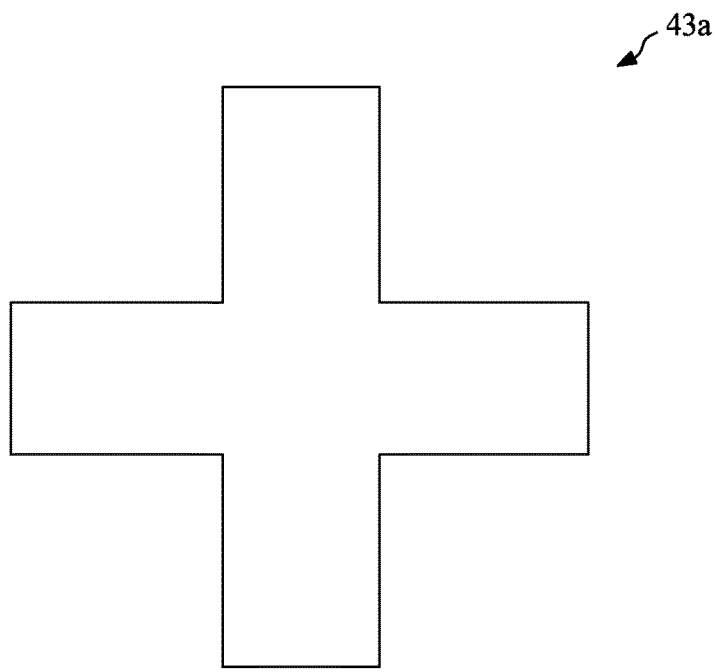
FIG. 2A illustrates a top view of an example of a fiducial mark of an upper conductive structure according to some embodiments of the present disclosure.

FIG. 2A illustrates a top view of an example of a fiducial mark 43a of the upper conductive structure 2a according to some embodiments of the present disclosure. The fiducial mark 43a of the upper conductive structure 2a has a continuous cross shape.

Figure 2B:
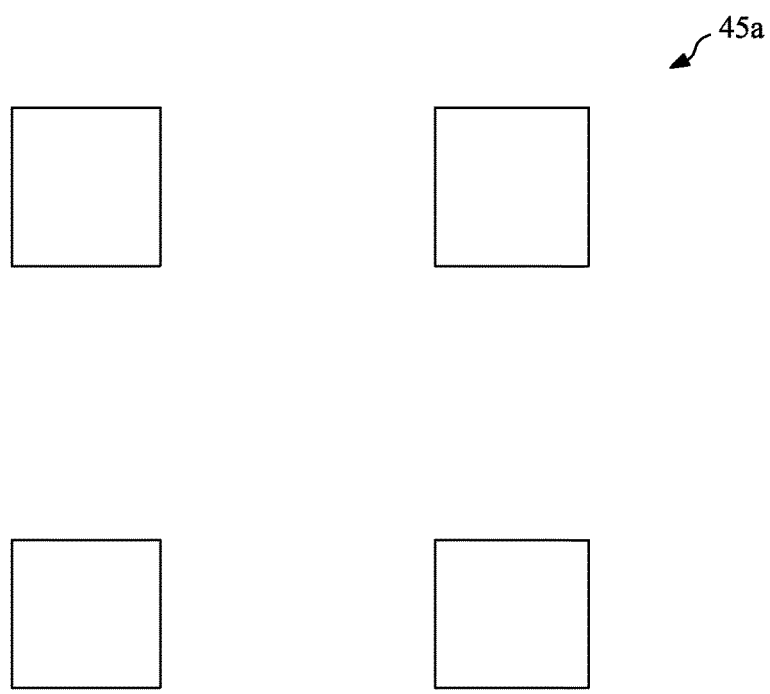
FIG. 2B illustrates a top view of an example of a fiducial mark of a lower conductive structure according to some embodiments of the present disclosure.

FIG. 2B illustrates a top view of an example of a fiducial mark 45a of the lower conductive structure 3a according to some embodiments of the present disclosure. The fiducial mark 45a of the lower conductive structure 3a includes four square-shaped segments spaced apart at four corners.

Figure 2C:
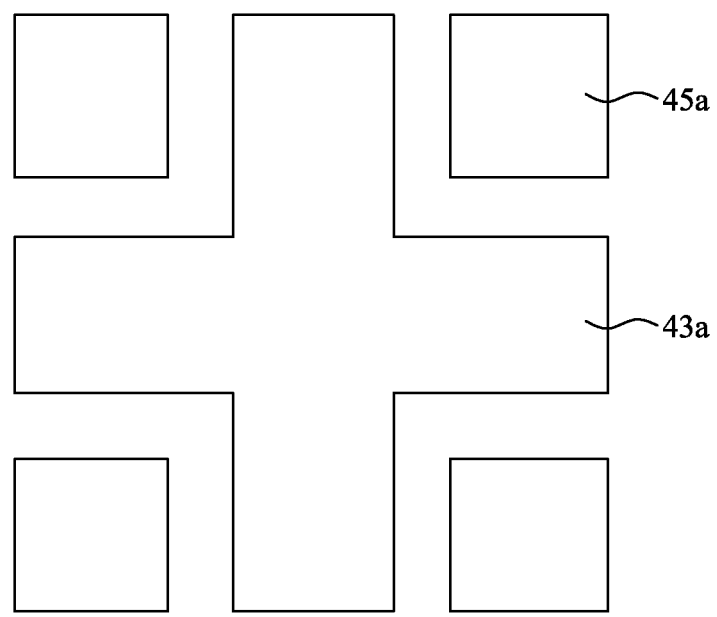
FIG. 2C illustrates a top view of a combination image of the fiducial mark of the upper conductive structure of FIG. 2A and the fiducial mark of the lower conductive structure of FIG. 2B.

FIG. 2C illustrates a top view of a combination image of the fiducial mark 43a of the upper conductive structure 2a of FIG. 2A and the fiducial mark 45a of the lower conductive structure 3a of FIG. 2B. When the upper conductive structure 2a is aligned with the lower conductive structure 3a precisely, the combination image shows the complete fiducial mark 43a and the complete fiducial mark 45a, as shown in FIG. 2C. That is, the fiducial mark 43a does not cover or overlap the fiducial mark 45a from the top view.

Figure 2D:
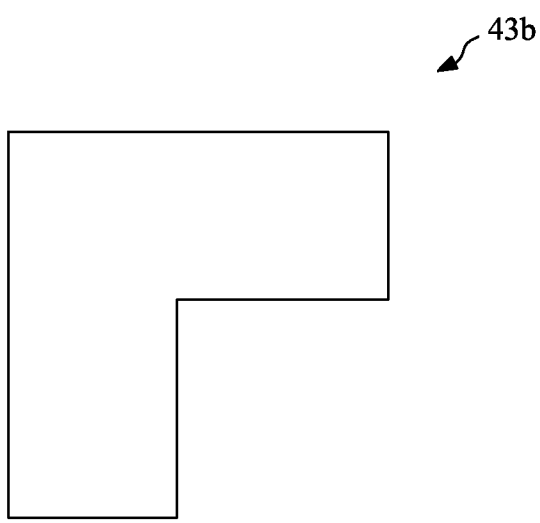
FIG. 2D illustrates a top view of an example of a fiducial mark of an upper conductive structure according to some embodiments of the present disclosure.

FIG. 2D illustrates a top view of an example of a fiducial mark 43b of the upper conductive structure 2a according to some embodiments of the present disclosure. The fiducial mark 43b of the upper conductive structure 2a has a continuous reversed "L" shape.

Figure 2E:
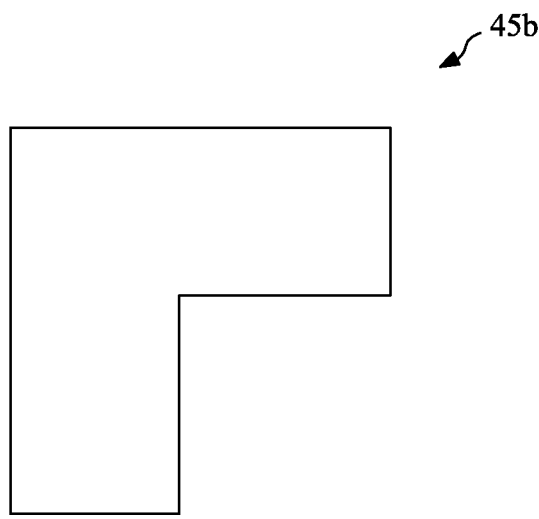
FIG. 2E illustrates a top view of an example of a fiducial mark of a lower conductive structure according to some embodiments of the present disclosure.

FIG. 2E illustrates a top view of an example of a fiducial mark 45b of the lower conductive structure 3a according to some embodiments of the present disclosure. The fiducial mark 45b of the lower conductive structure 3a has a continuous reversed "L" shape which is substantially the same as the fiducial mark 43b of the upper conductive structure 2a.

Figure 2F:
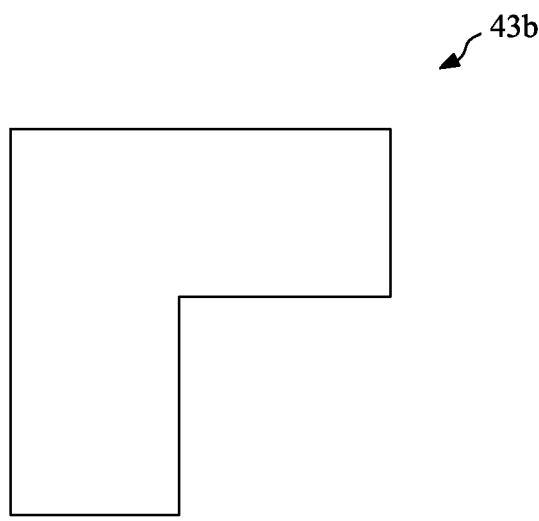
FIG. 2F illustrates a top view of a combination image of the fiducial mark of the upper conductive structure of FIG. 2D and the fiducial mark of the lower conductive structure of FIG. 2E.

FIG. 2F illustrates a top view of a combination image of the fiducial mark 43b of the upper conductive structure 2a of FIG. 2D and the fiducial mark 45b of the lower conductive structure 3a of FIG. 2E. When the upper conductive structure 2a is aligned with the lower conductive structure 3a precisely, the combination image shows solely the fiducial mark 43b of the upper conductive structure 2a, as shown in FIG. 2F. That is, the fiducial mark 43b completely covers or overlaps the fiducial mark 45b from the top view.

Figure 2G:
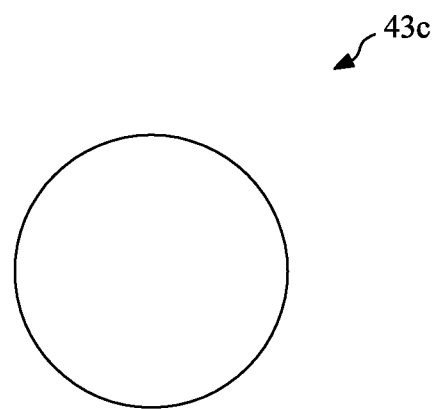
FIG. 2G illustrates a top view of an example of a fiducial mark of an upper conductive structure according to some embodiments of the present disclosure.

FIG. 2G illustrates a top view of an example of a fiducial mark 43c of the upper conductive structure 2a according to some embodiments of the present disclosure. The fiducial mark 43c of the upper conductive structure 2a has a continuous circular shape.

Figure 2H:
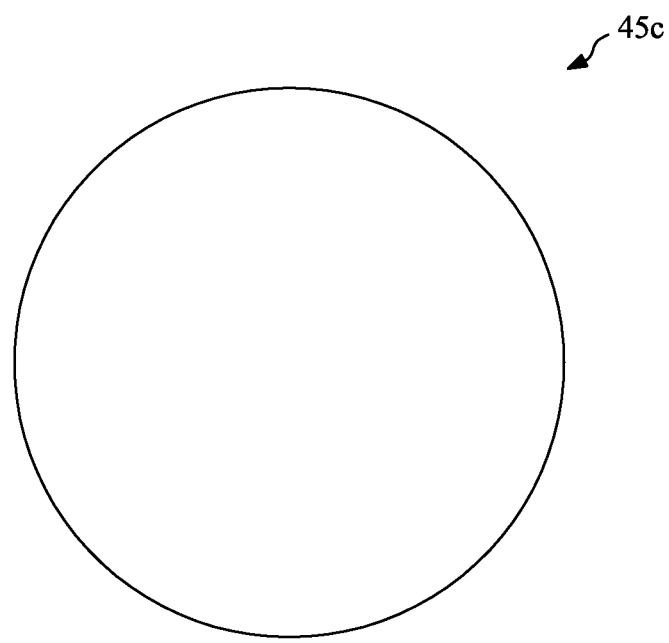
FIG. 2H illustrates a top view of an example of a fiducial mark of a lower conductive structure according to some embodiments of the present disclosure.

FIG. 2H illustrates a top view of an example of a fiducial mark 45c of the lower conductive structure 3a according to some embodiments of the present disclosure. The fiducial mark 45c of the lower conductive structure 3a has a continuous circular shape which is larger than the fiducial mark 43c of the upper conductive structure 2a.

Figure 2I:
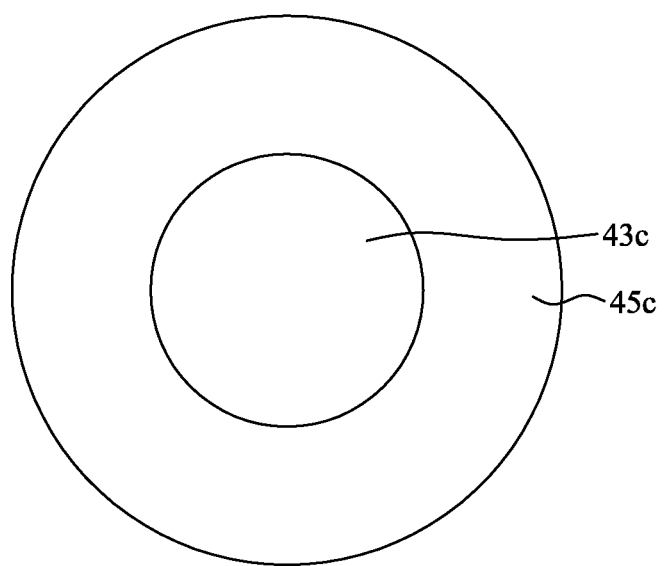
FIG. 2I illustrates a top view of a combination image of the fiducial mark of the upper conductive structure of FIG. 2G and the fiducial mark of the lower conductive structure of FIG. 2H.

FIG. 2I illustrates a top view of a combination image of the fiducial mark 43c of the upper conductive structure 2a of FIG. 2G and the fiducial mark 45c of the lower conductive structure 3a of FIG. 2H. When the upper conductive structure 2a is aligned with the lower conductive structure 3a precisely, the combination image shows two concentric circles, as shown in FIG. 2I. That is, the fiducial mark 43c is disposed at the center of the fiducial mark 45b.

Figure 3:
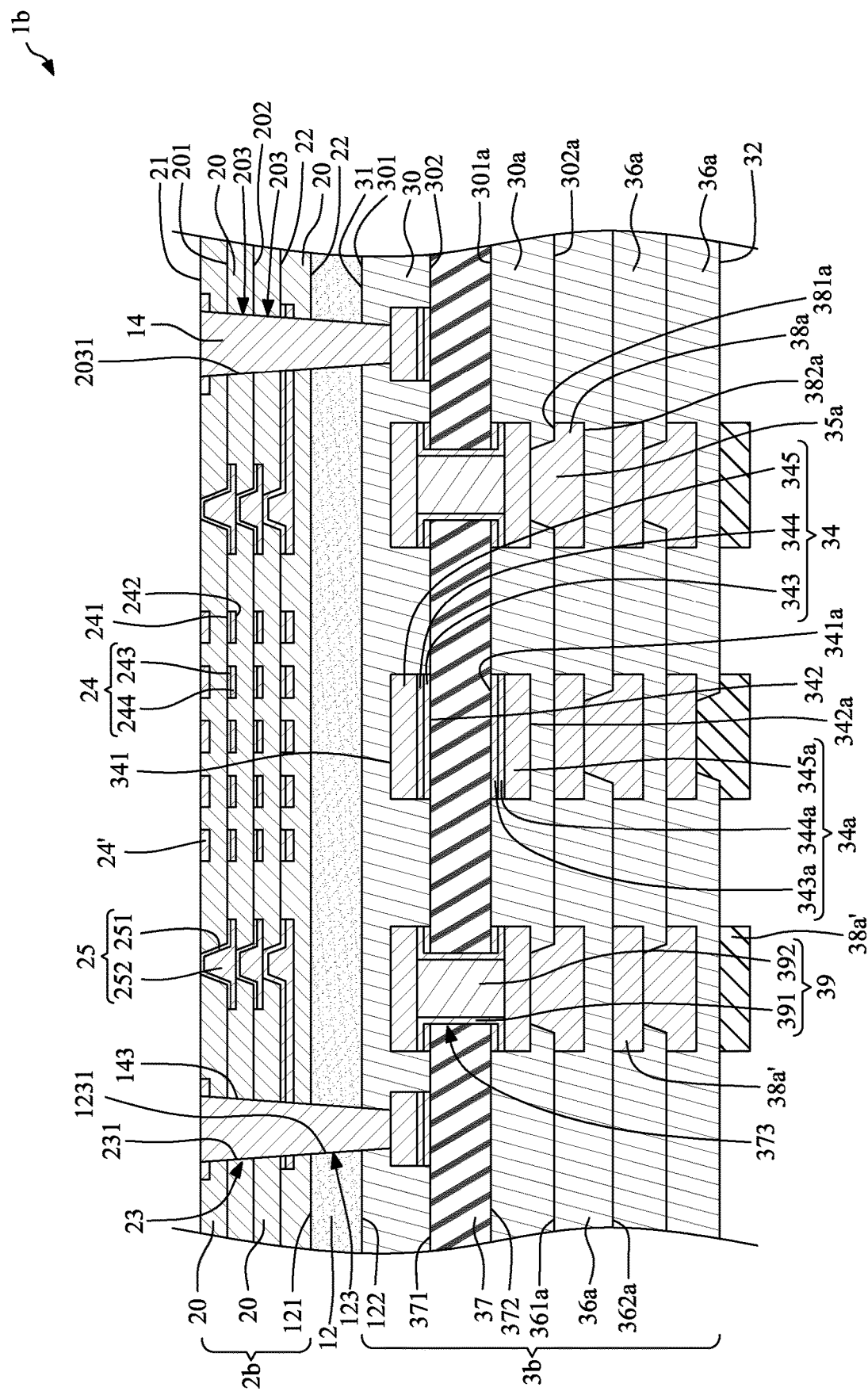
FIG. 3 illustrates a cross-sectional view of a wiring structure according to some embodiments of the present disclosure.

FIG. 3 illustrates a cross-sectional view of a wiring structure 1b according to some embodiments of the present disclosure. The wiring structure 1b is similar to the wiring structure 1 shown in FIG. 1, except for structures of an upper conductive structure 2b and a lower conductive structure 3b. In the upper conductive structure 2b, the second dielectric layer 26 is replaced by a topmost first dielectric layer 20. In addition, the upper conductive structure 2b may further include a topmost circuit layer 24'. The topmost circuit layer 24' may omit a seed layer, and may be electrically connected to the below circuit layer 24 through the inner vias 25. A top surface of the topmost circuit layer 24' may be substantially coplanar with the top surface 21 of the upper conductive structure 2b (e.g., the top surface 201 of the topmost first dielectric layer 20). Thus, the top surface of the topmost circuit layer 24' may be exposed from the top surface 21 of the upper conductive structure 2b (e.g., the top surface 201 of the topmost first dielectric layer 20). Further, the bottommost first dielectric layer 20 may cover the bottommost circuit layer 24. Thus, the entire bottom surface 22 of the upper conductive structure 2b (e.g., the bottom surface 202 of the bottommost first dielectric layer 20) is substantially flat.

In the lower conductive structure 3b, the second upper dielectric layer 36 and the second upper circuit layers 38, 38' are omitted. Thus, the top surface 31 of the lower conductive structure 3b is the top surface 301 of the first upper dielectric layer 30, which is substantially flat. Further, two additional second lower dielectric layers 36a and two additional second lower circuit layers 38a' are further included.

The intermediate layer 12 adheres to the bottom surface 22 of the upper conductive structure 2b and the top surface 31 of the lower conductive structure 3b. Thus, the entire top surface 121 and the entire bottom surface 122 of the intermediate layer 12 are both substantially flat. The intermediate layer 12 does not include or contact a horizontally extending or connecting circuit layer. That is, there is no horizontally extending or connecting circuit layer disposed or embedded in the intermediate layer 12. The upper through via 14 extends through the upper conductive structure 2b and the intermediate layer 12, and further extends into a portion (e.g., the first upper dielectric layer 30) of the lower conductive structure 3b to contact the first upper circuit layer 34.

Figure 4:
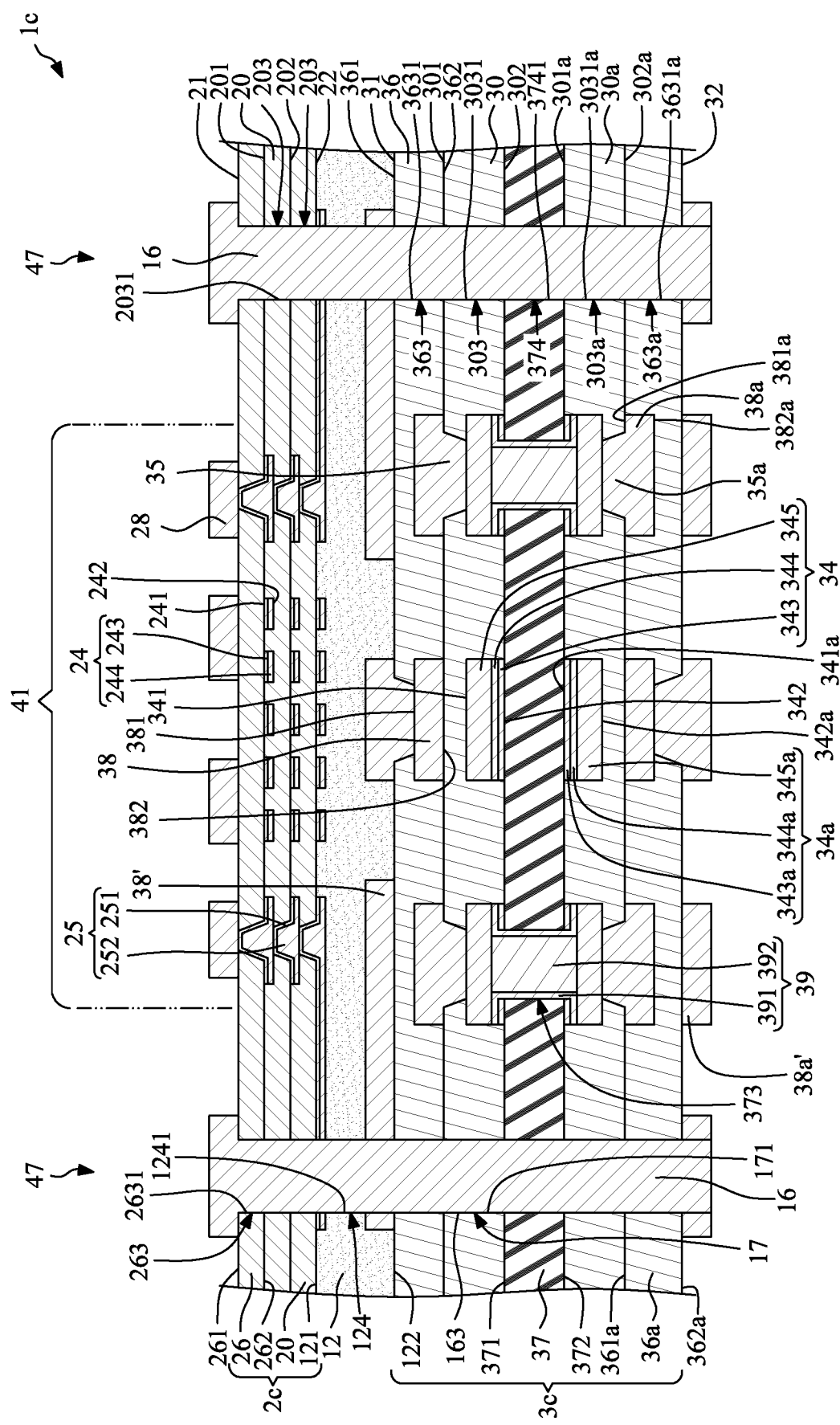
FIG. 4 illustrates a cross-sectional view of a wiring structure according to some embodiments of the present disclosure.

FIG. 4 illustrates a cross-sectional view of a wiring structure 1c according to some embodiments of the present disclosure. The wiring structure 1c is similar to the wiring structure 1 shown in FIG. 1, except for structures of an upper conductive structure 2c, a lower conductive structure 3c and at least one through via 16. Each of the first dielectric layers 20 defines a through hole 203 having an inner surface 2031. The intermediate layer 12 defines at least one through hole 124 having an inner surface 1241. The second upper dielectric layer 36 defines a through hole 363 having an inner surface 3631. The first upper dielectric layer 30 defines a through hole 303 having an inner surface 3031. The core portion 37 defines a through hole 374 having an inner surface 3741. The first lower dielectric layer 30a defines a through hole 303a having an inner surface 3031a. The second lower dielectric layer 36a defines a through hole 363a having an inner surface 3631a.

As shown in FIG. 4, the through hole 263 of the second dielectric layer 26, the through holes 203 of the first dielectric layers 20, the through hole 124 of the intermediate layer 12, the through hole 363 of the second upper dielectric layer 36, the through hole 303 of the first upper dielectric layer 30, the through hole 374 of the core portion 37, the through hole 303a of the first lower dielectric layer 30a and the through hole 363a of the second lower dielectric layer 36a are aligned with each other and are in communication with each other. Thus, the inner surface 2631 of the through hole 263, the inner surfaces 2031 of the through holes 203, the inner surface 1241 of the through hole 124, the inner surface 3631 of the through hole 363, the inner surface 3031 of the through hole 303, the inner surface 3741 of the through hole 374, the inner surface 3031a of the through hole 303a and the inner surface 3631a of the through hole 363 are coplanar with each other or aligned with each other. In some embodiments, the inner surface 2631 of the through hole 263 of the second dielectric layer 26, the inner surfaces 2031 of the through holes 203 of the first dielectric layers 20, the inner surface 1241 of the through hole 124 of the intermediate layer 12, the inner surface 3631 of the through hole 363, the inner surface 3031 of the through hole 303, the inner surface 3741 of the second through hole 374, the inner surface 3031a of the through hole 303a and the inner surface 3631a of the through hole 363 may be curved or straight surfaces, and are portions of an inner surface 171 of a single, continuous through hole 17 for accommodating the through via 16. The through hole 263 of the second dielectric layer 26, the through holes 203 of the first dielectric layers 20, the through hole 124 of the intermediate layer 12, the through hole 363 of the second upper dielectric layer 36, the through hole 303 of the first upper dielectric layer 30, the second through hole 374 of the core portion 37, the through hole 303a of the first lower dielectric layer 30a and the through hole 363a of the second lower dielectric layer 36a are collectively configured to form or define the single through hole 17.

As shown in FIG. 1, cross-sectional views of one side of the inner surface 2631 of the through hole 263, the inner surfaces 2031 of the through holes 203, the inner surface 1241 of the through hole 124 of the intermediate layer 12, the inner surface 3631 of the through hole 363, the inner surface 3031 of the through hole 303, the inner surface 3741 of the second through hole 374, the inner surface 3031a of the through hole 303a and the inner surface 3631a of the through hole 363a are segments of a substantially straight line. The single through hole 17 extends through the upper conductive structure 2, the intermediate layer 12 and the lower conductive structure 3 (including the second lower circuit layer 38a'); that is, the single through hole 17 extends from the top surface 21 of the upper conductive structure 2 to the bottom surface 32 of the lower conductive structure 3. A maximum width of the single through hole 17 may be about 100 µm to about 1000 µm. In some embodiments, the single through hole 17 may be formed by mechanical drilling. Thus, the through hole 17 may not taper, and the inner surface 171 of the through hole 17 may be substantially perpendicular to the top surface 21 of the upper conductive structure 2 and/or the bottom surface 32 of the lower conductive structure 3. That is, a size of the through hole 263 of the second dielectric layer 26, sizes of the through holes 203 of the first dielectric layers 20, a size of the through hole 124 of the intermediate layer 12, a size of the through hole 363 of the second upper dielectric layer 36, a size of the through hole 303 of the first upper dielectric layer 30, a size of the second through hole 374 of the core portion 37, a size of the through hole 303a of the first lower dielectric layer 30a and a size of the through hole 363a of the second lower dielectric layer 36a are substantially equal to one another.

Each through via 16 is formed or disposed in the corresponding through hole 17, and is formed of a metal, a metal alloy, or other conductive material. Thus, the through via 16 extends through the upper conductive structure 2, the intermediate layer 12 and the lower conductive structure 3. As shown in FIG. 4, the lower through via 16 extends through and contacts the bottommost circuit layer 24 of the upper conductive structure 2, the topmost circuit layer (e.g., the second upper circuit layer 38') of the lower conductive structure 3, and the bottommost circuit layer (e.g., the second lower circuit layer 38a') of the lower conductive structure 3. In some embodiments, a low-density circuit layer (e.g., the second upper circuit layer 38') of the low-density conductive structure (e.g., the lower conductive structure 3) is electrically connected to a high-density circuit layer (e.g., the first circuit layer 24) of the high-density conductive structure (e.g., the upper conductive structure 2) solely by the through via 16. A length (along a longitudinal axis) of the through via 16 is greater than a thickness of the low-density conductive structure (e.g., the lower conductive structure 3) or a thickness of the high-density conductive structure (e.g., the upper conductive structure 2). In some embodiments, the through via 16 is a monolithic structure or one-piece structure having a homogeneous material composition, and a peripheral surface 163 of the through via 16 is a substantially continuous surface without boundaries. The through via 16 and the outer circuit layer 28 may be formed integrally.

Figure 5:
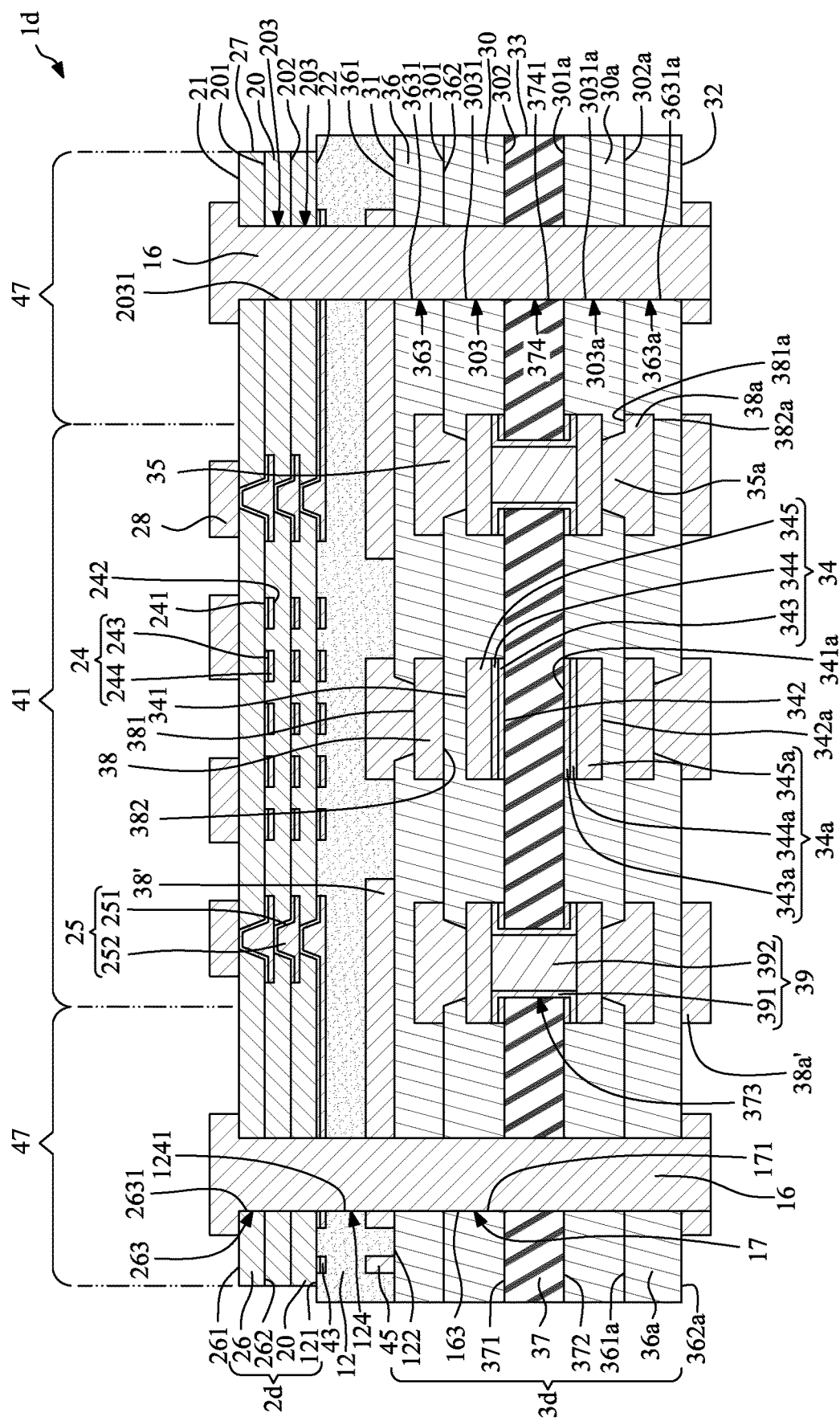
FIG. 5 illustrates a cross-sectional view of a wiring structure according to some embodiments of the present disclosure.

FIG. 5 illustrates a cross-sectional view of a wiring structure 1d according to some embodiments of the present disclosure. The wiring structure 1d is similar to the wiring structure 1c shown in FIG. 4, except for structures of an upper conductive structure 2d and a lower conductive structure 3d. As shown in FIG. 5, the upper conductive structure 2d and the lower conductive structure 3d are both strip structures. Thus, the wiring structure 1d is a strip structure. In some embodiments, the lower conductive structure 3d may be a panel structure that carries a plurality of strip upper conductive structures 2d. Thus, the wiring structure 1d is a panel structure. A length (e.g., about 240 mm) of the upper conductive structure 2d is greater than a width (e.g., about 95 mm) of the upper conductive structure 2d from a top view. Further, a length of the lower conductive structure 3d is greater than a width of the lower conductive structure 3d from a top view. In addition, a lateral peripheral surface 27 of the upper conductive structure 2d is not coplanar with (e.g., is inwardly recessed from or otherwise displaced from) a lateral peripheral surface 33 of the lower conductive structure 3d. In some embodiments, during a manufacturing process, the lower conductive structure 3d and the upper conductive structure 2d may be both known good strip structures. Alternatively, the upper conductive structure 2d may be a known good strip structure, and the lower conductive structure 3d may be a known good panel structure. As a result, the yield of the wiring structure 1d may be further improved.

As shown in FIG. 5, the upper conductive structure 2d includes at least one fiducial mark 43 at a corner thereof, and the lower conductive structure 3d includes at least one fiducial mark 45 at a corner thereof. The fiducial mark 43 of the upper conductive structure 2d is aligned with the fiducial mark 45 of the lower conductive structure 3d during a manufacturing process, so that the relative position of the upper conductive structure 2d and the lower conductive structure 3d is secured. In some embodiments, the fiducial mark 43 of the upper conductive structure 2d is disposed on and protrudes from the bottom surface 22 of the upper conductive structure 2d (e.g., the bottom surface 202 of the bottommost first dielectric layer 20). The fiducial mark 43 and the bottommost circuit layer 24 may be at, or part of, the same layer, and may be formed concurrently. Further, the fiducial mark 45 of the lower conductive structure 3d is disposed on and protrudes from the top surface 31 of the lower conductive structure 3d (e.g., the top surface 361 of the second upper dielectric layer 36). The fiducial mark 45 and the second upper circuit layer 38' may be at, or part of, the same layer, and may be formed concurrently.

Figure 6:
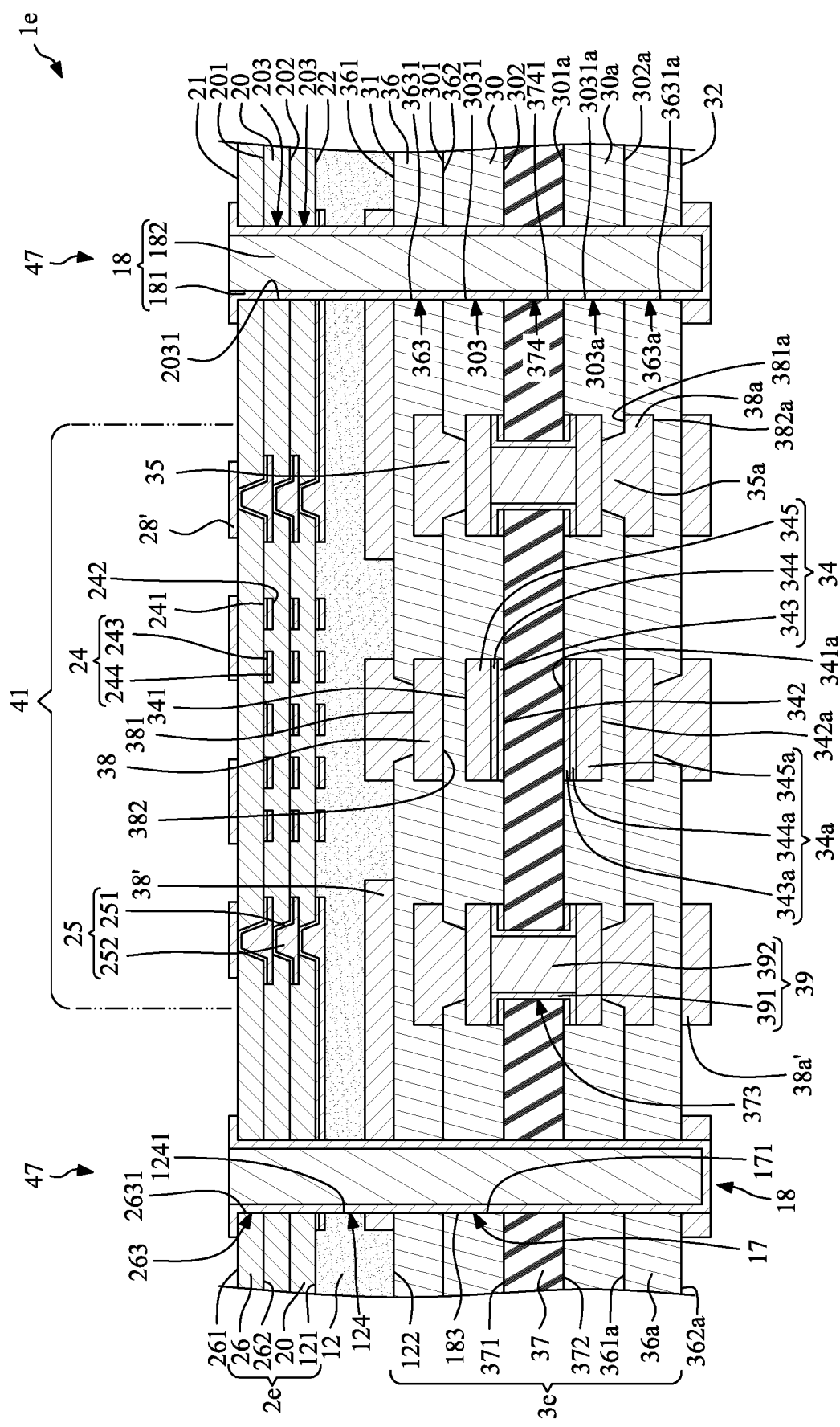
FIG. 6 illustrates a cross-sectional view of a wiring structure according to some embodiments of the present disclosure.

FIG. 6 illustrates a cross-sectional view of a wiring structure 1e according to some embodiments of the present disclosure. The wiring structure 1e is similar to the wiring structure 1c shown in FIG. 4, except for structures of a through via 18 and an outer circuit layer 28'. As shown in FIG. 6, the through via 16 of FIG. 4 is replaced by the through via 18, and the outer circuit layer 28 of FIG. 4 is replaced by the outer circuit layer 28'. In some embodiments, the through via 18 includes a conductive layer 181 (e.g., a metallic layer) and an insulation material 182. The conductive layer 181 is disposed or formed on the inner surface 171 of the through hole 17, and defines a central through hole. The insulation material 182 fills the central through hole defined by the conductive layer 181. The conductive layer 181 and the outer circuit layer 28' may be formed concurrently and integrally.

Figure 7:
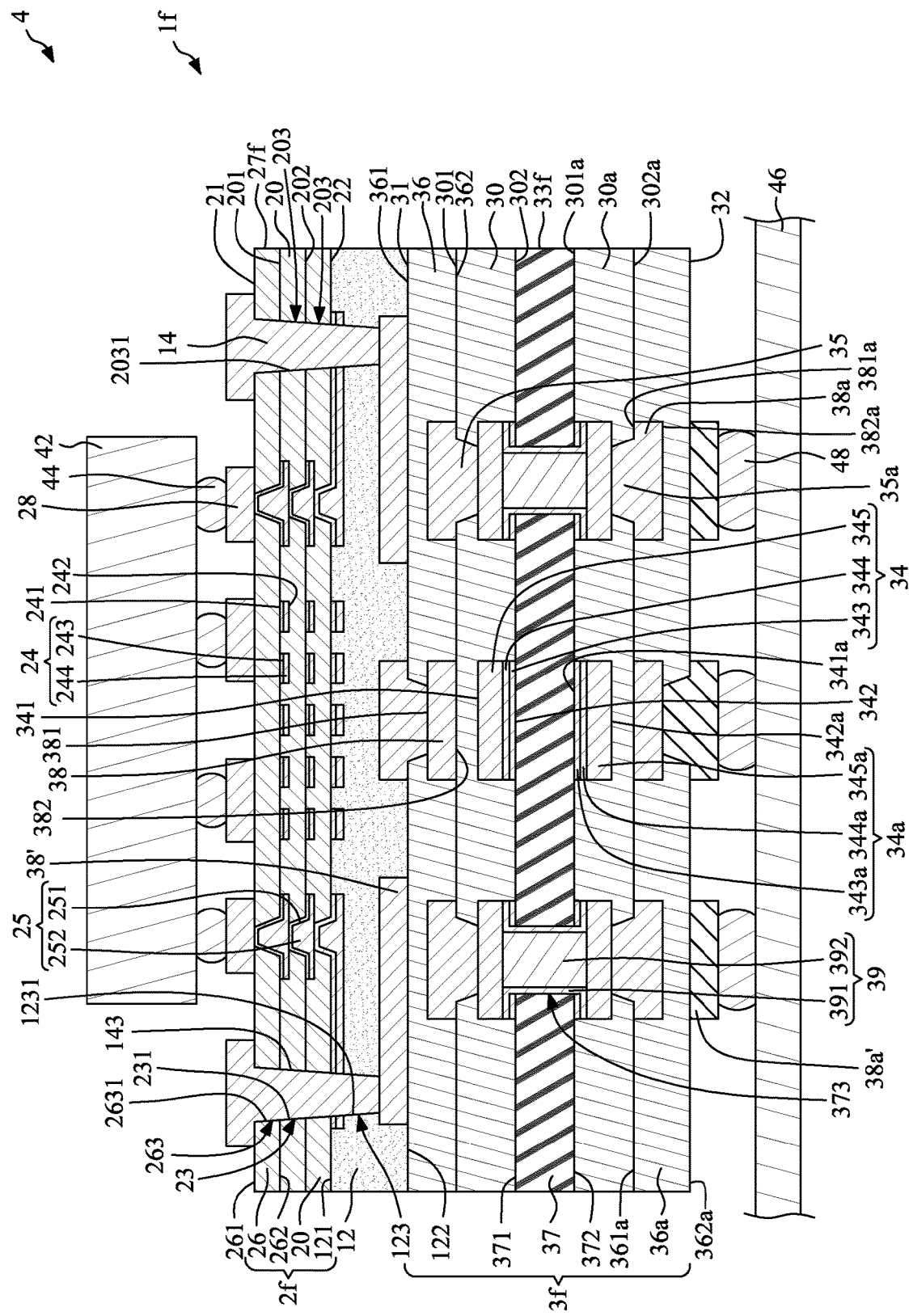
FIG. 7 illustrates a cross-sectional view of a bonding of a package structure and a substrate.

FIG. 7 illustrates a cross-sectional view of a bonding of a package structure 4 and a substrate 46 according to some embodiments. The package structure 4 includes a wiring structure 1f, a semiconductor chip 42, a plurality of first connecting elements 44 and a plurality of second connecting elements 48. The wiring structure 1f of FIG. 7 is similar to the wiring structure 1 shown in FIG. 1, except for structures of an upper conductive structure 2f and a lower conductive structure 3f. The upper conductive structure 2f and the lower conductive structure 3f are both dice and may be singulated concurrently. Thus, the wiring structure 1f is a unit structure. That is, a lateral peripheral surface 27f of the upper conductive structure 2f, a lateral peripheral surface 33f of the lower conductive structure 3f and a lateral peripheral surface of the intermediate layer 12 are substantially coplanar with each other. The semiconductor chip 42 is electrically connected and bonded to the second circuit layer 28 of the upper conductive structure 2b through the first connecting elements 44 (e.g., solder bumps or other conductive bumps). The second lower circuit layer 38a' of the lower conductive structure 3f is electrically connected and bonded to the substrate 46 (e.g., a mother board such as a printed circuit board (PCB)) through the second connecting elements 48 (e.g., solder bumps or other conductive bumps).

Figure 8:
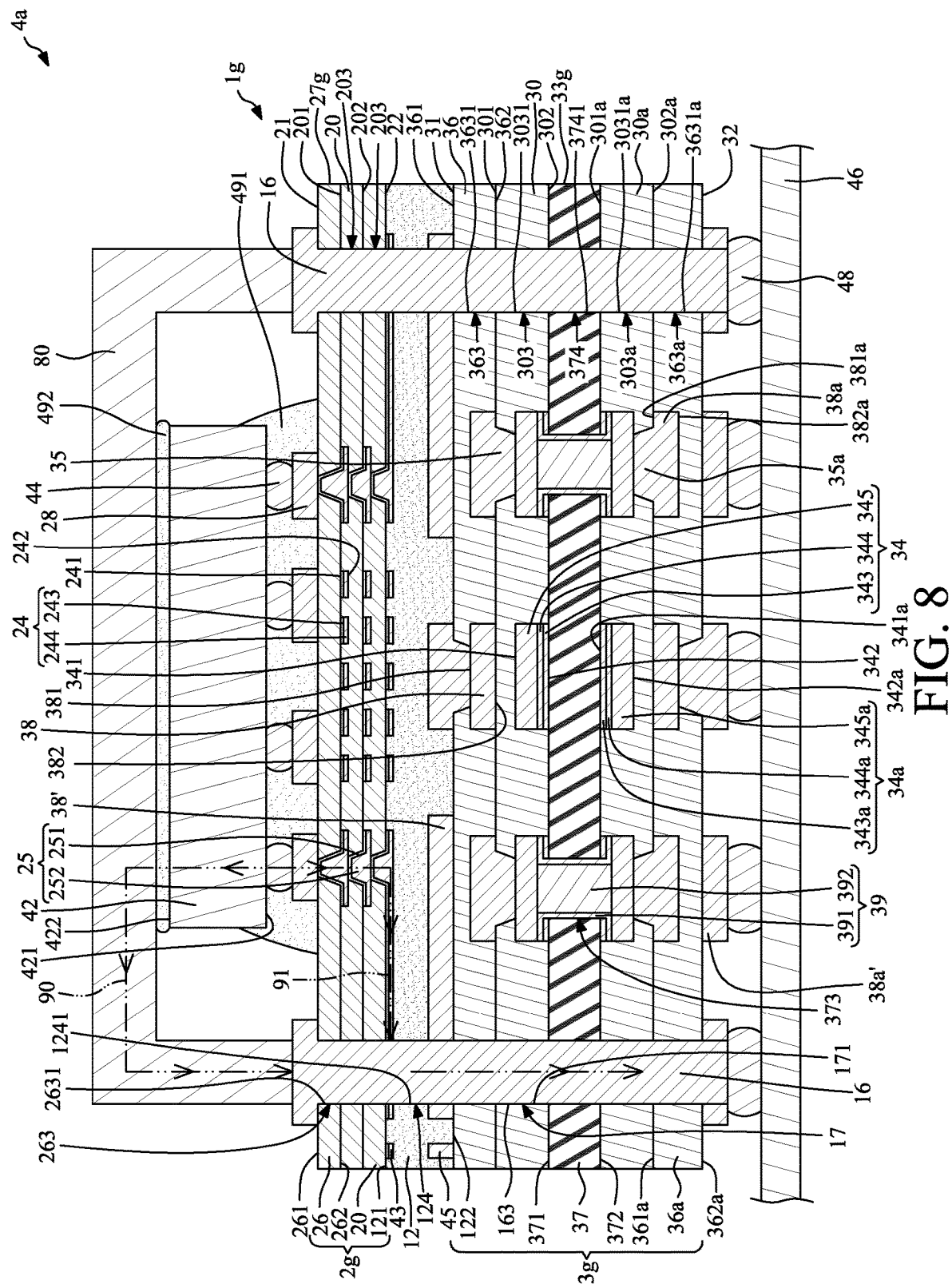
FIG. 8 illustrates a cross-sectional view of a bonding of a package structure and a substrate.

FIG. 8 illustrates a cross-sectional view of a bonding of a package structure 4a and a substrate 46 according to some embodiments. The package structure 4a includes a wiring structure 1g, a semiconductor chip 42, a plurality of first connecting elements 44, a plurality of second connecting elements 48, and a heat sink 80. The wiring structure 1g of FIG. 8 is similar to the wiring structure 1c shown in FIG. 4, except for structures of an upper conductive structure 2g and a lower conductive structure 3g. The upper conductive structure 2g and the lower conductive structure 3g are both dice and may be singulated concurrently. Thus, the wiring structure 1g is a unit structure. That is, a lateral peripheral surface 27g of the upper conductive structure 2g, a lateral peripheral surface 33g of the lower conductive structure 3g and a lateral peripheral surface of the intermediate layer 12 are substantially coplanar with each other. The semiconductor chip 42 has an active surface 421 and a backside surface 422 opposite to the active surface 421. The active surface 421 of the semiconductor chip 42 is electrically connected and bonded to the outer circuit layer 28 on the upper conductive structure 2g through the first connecting elements 44 (e.g., solder bumps or other conductive bumps). The second lower circuit layer 38a' of the lower conductive structure 3f is electrically connected and bonded to the substrate 46 (e.g., a mother board such as a PCB) through the second connecting elements 48 (e.g., solder bumps or other conductive bumps).

The heat sink 80 covers the semiconductor chip 42, and a portion of the heat sink 80 is thermally connected to the through via 16. As shown in FIG. 8, an underfill 491 is included to cover and protect the first connecting elements 44 and the outer circuit layer 28. An inner surface of the heat sink 80 is adhered to the backside surface 422 of the semiconductor chip 42 through an adhesion layer 492. A bottom portion of a sidewall of the heat sink 80 is attached to the through via 16 or a portion of the outer circuit layer 28 that is formed integrally with the through via 16. During operation of the semiconductor chip 42, there are two paths (including a first path 90 and a second path 91) to dissipate the heat generated by the semiconductor chip 42 (especially from the active surface 421 of the semiconductor chip 42) to the substrate 46. Taking the first path 90 for example, a portion of the heat generated by the semiconductor chip 42 (especially from the active surface 421 of the semiconductor chip 42) is transmitted upwardly through a main body of the semiconductor chip 42, the backside surface 422 of the semiconductor chip 42 and the adhesion layer 492 to the heat sink 80, then is transmitted horizontally and then is transmitted downwardly in the heat sink 80 to enter the through via 16. Taking the second path 91, for example, another portion of the heat generated by the semiconductor chip 42 (especially from the active surface 421 of the semiconductor chip 42) is transmitted downwardly through the first connecting elements 44, the outer circuit layer 28, the stacked inner vias 25, and then is transmitted horizontally in the bottommost circuit layer 24 of the upper conductive structure 2c to enter the through via 16. Finally, the heat in the through via 16 will be transmitted downwardly to the substrate 46. Since there are two paths (including the first path 90 and the second path 91) to dissipate the heat generated by the semiconductor chip 42 (especially from the active surface 421 of the semiconductor chip 42), the heat will be dissipated efficiently and quickly.

Figure 9:
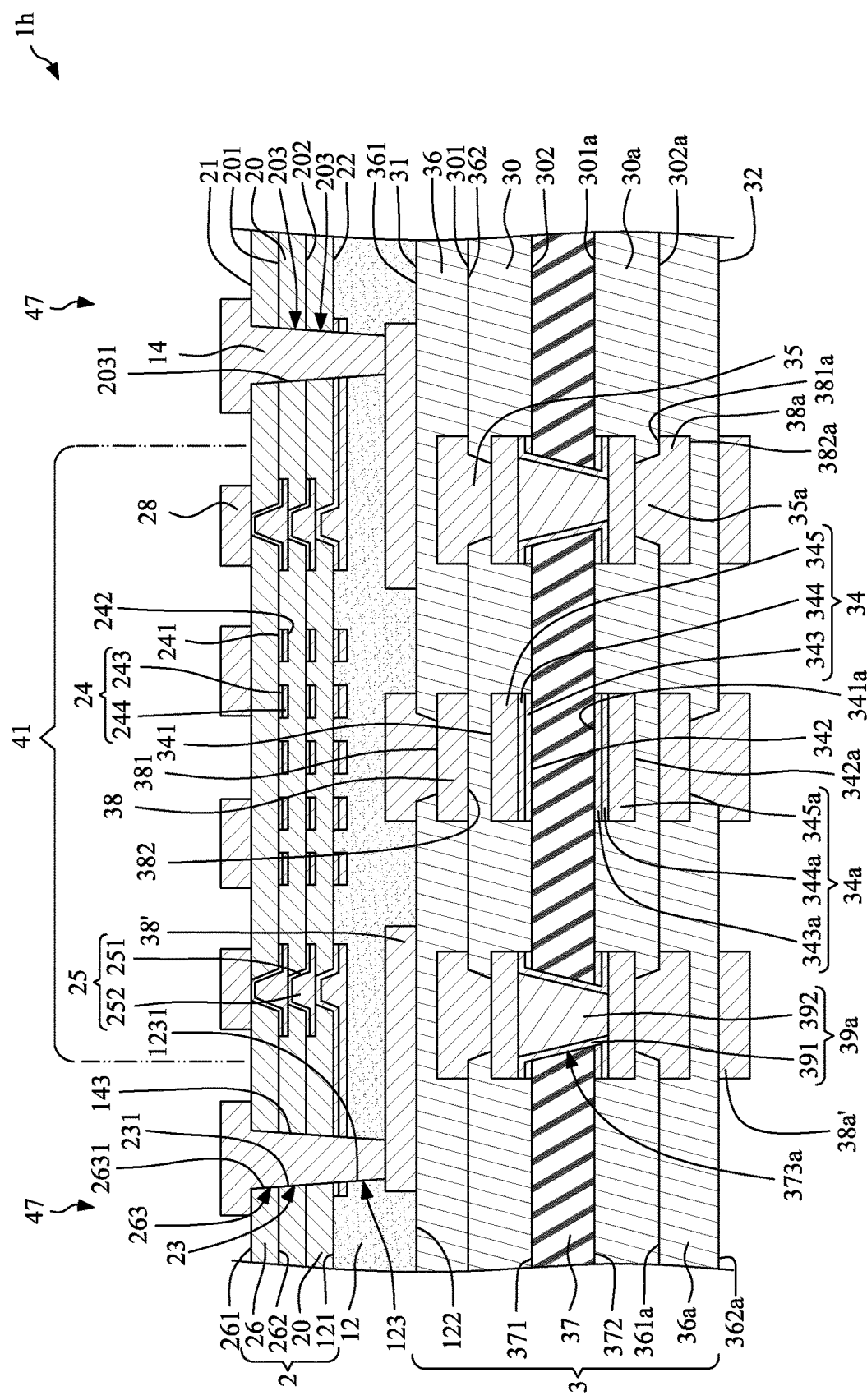
FIG. 9 illustrates a cross-sectional view of a wiring structure according to some embodiments of the present disclosure.

FIG. 9 illustrates a cross-sectional view of a wiring structure 1h according to some embodiments of the present disclosure. The wiring structure 1h is similar to the wiring structure 1 shown in FIG. 1, except for structures of the through holes 373a and the interconnection vias 39 of the lower conductive structure 3. As shown in FIG. 9, the through holes 373a may be formed by laser drilling and may taper downwardly. Thus, the interconnection vias 39 formed or disposed in the through holes 373a may taper downwardly.

FIG. 10 through FIG. 47 illustrate a method for manufacturing a wiring structure according to some embodiments of the present disclosure. In some embodiments, the method is for manufacturing the wiring structure 1 shown in FIG. 1 and/or the package structure 4 shown in FIG. 7.

Figure 10:
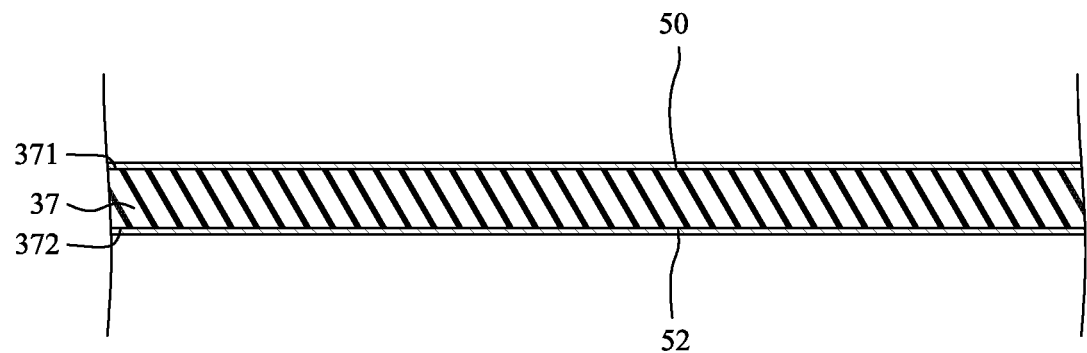
FIG. 10 illustrates one or more stages of an example of a method for manufacturing a wiring structure according to some embodiments of the present disclosure.

Referring to FIG. 10 through FIG. 29, a lower conductive structure 3 is provided. The lower conductive structure 3 is manufactured as follows. Referring to FIG. 10, a core portion 37 with a top copper foil 50 and a bottom copper foil 52 is provided. The core portion 37 may be in a wafer type, a panel type or a strip type. The core portion 37 has a top surface 371 and a bottom surface 372 opposite to the top surface 371. The top copper foil 50 is disposed on the top surface 371 of the core portion 37, and the bottom copper foil 52 is disposed on the bottom surface 372 of the core portion 37.

In some embodiments, the core portion 37 is substantially free of reinforcement material such as glass fiber. That is, the core portion 37 may be devoid of reinforcement material such as glass fiber, and may include a homogeneous material composition of a resin. Alternatively, the core portion 37 may include a small amount of reinforcement material such as glass fiber, for example, about 5% by weight or less, about 3% by weight or less, or about 2% by weight or less. In addition, a material of the core portion 37 may include an insulating film, such as ABF. Further, a Young's modulus of the core portion 37 may be greater than or equal to about 4.0 GPa at 23° C., such as about 4.0 GPa at 23° C. or greater, about 5.0 GPa at 23° C. or greater, or about 7.5 GPa at 23° C. or greater.

Figure 11:
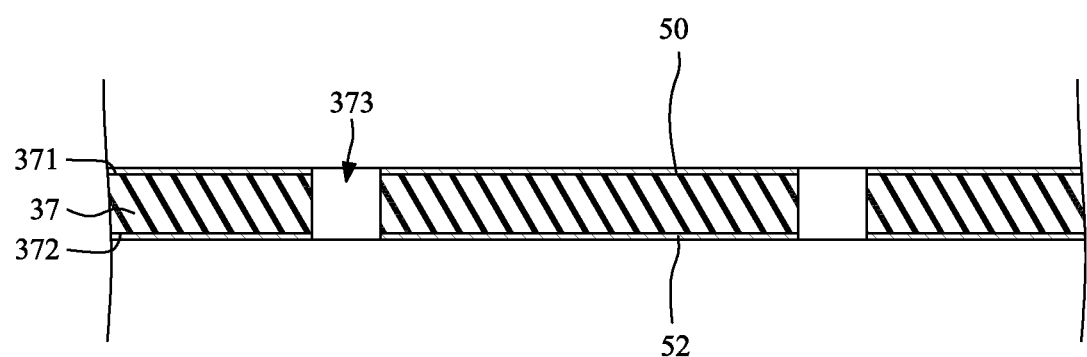
FIG. 11 illustrates one or more stages of an example of a method for manufacturing a wiring structure according to some embodiments of the present disclosure.

Referring to FIG. 11, a plurality of through holes 373 are formed to extend through the core portion 37, the top copper foil 50 and the bottom copper foil 52 by a drilling technique (such as laser drilling or mechanical drilling) or other suitable techniques.

Figure 12:
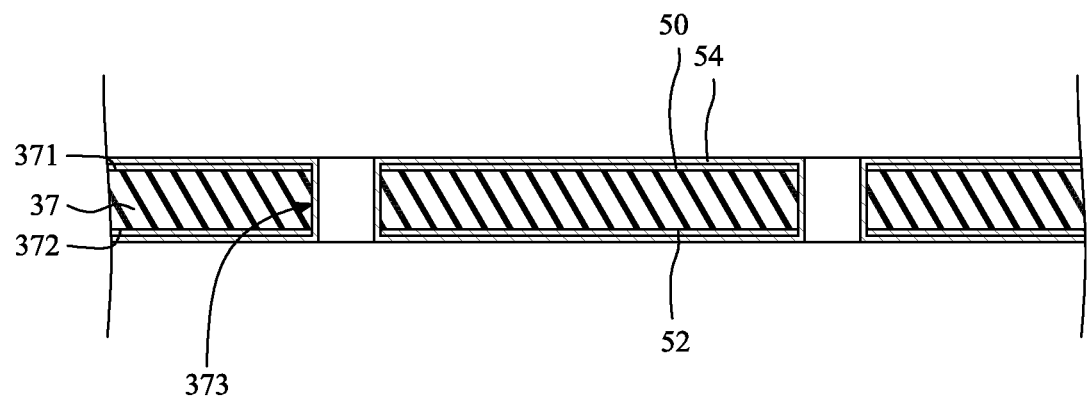
FIG. 12 illustrates one or more stages of an example of a method for manufacturing a wiring structure according to some embodiments of the present disclosure.

Referring to FIG. 12, a second metallic layer 54 is formed or disposed on the top copper foil 50, the bottom copper foil 52 and side walls of the first through holes 373 by a plating technique or other suitable techniques. A portion of the second metallic layer 54 on the side wall of each first through hole 373 defines a central through hole.

Figure 13:
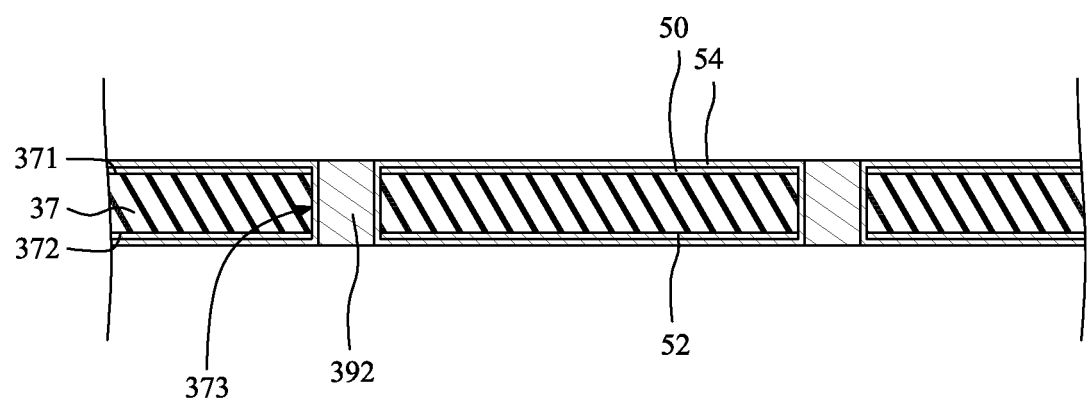
FIG. 13 illustrates one or more stages of an example of a method for manufacturing a wiring structure according to some embodiments of the present disclosure.

Referring to FIG. 13, an insulation material 392 is disposed to fill the central through hole defined by the second metallic layer 54.

Figure 14:
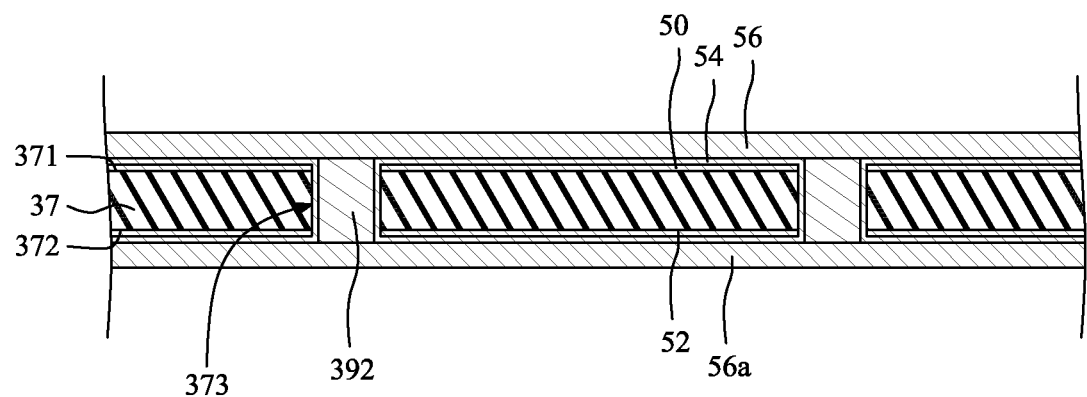
FIG. 14 illustrates one or more stages of an example of a method for manufacturing a wiring structure according to some embodiments of the present disclosure.

Referring to FIG. 14, a top third metallic layer 56 and a bottom third metallic layer 56a are formed or disposed on the second metallic layer 54 by a plating technique or other suitable techniques. The third metallic layers 56, 56a cover the insulation material 392.

Figure 15:
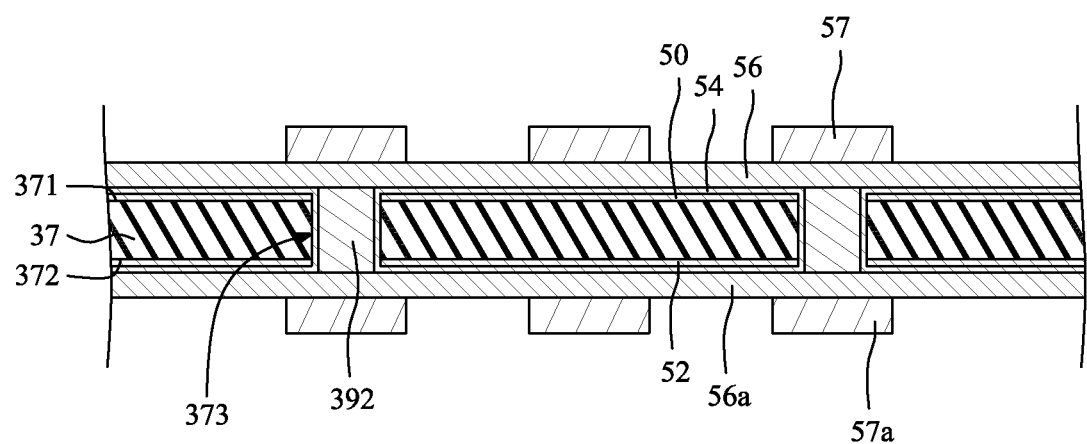
FIG. 15 illustrates one or more stages of an example of a method for manufacturing wiring structure according to some embodiments of the present disclosure.

Referring to FIG. 15, a top photoresist layer 57 is formed or disposed on the top third metallic layer 56, and a bottom photoresist layer 57a is formed or disposed on the bottom third metallic layer 56a. Then, the photoresist layers 57, 57a are patterned by exposure and development.

Figure 16:
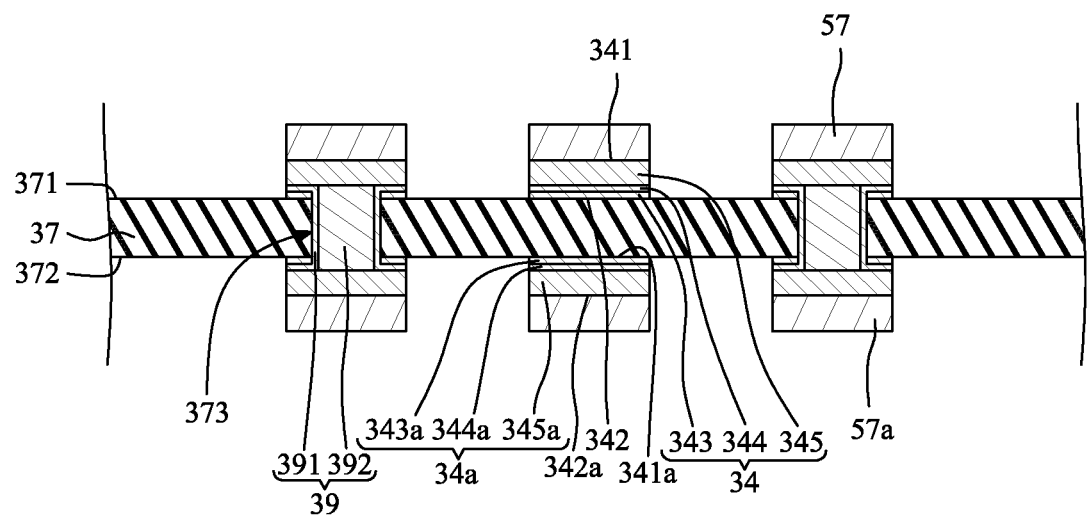
FIG. 16 illustrates one or more stages of an example of a method for manufacturing a wiring structure according to some embodiments of the present disclosure.

Referring to FIG. 16, portions of the top copper foil 50, the second metallic layer 54 and the top third metallic layer 56 that are not covered by the top photoresist layer 57 are removed by an etching technique or other suitable techniques. Portions of the top copper foil 50, the second metallic layer 54 and the top third metallic layer 56 that are covered by the top photoresist layer 57 remain to form a first upper circuit layer 34. Meanwhile, portions of the bottom copper foil 52, the second metallic layer 54 and the bottom third metallic layer 56a that are not covered by the bottom photoresist layer 57a are removed by an etching technique or other suitable techniques. Portions of the bottom copper foil 52, the second metallic layer 54 and the bottom third metallic layer 56a that are covered by the bottom photoresist layer 57a remain to form a first lower circuit layer 34a. Meanwhile, portions of the second metallic layer 54 and the insulation material 392 that are disposed in the through hole 373 form an interconnection via 39. As shown in FIG. 16, the first upper circuit layer 34 has a top surface 341 and a bottom surface 342 opposite to the top surface 341. In some embodiments, the first upper circuit layer 34 is formed or disposed on the top surface 371 of the core portion 37. The bottom surface 342 of the first upper circuit layer 34 contacts the top surface 371 of the core portion 37. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a portion of the top copper foil 50. The second metallic layer 344 is disposed on the first metal layer 343, and may be a plated copper layer formed from the second metallic layer 54. The third metallic layer 345 is disposed on the second metallic layer 344, and may be another plated copper layer formed from the top third metallic layer 56.

The first lower circuit layer 34a has a top surface 341a and a bottom surface 342a opposite to the top surface 341a. In some embodiments, the first lower circuit layer 34a is formed or disposed on the bottom surface 372 of the core portion 37. The top surface 341a of the first lower circuit layer 34a contacts the bottom surface 372 of the core portion 37. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a portion of the bottom copper foil 52. The second metallic layer 344a is disposed on the first metallic layer 343a, and may be a plated copper layer formed from the second metallic layer 54. The third metallic layer 345a is disposed on the second metallic layer 344a, and may be another plated copper layer formed from the bottom third metallic layer 56a. The interconnection via 39 includes a base metallic layer 391 formed from the second metallic layer 54 and the insulation material 392. In some embodiments, the interconnection via 39 may include a bulk metallic material that fills the through hole 373. The interconnection via 39 electrically connects the first upper circuit layer 34 and the first lower circuit layer 34a.

Figure 17:
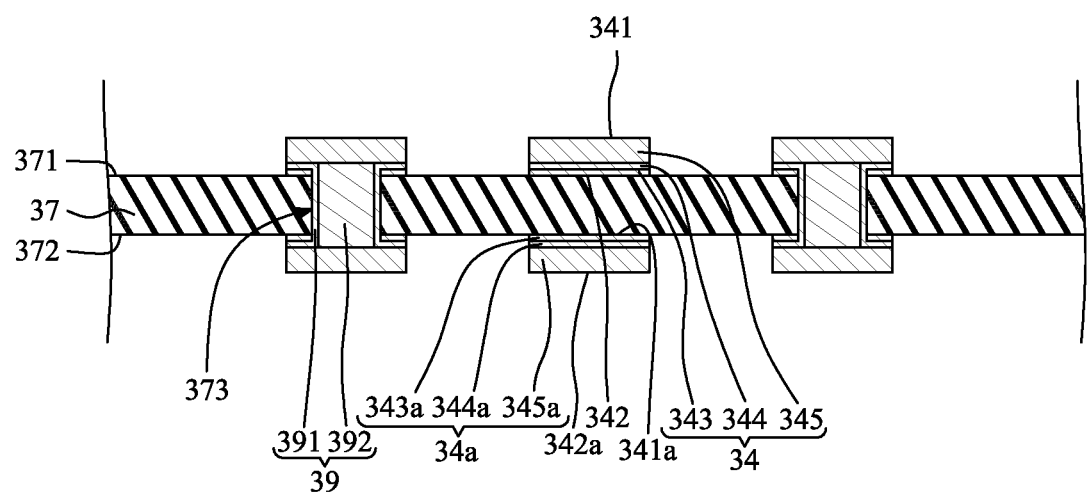
FIG. 17 illustrates one or more stages of an example of a method for manufacturing a wiring structure according to some embodiments of the present disclosure.

Referring to FIG. 17, the top photoresist layer 57 and the bottom photoresist layer 57a are removed by a stripping technique or other suitable techniques.

Figure 18:
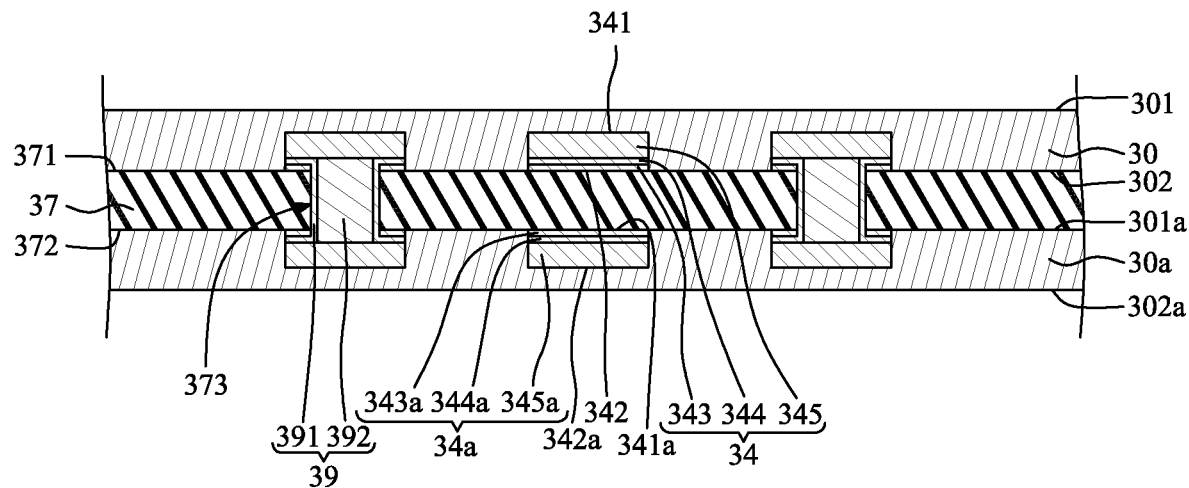
FIG. 18 illustrates one or more stages of an example of a method for manufacturing a wiring structure according to some embodiments of the present disclosure.

Referring to FIG. 18, a first upper dielectric layer 30 is formed or disposed on the top surface 371 of the core portion 37 to cover the top surface 371 of the core portion 37 and the first upper circuit layer 34 by a lamination technique or other suitable techniques. Meanwhile, a first lower dielectric layer 30a is formed or disposed on the bottom surface 372 of the core portion 37 to cover the bottom surface 372 of the core portion 37 and the first lower circuit layer 34a by a lamination technique or other suitable techniques.

In some embodiments, the first upper dielectric layer 30 and the first lower dielectric layer 30a may be substantially free of reinforcement material such as glass fiber. That is, the first upper dielectric layer 30 and the first lower dielectric layer 30a may be devoid of reinforcement material such as glass fiber, and may include a homogeneous material composition of a resin. Alternatively, the first upper dielectric layer 30 and the first lower dielectric layer 30a may include a small amount of reinforcement material such as glass fiber, for example, about 5% by weight or less, about 3% by weight or less, or about 2% by weight or less. In addition, a material of the first upper dielectric layer 30 and the first lower dielectric layer 30a may include an insulating film, such as ABF. Further, a Young's modulus of the first upper dielectric layer 30 and the first lower dielectric layer 30a may be greater than or equal to about 4.0 GPa at 23° C., such as about 4.0 GPa at 23° C. or greater, about 5.0 GPa at 23° C. or greater, or about 7.5 GPa at 23° C. or greater.

Figure 19:
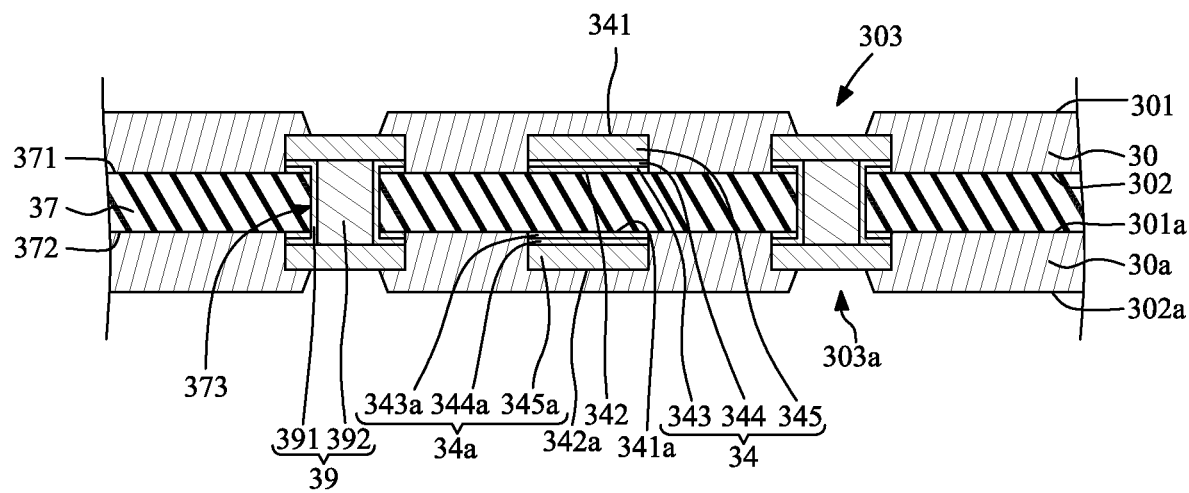
FIG. 19 illustrates one or more stages of an example of a method for manufacturing a wiring structure according to some embodiments of the present disclosure.

Referring to FIG. 19, at least one through hole 303 is formed to extend through the first upper dielectric layer 30 to expose a portion of the first upper circuit layer 34 by a drilling technique or other suitable techniques. Meanwhile, at least one through hole 303a is formed to extend through the first lower dielectric layer 30a to expose a portion of the first lower circuit layer 34a by a drilling technique or other suitable techniques.

Figure 20:
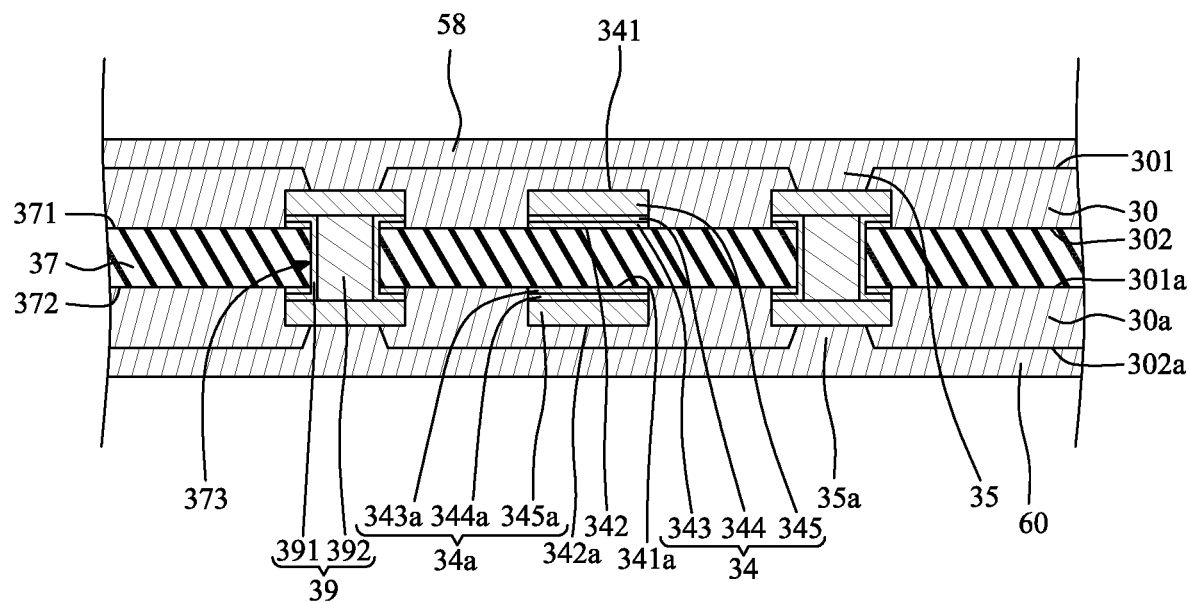
FIG. 20 illustrates one or more stages of an example of a method for manufacturing a wiring structure according to some embodiments of the present disclosure.
Figure 21:
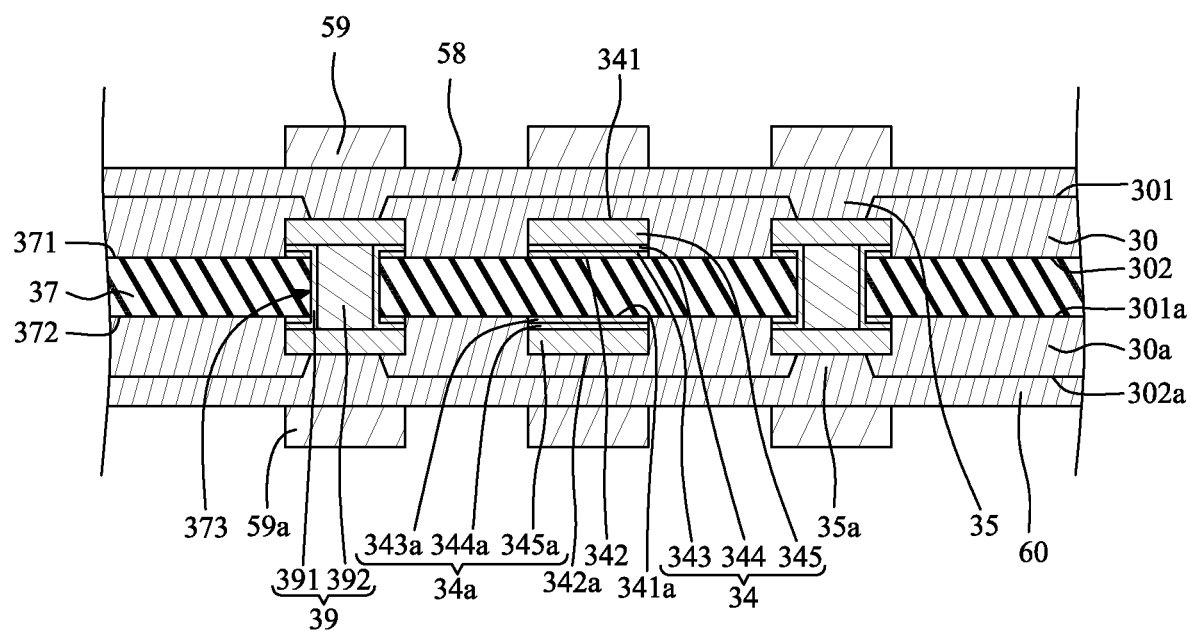
FIG. 21 illustrates one or more stages of an example of a method for manufacturing a wiring structure according to some embodiments of the present disclosure.

Referring to FIG. 20, a top metallic layer 58 is formed on the first upper dielectric layer 30 and in the through hole 303 to form an upper interconnection via 35 by a plating technique or other suitable techniques. Meanwhile, a bottom metallic layer 60 is formed on the first lower dielectric layer 30a and in the through hole 303a to form a lower interconnection via 35a by a plating technique or other suitable techniques. As shown in FIG. 20, the upper interconnection via 35 tapers downwardly, and the lower interconnection via 35a tapers upwardly.

Referring to FIG. 2I, a top photoresist layer 59 is formed or disposed on the top metallic layer 58, and a bottom photoresist layer 59a is formed or disposed on the bottom metallic layer 60. Then, the photoresist layers 59, 59a are patterned by exposure and development.

Figure 22:
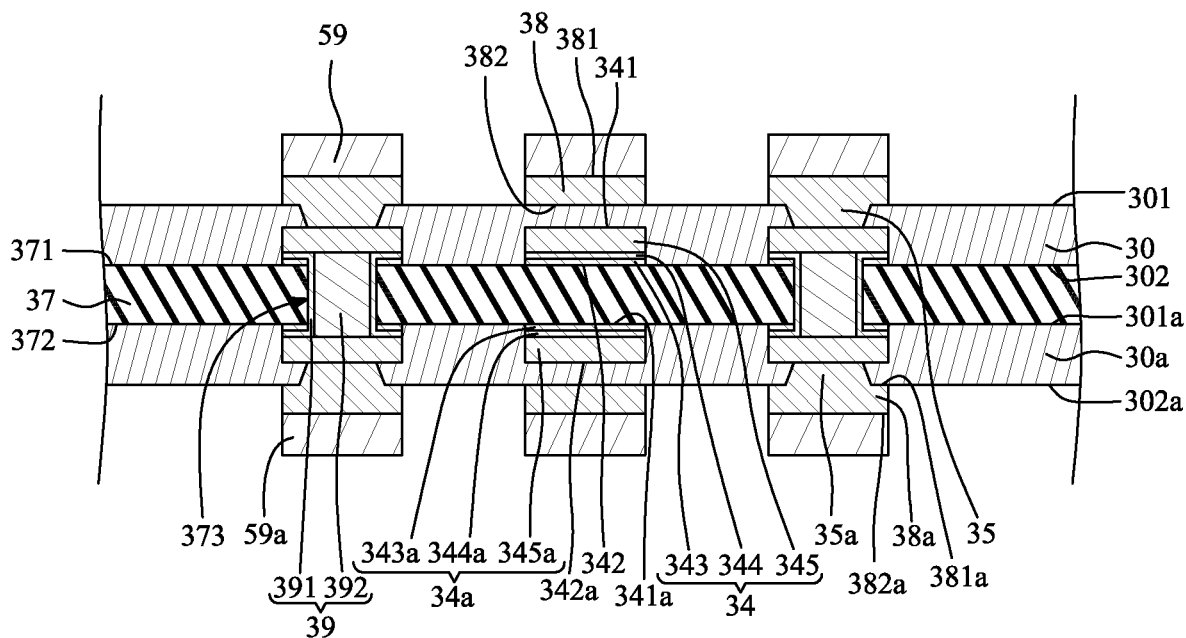
FIG. 22 illustrates one or more stages of an example of a method for manufacturing a wiring structure according to some embodiments of the present disclosure.

Referring to FIG. 22, portions of the top metallic layer 58 that are not covered by the top photoresist layer 59 are removed by an etching technique or other suitable techniques. Portions of the top metallic layer 58 that are covered by the top photoresist layer 59 remain to form a second upper circuit layer 38. Meanwhile, portions of the bottom metallic layer 60 that are not covered by the bottom photoresist layer 59a are removed by an etching technique or other suitable techniques. Portions of the bottom metallic layer 60 that are covered by the bottom photoresist layer 59a remain to form a second lower circuit layer 38a.

Figure 23:
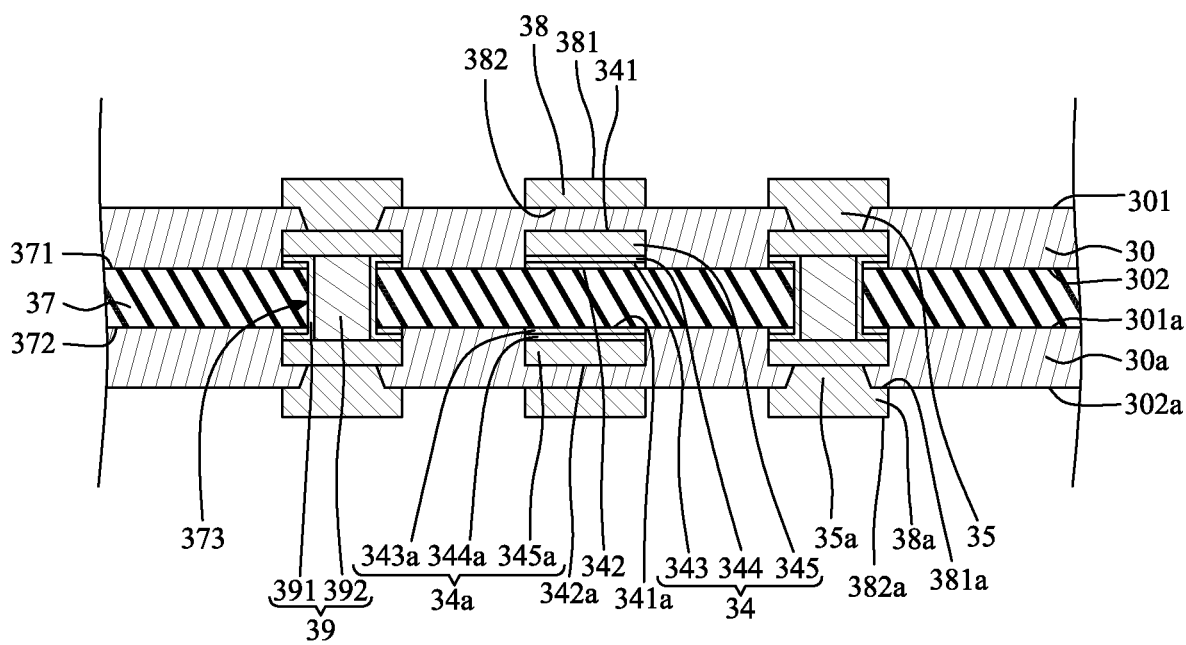
FIG. 23 illustrates one or more stages of an example of a method for manufacturing a wiring structure according to some embodiments of the present disclosure.

Referring to FIG. 23, the top photoresist layer 59 and the bottom photoresist layer 59a are removed by a stripping technique or other suitable techniques.

Figure 24:
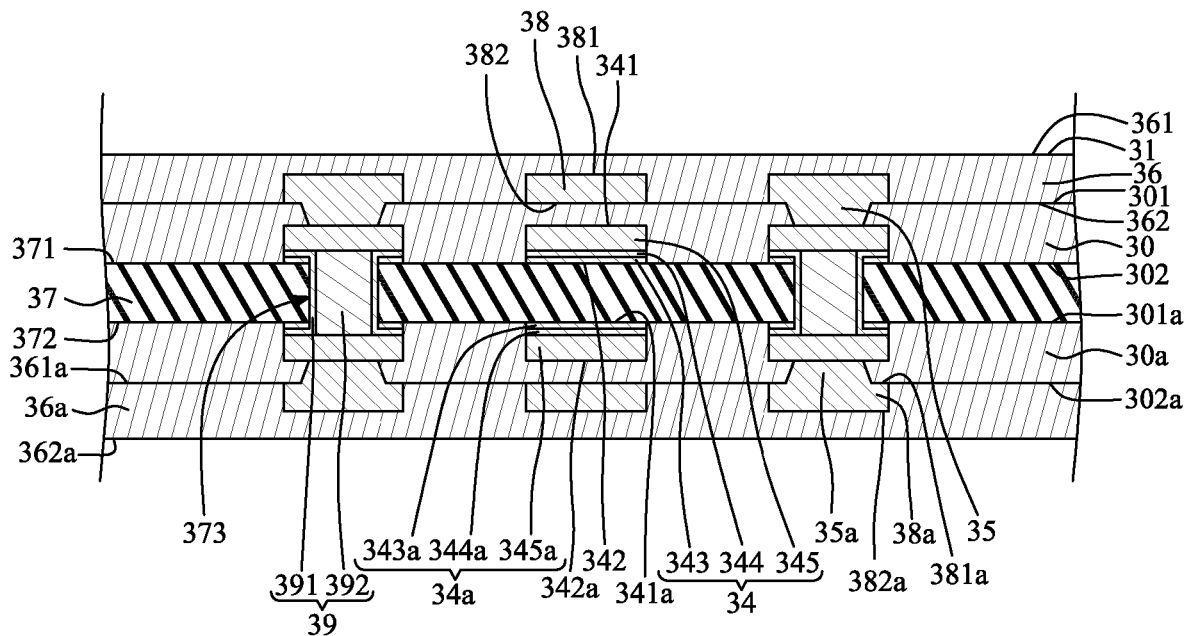
FIG. 24 illustrates one or more stages of an example of a method for manufacturing a wiring structure according to some embodiments of the present disclosure.

Referring to FIG. 24, a second upper dielectric layer 36 is formed or disposed on the top surface 301 of the first upper dielectric layer 30 to cover the top surface 301 of the first upper dielectric layer 30 and the second upper circuit layer 38 by a lamination technique or other suitable techniques. Meanwhile, a second lower dielectric layer 36a is formed or disposed on the bottom surface 302a of the first lower dielectric layer 30a to cover the bottom surface 302a of the first lower dielectric layer 30a and the second lower circuit layer 38a by a lamination technique or other suitable techniques. In some embodiments, the second upper dielectric layer 36 and the second lower dielectric layer 36a may be substantially free of reinforcement material such as glass fiber. That is, the second upper dielectric layer 36 and the second lower dielectric layer 36a may be devoid of reinforcement material such as glass fiber, and may include a homogeneous material composition of a resin. Alternatively, the second upper dielectric layer 36 and the second lower dielectric layer 36a may include a small amount of reinforcement material such as glass fiber, for example, about 5% by weight or less, about 3% by weight or less, or about 2% by weight or less. In addition, a material of the second upper dielectric layer 36 and the second lower dielectric layer 36a may include an insulating film, such as ABF. Further, a Young's modulus of the second upper dielectric layer 36 and the second lower dielectric layer 36a may be greater than or equal to about 4.0 GPa at 23° C., such as about 4.0 GPa at 23° C. or greater, about 5.0 GPa at 23° C. or greater, or about 7.5 GPa at 23° C. or greater.

Figure 25:
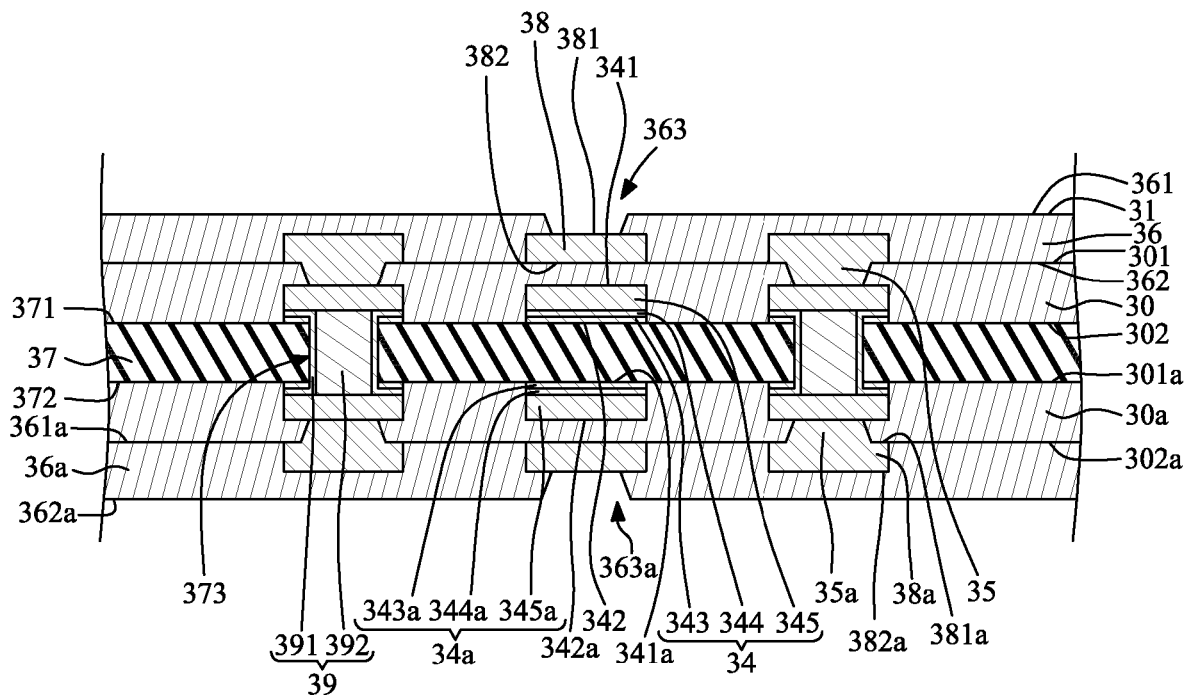
FIG. 25 illustrates one or more stages of an example of a method for manufacturing a wiring structure according to some embodiments of the present disclosure.

Referring to FIG. 25, at least one through hole 363 is formed to extend through the second upper dielectric layer 36 to expose a portion of the second upper circuit layer 38 by a drilling technique or other suitable techniques. Meanwhile, at least one through hole 363a is formed to extend through the second lower dielectric layer 36a to expose a portion of the second lower circuit layer 38a by a drilling technique or other suitable techniques.

Figure 26:
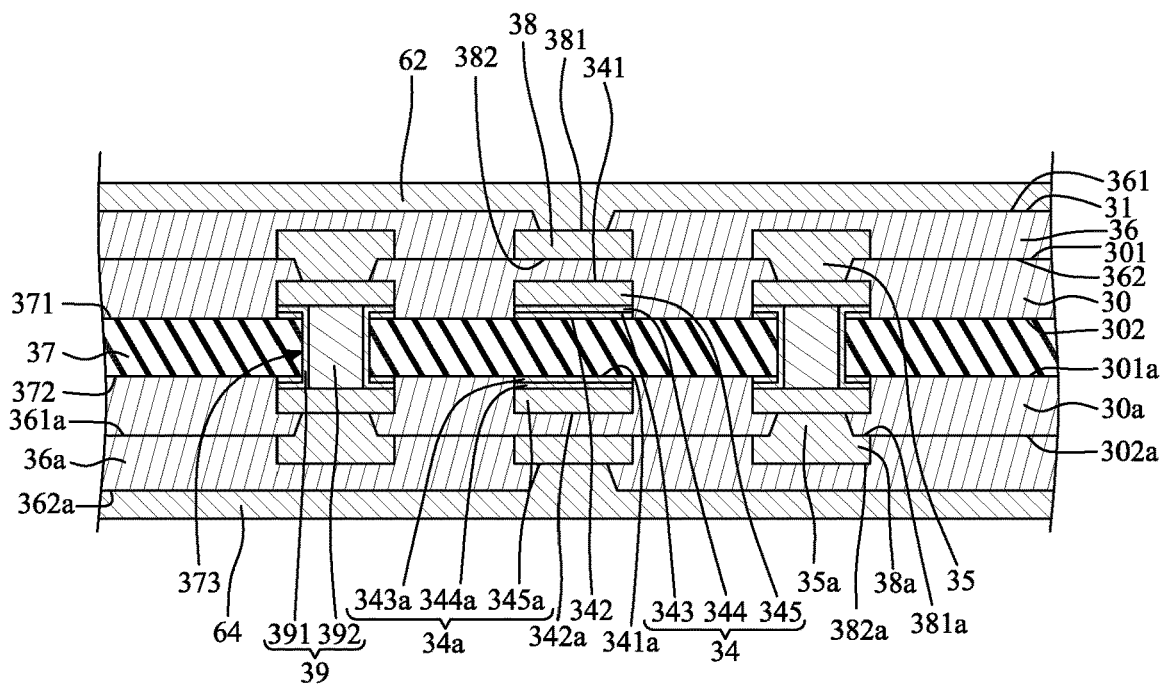
FIG. 26 illustrates one or more stages of an example of a method for manufacturing a wiring structure according to some embodiments of the present disclosure.

Referring to FIG. 26, a top metallic layer 62 is formed on the second upper dielectric layer 36 and in the through hole 363 to form an upper interconnection via 35 by a plating technique or other suitable techniques. Meanwhile, a bottom metallic layer 64 is formed on the second lower dielectric layer 36a and in the through hole 363a to form a lower interconnection via 35a by a plating technique or other suitable techniques.

Figure 27:
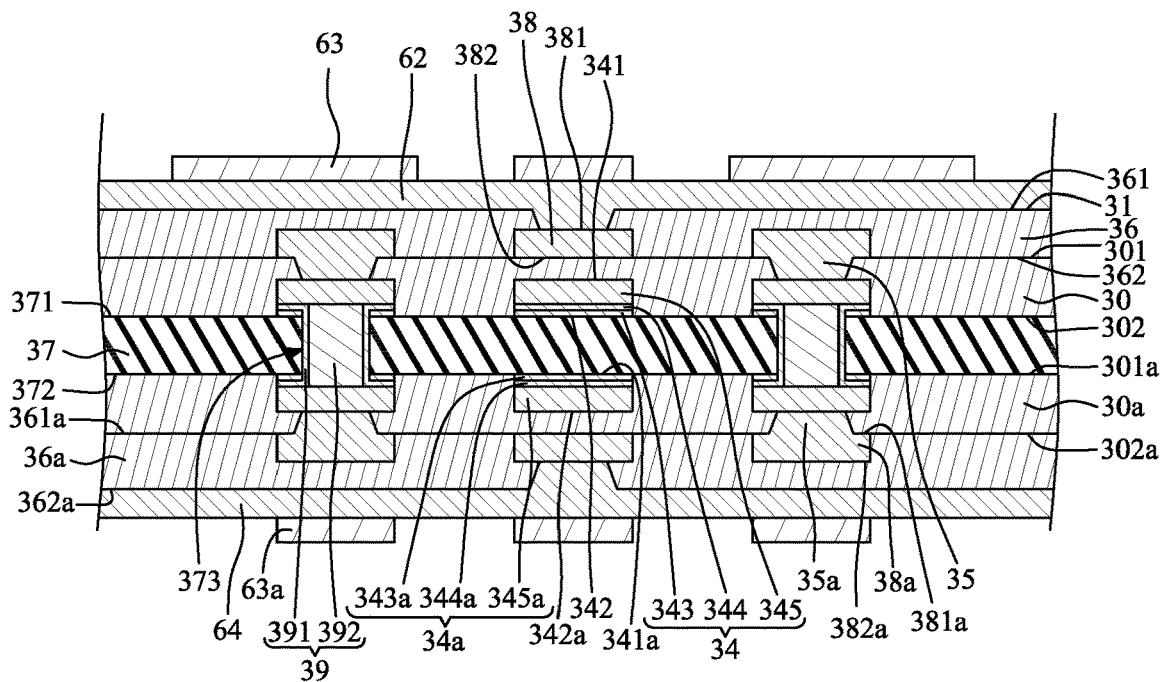
FIG. 27 illustrates one or more stages of an example of a method for manufacturing a wiring structure according to some embodiments of the present disclosure.

Referring to FIG. 27, a top photoresist layer 63 is formed or disposed on the top metallic layer 62, and a bottom photoresist layer 63a is formed or disposed on the bottom metallic layer 64. Then, the photoresist layers 63, 63a are patterned by exposure and development.

Figure 28:
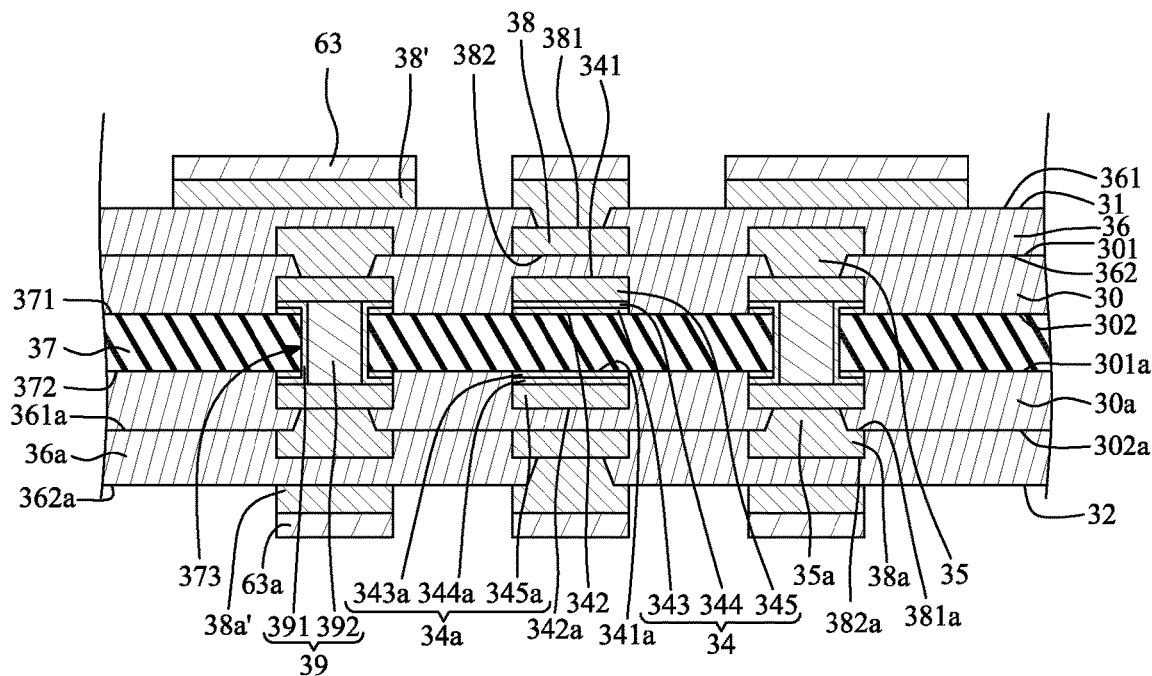
FIG. 28 illustrates one or more stages of an example of a method for manufacturing a wiring structure according to some embodiments of the present disclosure.

Referring to FIG. 28, portions of the top metallic layer 62 that are not covered by the top photoresist layer 63 are removed by an etching technique or other suitable techniques. Portions of the top metallic layer 62 that are covered by the top photoresist layer 63 remain to form a second upper circuit layer 38'. Meanwhile, portions of the bottom metallic layer 64 that are not covered by the bottom photoresist layer 63a are removed by an etching technique or other suitable techniques. Portions of the bottom metallic layer 64 that are covered by the bottom photoresist layer 63a remain to form a second lower circuit layer 38a'.

Figure 29:
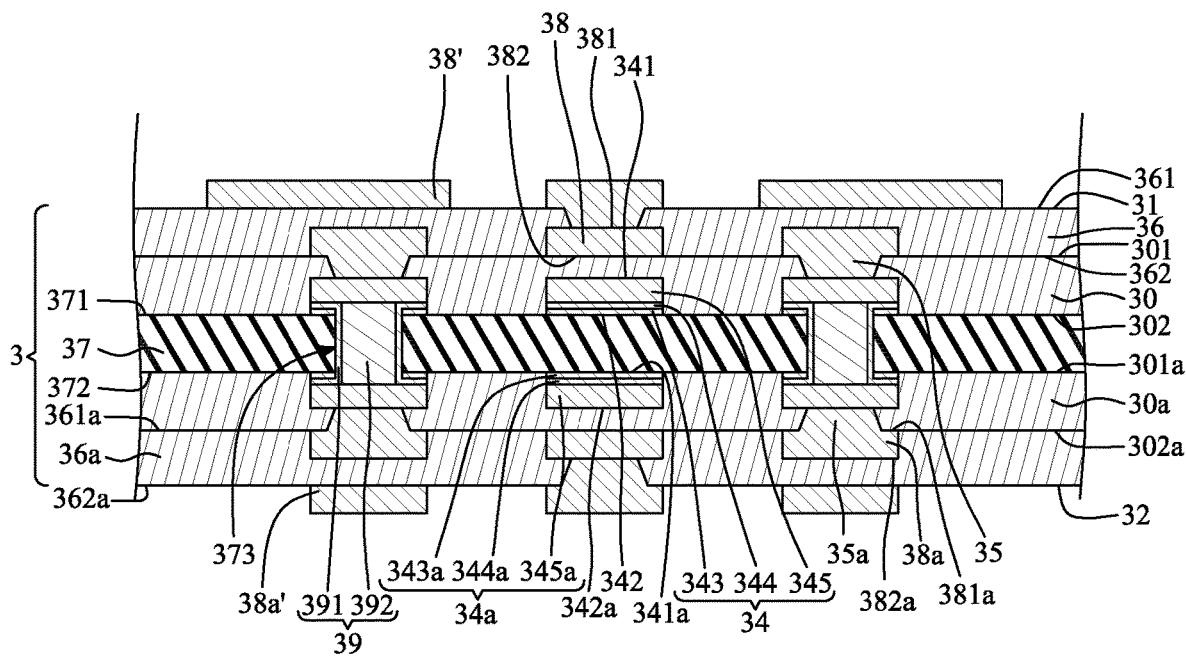
FIG. 29 illustrates one or more stages of an example of a method for manufacturing wiring structure according to some embodiments of the present disclosure.

Referring to FIG. 29, the top photoresist layer 63 and the bottom photoresist layer 63a are removed by a stripping technique or other suitable techniques. Meanwhile, the lower conductive structure 3 is formed, and the dielectric layers (including, the first upper dielectric layer 30, the second upper dielectric layer 36, the first lower dielectric layer 30a and the second lower dielectric layer 36a) are cured. At least one of the circuit layers (including, for example, one first upper circuit layer 34, two second upper circuit layers 38, 38', one first lower circuit layer 34a and two second lower circuit layers 38a, 38a') is in contact with at least one of the dielectric layers (e.g., the first upper dielectric layer 30, the second upper dielectric layer 36, the first lower dielectric layer 30a and the second lower dielectric layer 36a). Then, an electrical property (such as open circuit/short circuit) of the lower conductive structure 3 is tested.

Figure 30:
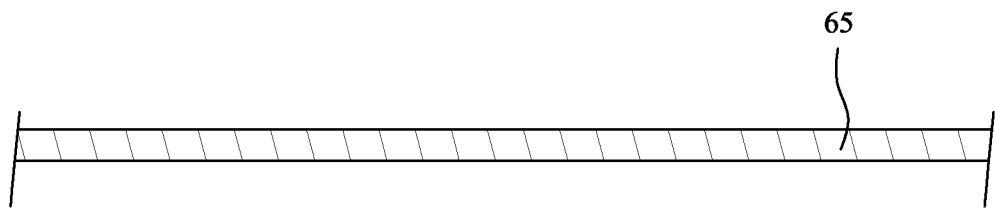
FIG. 30 illustrates one or more stages of an example of a method for manufacturing a wiring structure according to some embodiments of the present disclosure.

Referring to FIG. 30 through FIG. 40, an upper conductive structure 2 is provided. The upper conductive structure 2 is manufactured as follows. Referring to FIG. 30, a carrier 65 is provided. The carrier 65 may be a glass carrier, and may be in a wafer type, a panel type or a strip type.

Figure 31:
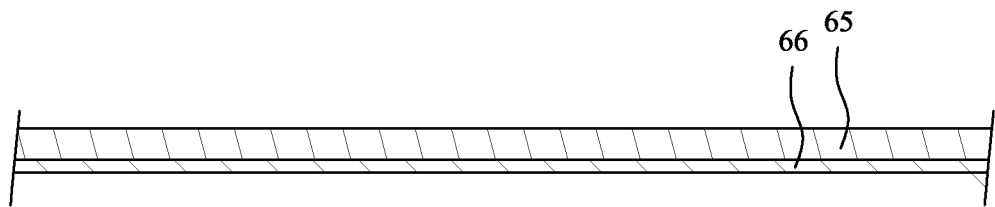
FIG. 31 illustrates one or more stages of an example of a method for manufacturing a wiring structure according to some embodiments of the present disclosure.

Referring to FIG. 31, a release layer 66 is coated on a bottom surface of the carrier 65.

Figure 32:
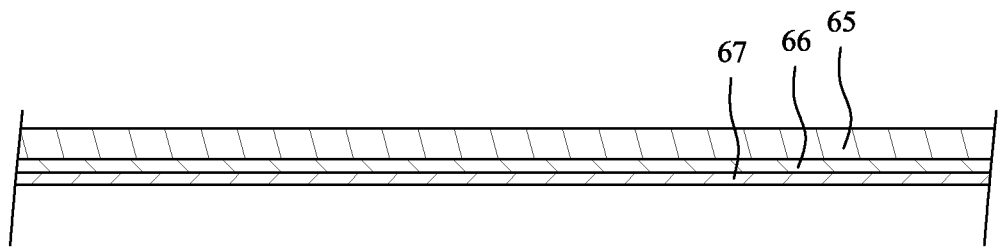
FIG. 32 illustrates one or more stages of an example of a method for manufacturing a wiring structure according to some embodiments of the present disclosure.

Referring to FIG. 32, a conductive layer 67 (e.g., a seed layer) is formed or disposed on the release layer 66 by a physical vapor deposition (PVD) technique or other suitable techniques.

Figure 33:
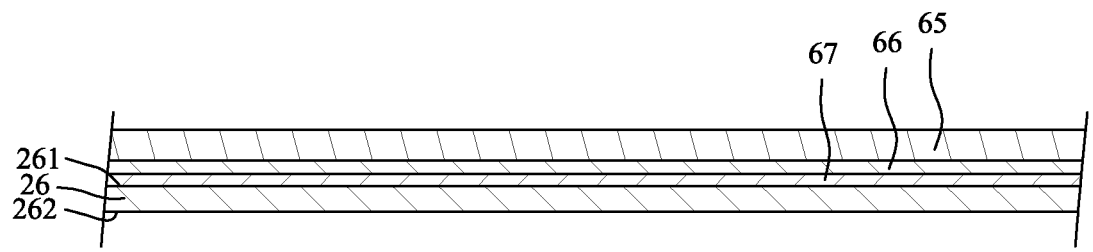
FIG. 33 illustrates one or more stages of an example of a method for manufacturing a wiring structure according to some embodiments of the present disclosure.

Referring to FIG. 33, a second dielectric layer 26 is formed on the conductive layer 67 by a coating technique or other suitable techniques.

Figure 34:
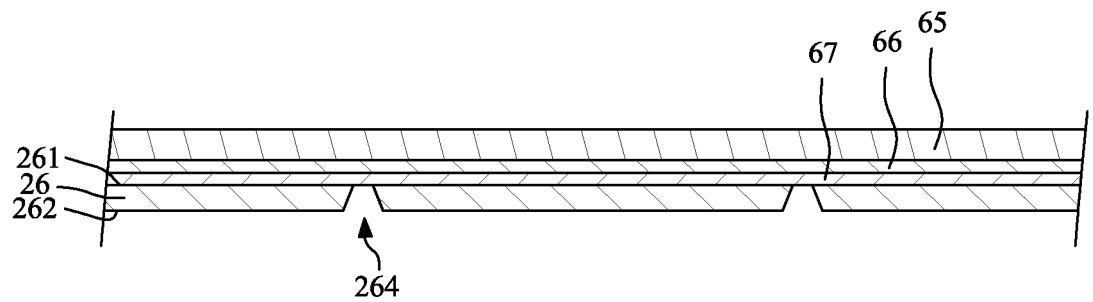
FIG. 34 illustrates one or more stages of an example of a method for manufacturing a wiring structure according to some embodiments of the present disclosure.

Referring to FIG. 34, at least one through hole 264 is formed to extend through the second dielectric layer 26 to expose a portion of the conductive layer 67 by an exposure and development technique or other suitable techniques.

Figure 35:
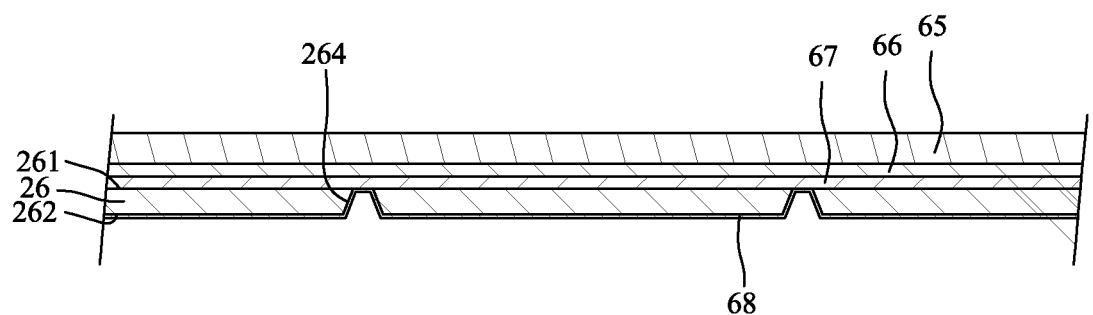
FIG. 35 illustrates one or more stages of an example of a method for manufacturing a wiring structure according to some embodiments of the present disclosure.

Referring to FIG. 35, a seed layer 68 is formed on a bottom surface 262 of the second dielectric layer 26 and in the through hole 264 by a PVD technique or other suitable techniques.

Figure 36:
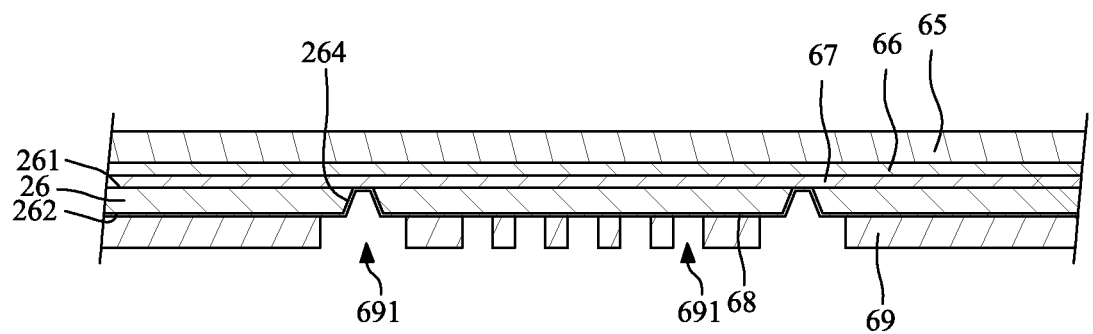
FIG. 36 illustrates one or more stages of an example of a method for manufacturing a wiring structure according to some embodiments of the present disclosure.

Referring to FIG. 36, a photoresist layer 69 is formed on the seed layer 68. Then, the photoresist layer 69 is patterned to expose portions of the seed layer 68 by an exposure and development technique or other suitable techniques. The photoresist layer 69 defines a plurality of openings 691. At least one opening 691 of the photoresist layer 69 corresponds to, and is aligned with, the through hole 264 of the second dielectric layer 26.

Figure 37:
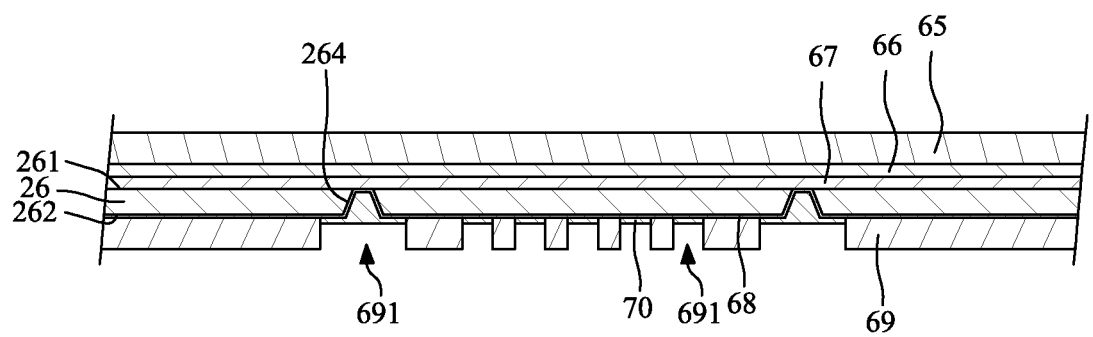
FIG. 37 illustrates one or more stages of an example of a method for manufacturing a wiring structure according to some embodiments of the present disclosure.

Referring to FIG. 37, a conductive material 70 (e.g., a metallic material) is disposed in the openings 691 of the photoresist layer 69 and on the seed layer 68 by a plating technique or other suitable techniques.

Figure 38:
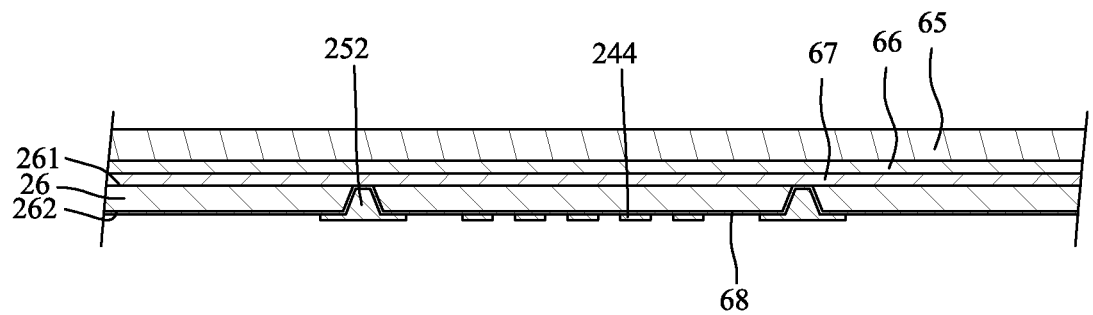
FIG. 38 illustrates one or more stages of an example of a method for manufacturing a wiring structure according to some embodiments of the present disclosure.

Referring to FIG. 38, the photoresist layer 69 is removed by a stripping technique or other suitable techniques.

Figure 39:
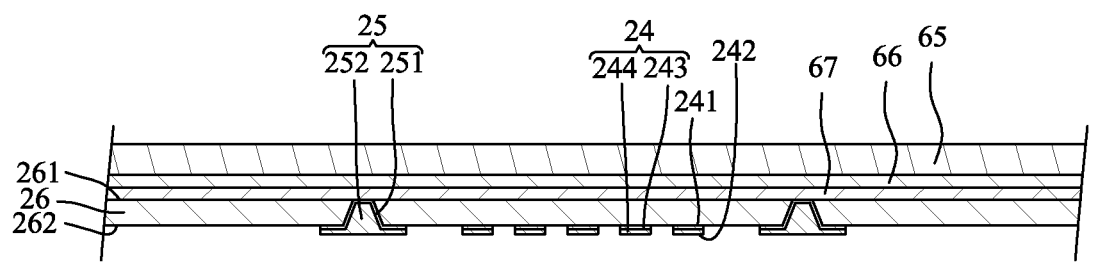
FIG. 39 illustrates one or more stages of an example of a method for manufacturing a wiring structure according to some embodiments of the present disclosure.

Referring to FIG. 39, portions of the seed layer 68 that are not covered by the conductive material 70 are removed by an etching technique or other suitable techniques. Meanwhile, a circuit layer 24 and at least one inner via 25 are formed. The circuit layer 24 may be a fan-out circuit layer or an RDL, and an L/S of the circuit layer 24 may be less than or equal to about 2 μm/about 2 μm, or less than or equal to about 1.8 μm/about 1.8 μm. The circuit layer 24 is disposed on the bottom surface 262 of the second dielectric layer 26. In some embodiments, the circuit layer 24 may include a seed layer 243 formed from the seed layer 68 and a conductive material 244 disposed on the seed layer 243 and formed from the conductive material 70. The inner via 25 is disposed in the through hole 264 of the second dielectric layer 26. In some embodiments, the inner via 25 may include a seed layer 251 and a conductive material 252 disposed on the seed layer 251. The inner via 25 tapers upwardly.

Figure 40:
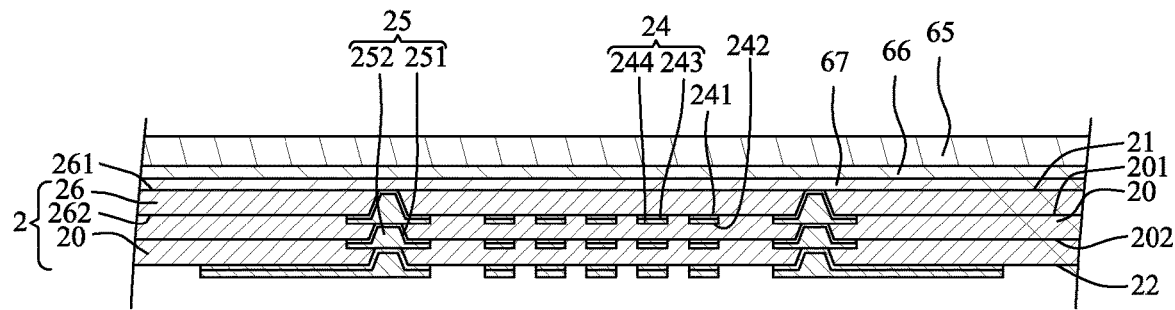
FIG. 40 illustrates one or more stages of an example of a method for manufacturing wiring structure according to some embodiments of the present disclosure.

Referring to FIG. 40, a plurality of first dielectric layers 20 and a plurality of circuit layers 24 are formed by repeating the stages of FIG. 33 to FIG. 39. In some embodiments, each circuit layer 24 is embedded in the corresponding first dielectric layer 20, and a top surface 241 of the circuit layer 24 may be substantially coplanar with a top surface 201 of the first dielectric layer 20. Meanwhile, the upper conductive structure 2 is formed, and the dielectric layers (including, the first dielectric layers 20 and the second dielectric layer 26) are cured. At least one of the circuit layers (including, for example, three circuit layers 24) is in contact with at least one of the dielectric layers (e.g., the first dielectric layers 20 and the second dielectric layer 26). Then, an electrical property (such as open circuit/short circuit) of the upper conductive structure 2 is tested.

Figure 41:
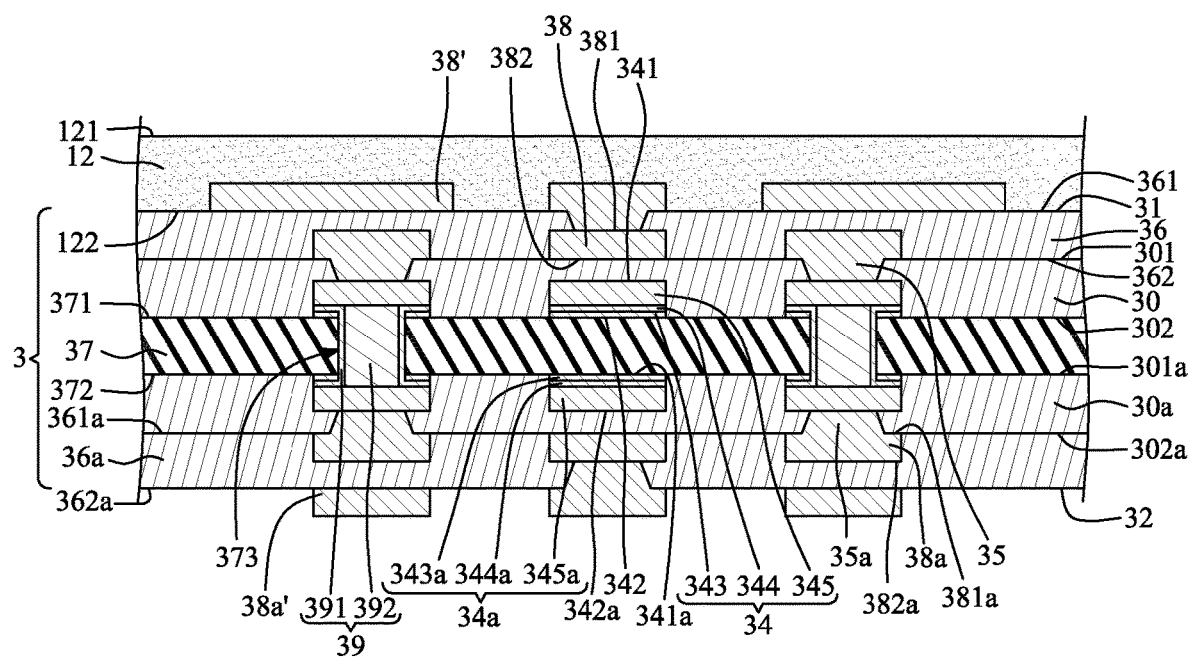
FIG. 41 illustrates one or more stages of an example of a method for manufacturing a wiring structure according to some embodiments of the present disclosure.

Referring to FIG. 41, an adhesive layer 12 is formed or applied on the top surface 31 of the lower conductive structure 3. In some embodiments, the adhesive layer 12 may be substantially free of reinforcement material such as glass fiber. That is, the adhesive layer 12 may be devoid of reinforcement material such as glass fiber, and may include a homogeneous material composition of a resin. Alternatively, the adhesive layer 12 may include a small amount of reinforcement material such as glass fiber, for example, about 5% by weight or less, about 3% by weight or less, or about 2% by weight or less. In addition, a material of the adhesive layer 12 may include an insulating film, such as ABF. Further, a Young's modulus of the adhesive layer 12 may be greater than or equal to about 4.0 GPa at 23° C., such as about 4.0 GPa at 23° C. or greater, about 5.0 GPa at 23° C. or greater, or about 7.5 GPa at 23° C. or greater.

Figure 42:
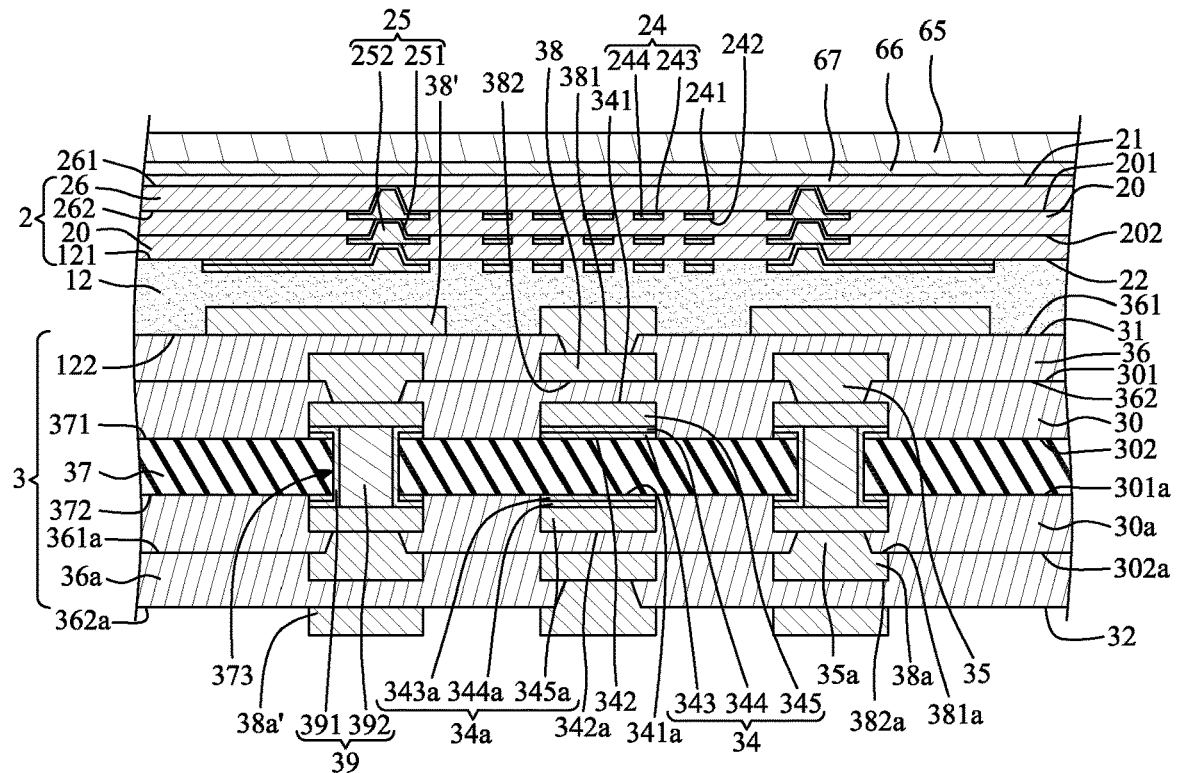
FIG. 42 illustrates one or more stages of an example of a method for manufacturing a wiring structure according to some embodiments of the present disclosure.

Referring to FIG. 42, the upper conductive structure 2 is attached to the lower conductive structure 3 through the adhesive layer 12. In some embodiments, the known good upper conductive structure 2 is attached to the known good lower conductive structure 3. Then, the adhesive layer 12 is cured to form an intermediate layer 12. In some embodiments, the upper conductive structure 2 may be pressed onto the lower conductive structure 3. Thus, the thickness of the intermediate layer 12 is determined by the gap between the upper conductive structure 2 and the lower conductive structure 3. The top surface 121 of the intermediate layer 12 contacts the bottom surface 22 of the upper conductive structure 2 (that is, the bottom surface 22 of the upper conductive structure 2 is attached to the top surface 121 of the intermediate layer 12), and the bottom surface 122 of the intermediate layer 12 contacts the top surface 31 of the lower conductive structure 3. Thus, the bottommost circuit layer 24 of the upper conductive structure 2 and the second upper circuit layer 38' of the lower conductive structure 3 are embedded in the intermediate layer 12. In some embodiments, a bonding force between two adjacent dielectric layers (e.g., two adjacent first dielectric layers 20) of the upper conductive structure 2 is greater than a bonding force between a dielectric layer (e.g., the bottommost first dielectric layer 20) of the upper conductive structure 2 and the intermediate layer 12. A surface roughness of a boundary between two adjacent dielectric layers (e.g., two adjacent first dielectric layers 20) of the upper conductive structure 2 is greater than a surface roughness of a boundary between a dielectric layer (e.g., the bottommost first dielectric layer 20) of the upper conductive structure 2 and the intermediate layer 12.

Figure 43:
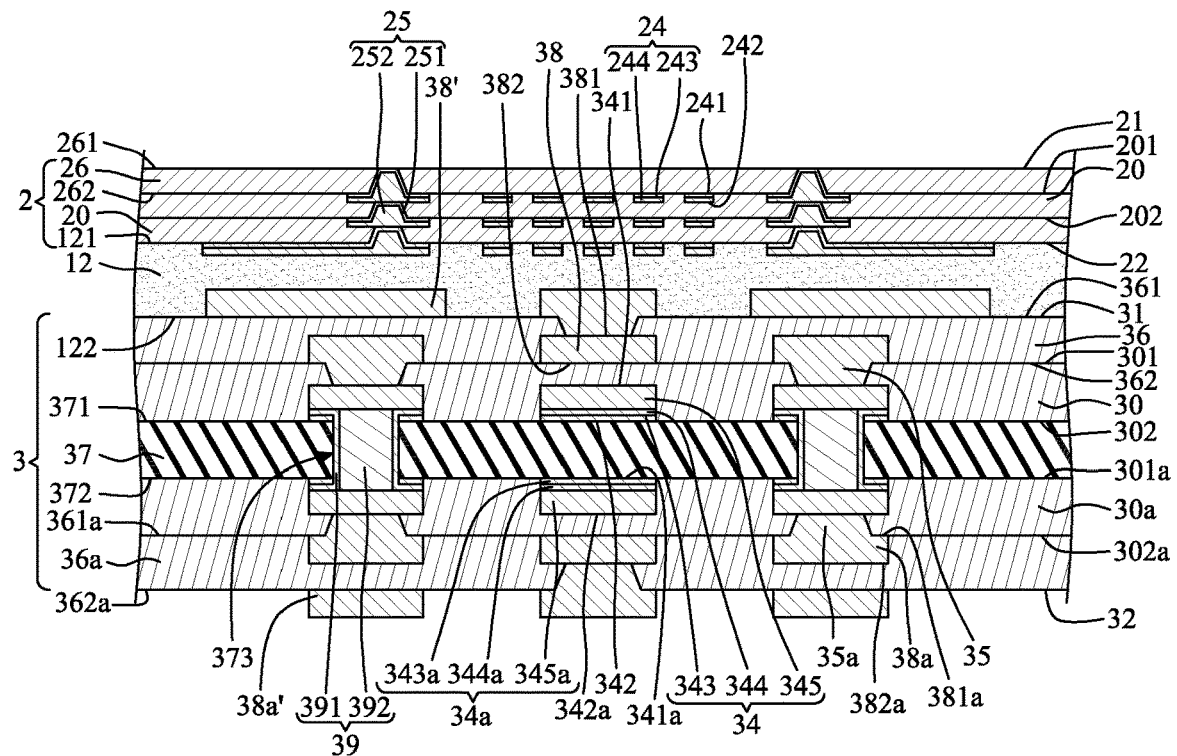
FIG. 43 illustrates one or more stages of an example of a method for manufacturing a wiring structure according to some embodiments of the present disclosure.

Referring to FIG. 43, the carrier 65, the release layer 66 and the conductive layer 67 are removed so as to expose a portion of the inner via 25.

Figure 44:
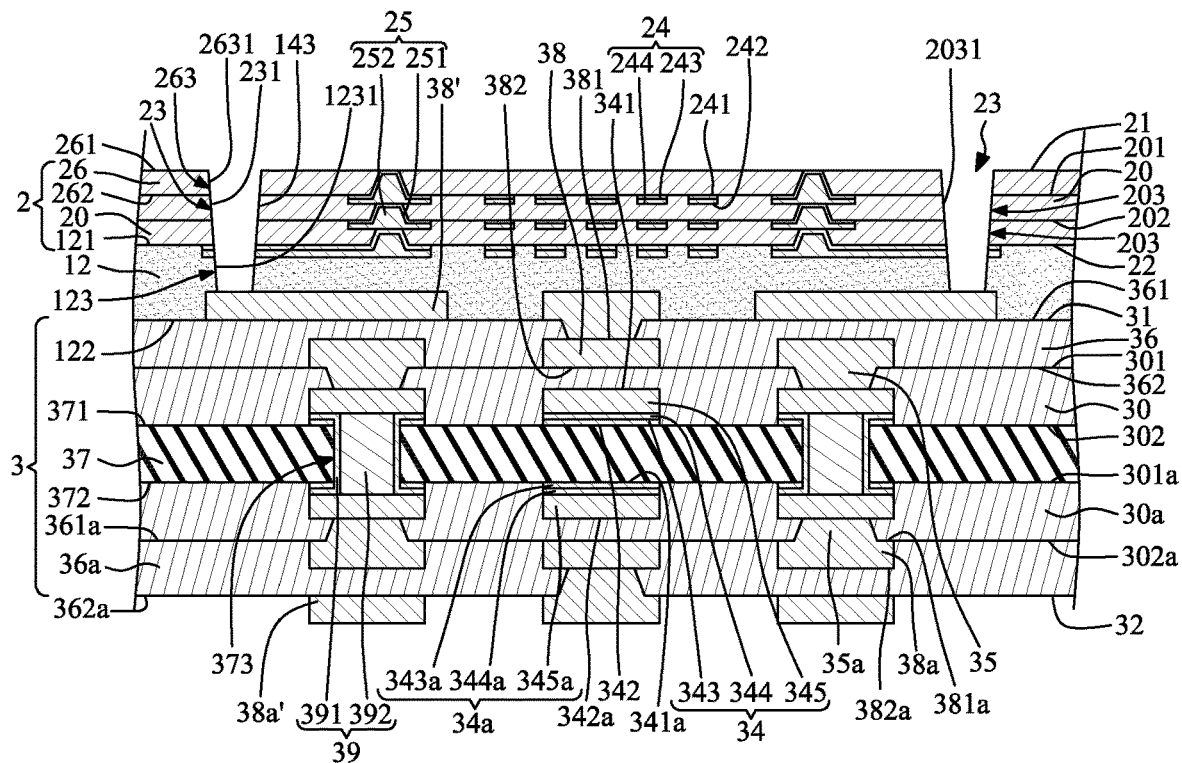
FIG. 44 illustrates one or more stages of an example of a method for manufacturing a wiring structure according to some embodiments of the present disclosure.

Referring to FIG. 44, at least one through hole 23 is formed to extend through at least a portion of the upper conductive structure 2 and the intermediate layer 12 by drilling (such as laser drilling) to exposes a circuit layer (e.g., second upper circuit layer 38') of the lower conductive structure 3. The through hole 23 may include a through hole 263 of the second dielectric layer 26, a plurality of through holes 203 of the first dielectric layers 20 and a through hole 123 of the intermediate layer 12. In some embodiments, the through hole 23 extends through the bottommost first circuit layer 24 of the upper conductive structure 2 and terminates at or on a topmost circuit layer (e.g., the second upper circuit layer 38') of the lower conductive structure 3. That is, the through hole 23 does not extend through the topmost circuit layer (e.g., the second upper circuit layer 38') of the lower conductive structure 3. The through hole 23 may expose a portion of the topmost circuit layer (e.g., the top surface of the second upper circuit layer 38') of the lower conductive structure 3. As shown in FIG. 44, the through hole 23 tapers downwardly; that is, a size of a top portion of the through hole 23 is greater than a size of a bottom portion of the through hole 23. In addition, an inner surface 1231 of the through hole 123 of the intermediate layer 12 is coplanar with or aligned with inner surfaces 2031 of the through holes 203 of the first dielectric layers 20 and an inner surface 2631 of the through hole 263 of the second dielectric layer 26. Thus, cross-sectional views of one side of the through hole 123 of the intermediate layer 12, the inner surfaces 2031 of the through holes 203 of the first dielectric layers 20 and the inner surface 2631 of the through hole 263 of the second dielectric layer 26 are segments of a substantially straight line. That is, cross-sectional views of one side of the inner surface 1231 of the through hole 123 of the intermediate layer 12, the inner surfaces 2031 of the through holes 203 of the first dielectric layers 20 and the inner surface 2631 of the through hole 263 of the second dielectric layer 26 may extend along the same substantially straight line. That is, an inner surface of the single, continuous through hole 23 may be a substantially smooth or continuous surface. The single through hole 23 tapers downwardly.

Figure 45:
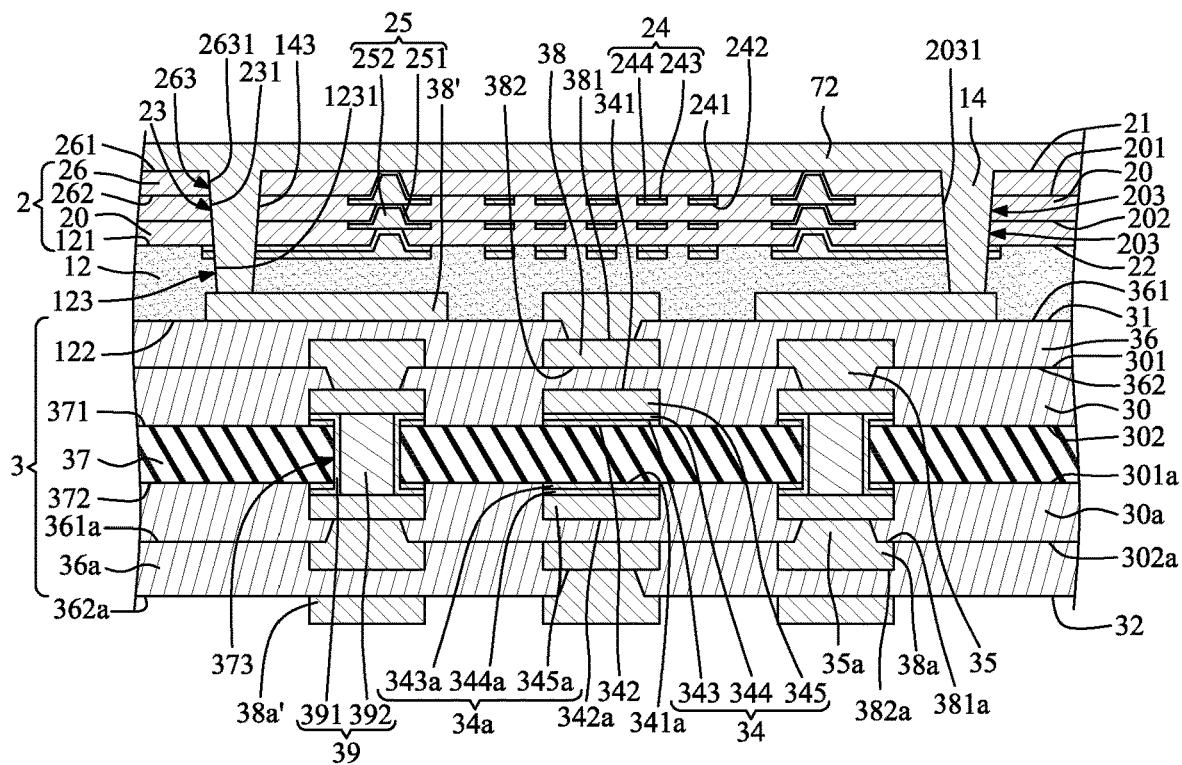
FIG. 45 illustrates one or more stages of an example of a method for manufacturing a wiring structure according to some embodiments of the present disclosure.

Referring to FIG. 45, a metallic layer 72 is formed on the surface 21 of the upper conductive structure 2 and in the through hole 23 to form at least one upper through via 14 in the through hole 23 by a plating technique or other suitable techniques.

Figure 46:
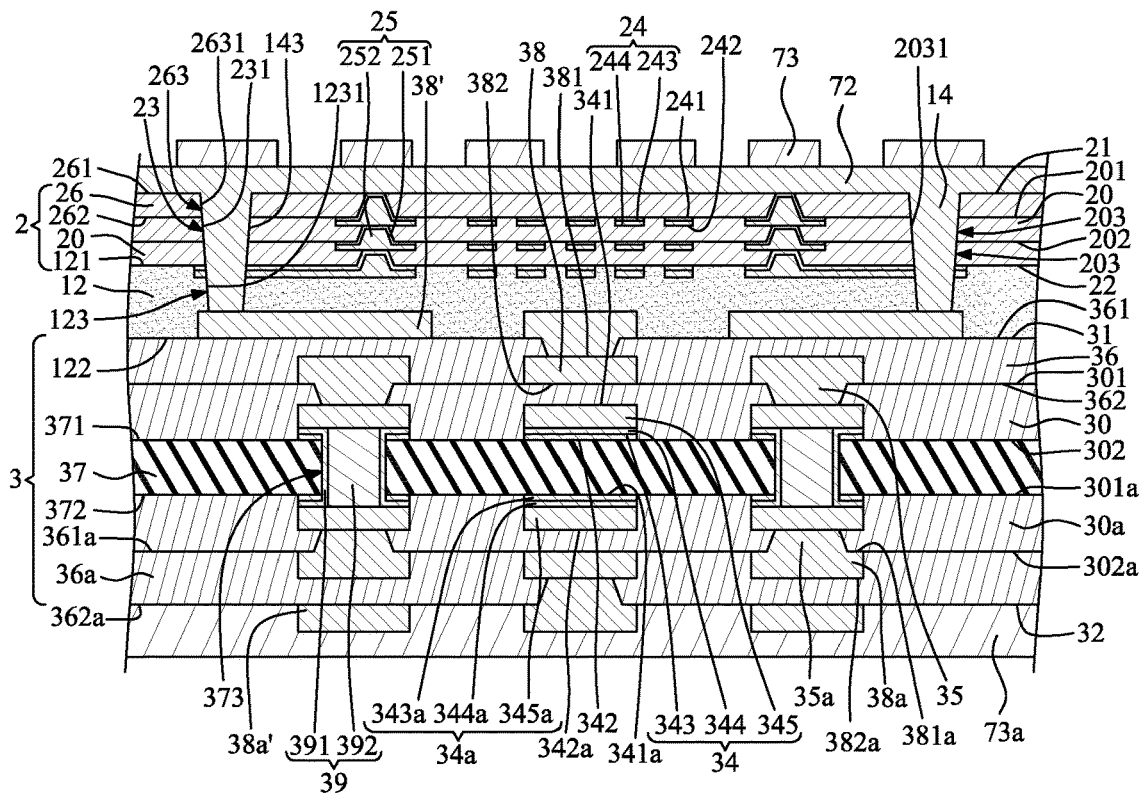
FIG. 46 illustrates one or more stages of an example of a method for manufacturing a wiring structure according to some embodiments of the present disclosure.

Referring to FIG. 46, a top photoresist layer 73 is formed or disposed on the metallic layer 72, and a bottom photoresist layer 73a is formed or disposed on the bottom surface 32 of the lower conductive structure 3. Then, the top photoresist layer 73 is patterned by an exposure and development technique or other suitable techniques.

Figure 47:
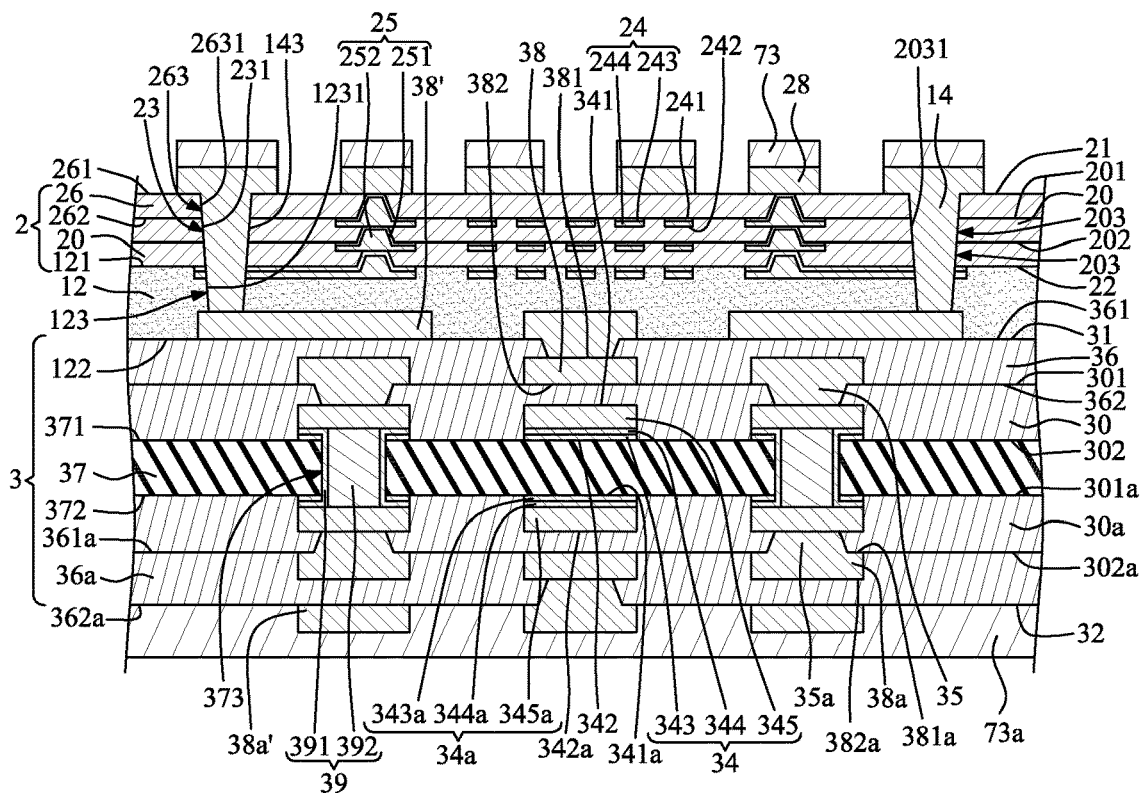
FIG. 47 illustrates one or more stages of an example of a method for manufacturing a wiring structure according to some embodiments of the present disclosure.

Referring to FIG. 47, portions of the metallic layer 72 that are not covered by the top photoresist layer 73 are removed by an etching technique or other suitable techniques. Portions of the metallic layer 72 that are covered by the top photoresist layer 73 remain to form a second circuit layer 28. Then, the top photoresist layer 73 and the bottom photoresist layer 73a are removed by a stripping technique or other suitable techniques, so as to obtain the wiring structure 1 of FIG. 1.

In some embodiments, a semiconductor chip 42 (FIG. 7) is electrically connected and bonded to the outer circuit layer 28 of the upper conductive structure 2 through a plurality of first connecting elements 44 (e.g., solder bumps or other conductive bumps). Then, the upper conductive structure 2, the intermediate layer 12 and the lower conductive structure 3 are singulated concurrently, so as to from a package structure 4 as shown in FIG. 7. The package structure 4 includes a wiring structure 1f and the semiconductor chip 42. The wiring structure 1f of FIG. 7 includes a singulated upper conductive structure 2f and a singulated lower conductive structure 3f. That is, a lateral peripheral surface 27f of the upper conductive structure 2f, a lateral peripheral surface 33f of the lower conductive structure 3f and a lateral peripheral surface of the intermediate layer 12 are substantially coplanar with each other. Then, the second lower circuit layer 38a' of the lower conductive structure 3c is electrically connected and bonded to a substrate 46 (e.g., a mother board such as a PCB) through a plurality of second connecting elements 48 (e.g., solder bumps or other conductive bumps).

Figure 48:
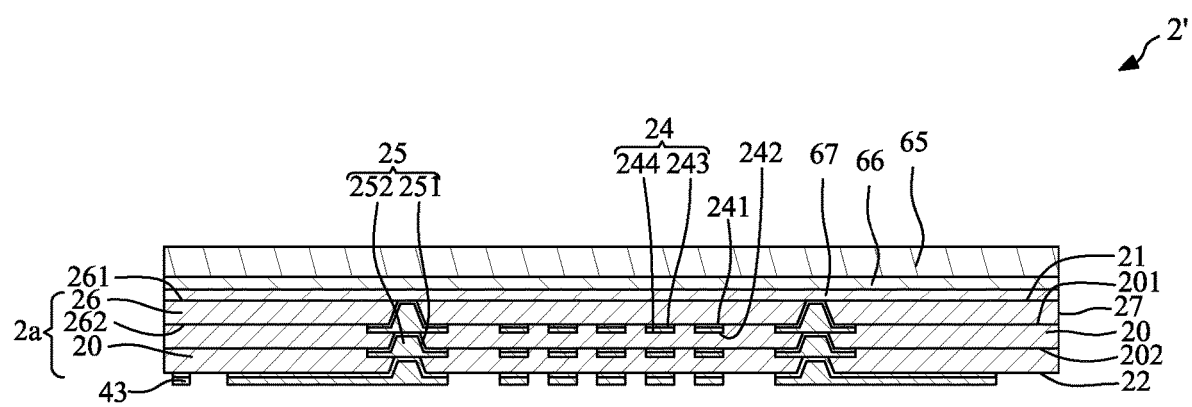
FIG. 48 illustrates one or more stages of an example of a method for manufacturing a wiring structure according to some embodiments of the present disclosure.

FIG. 48 through FIG. 51 illustrate a method for manufacturing a wiring structure according to some embodiments of the present disclosure. In some embodiments, the method is for manufacturing the wiring structure 1a shown in FIG. 2. The initial stages of the illustrated process are the same as, or similar to, the stages illustrated in FIG. 10 to FIG. 40. FIG. 48 depicts a stage subsequent to that depicted in FIG. 40.

Referring to FIG. 48, a fiducial mark 43 and the bottommost first circuit layer 24 are formed concurrently and are at the same layer. Thus, the fiducial mark 43 is disposed on and protrudes from the bottom surface 22 of the upper conductive structure 2a. Then, the upper conductive structure 2a, the carrier 65, the release layer 66 and the conductive layer 67 are cut or singulated concurrently to form a plurality of strips 2'. Each of the strips 2' includes the upper conductive structure 2a that is a strip structure. Then, the strips 2' are tested. Alternatively, the upper conductive structure 2 may be tested before the cutting process.

Figure 49:
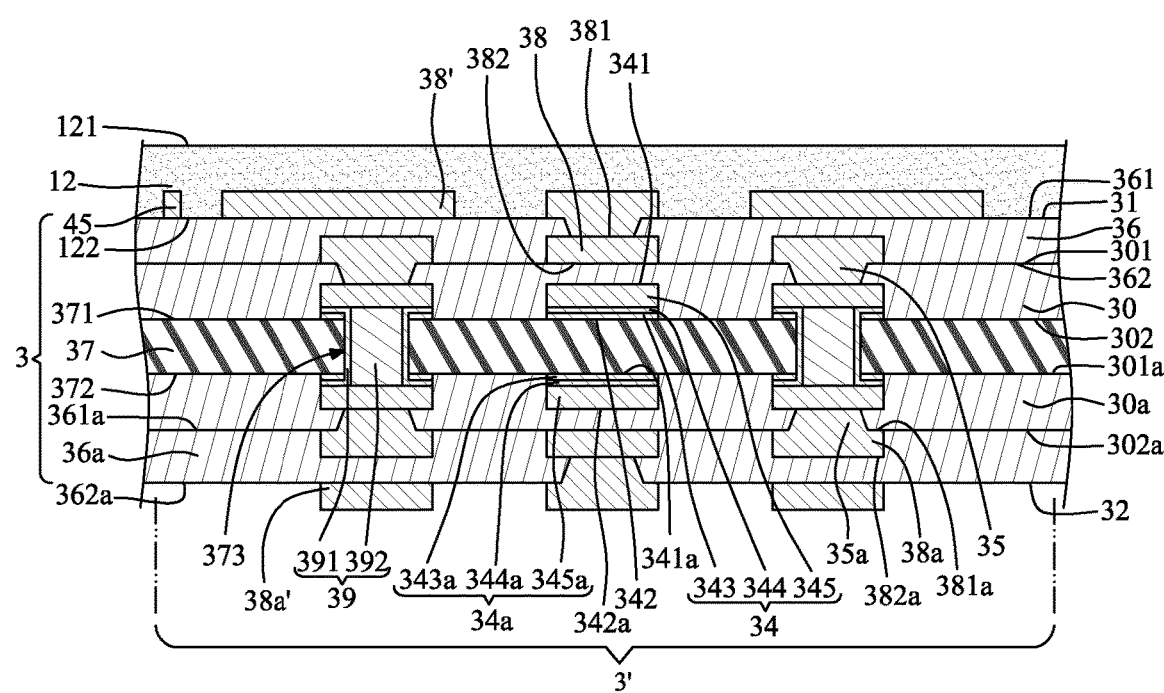
FIG. 49 illustrates one or more stages of an example of a method for manufacturing a wiring structure according to some embodiments of the present disclosure.

Referring to FIG. 49, a fiducial mark 45 and the second upper circuit layer 38' are formed concurrently and are at the same layer. Thus, the fiducial mark 45 is disposed on and protrudes from the top surface 31 of the lower conductive structure 3. The lower conductive structure 3 includes a plurality of strip areas 3'. Then, the strip areas 3' are tested. Then, an adhesive layer 12 is formed or applied on the top surface 31 of the lower conductive structure 3.

Figure 50:
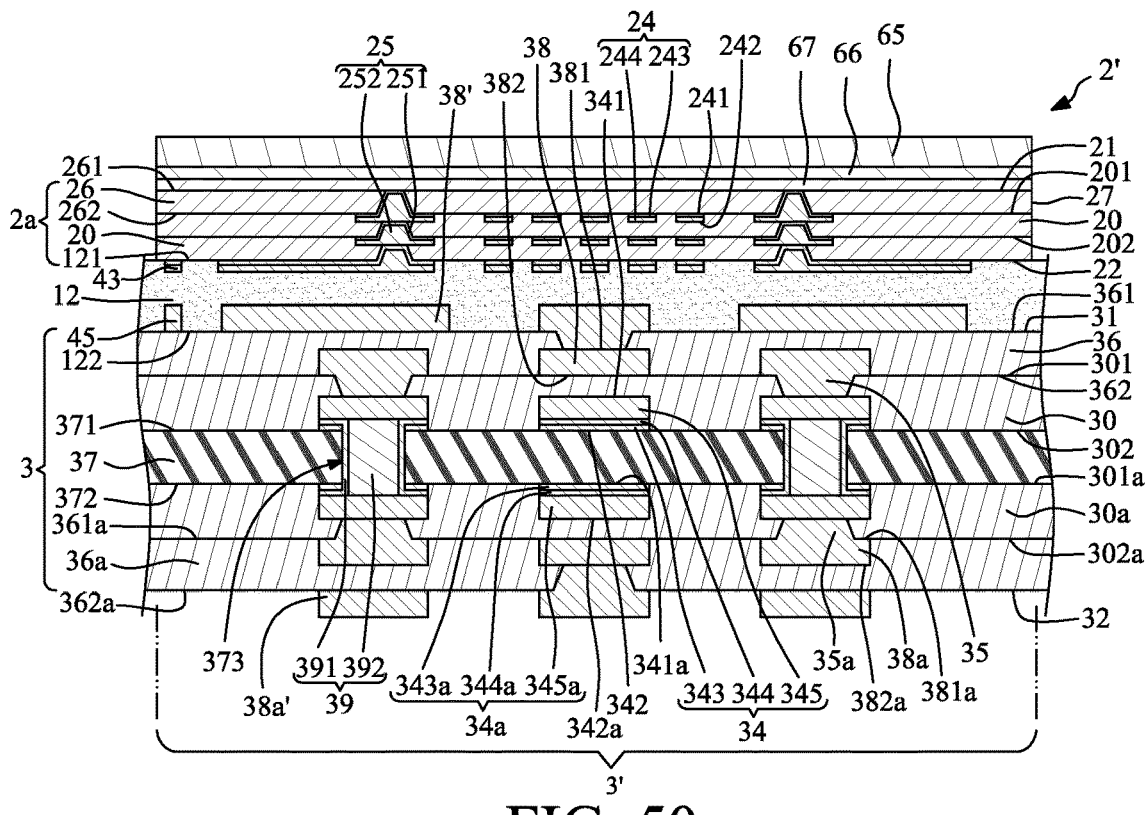
FIG. 50 illustrates one or more stages of an example of a method for manufacturing a wiring structure according to some embodiments of the present disclosure.

Referring to FIG. 50, the strips 2' are attached to the strip areas 3' of the lower conductive structure 3 through the adhesive layer 12. The upper conductive structure 2a faces and is attached to the lower conductive structure 3. During the attaching process, the fiducial mark 43 of the upper conductive structure 2a is aligned with the fiducial mark 45 of the lower conductive structure 3, so that the relative positions of the upper conductive structure 2a and the lower conductive structure 3 is secured. In some embodiments, known good strip 2' is selectively attached to known good strip area 3' of the lower conductive structure 3. For example, a desired yield of the wiring structure 1a (FIG. 2) may be set to be 80%. That is, (the yield of the upper conductive structure 2a)×(the yield of the strip area 3' of the lower conductive structure 3) is set to be greater than or equal to 80%. If a yield of the upper conductive structure 2a (or strip 2') is less than a predetermined yield such as 80%

(which is specified as bad or unqualified component), then, the bad (or unqualified) upper conductive structure 2a (or strip 2') is discarded. If a yield of the upper conductive structure 2a (or strip 2') is greater than or equal to the predetermined yield such as 80% (which is specified as known good or qualified component), then the known good upper conductive structure 2a (or strip 2') can be used. In addition, if a yield of the strip area 3' of the lower conductive structure 3 is less than a predetermined yield such as 80% (which is specified as bad or unqualified component), then the bad (or unqualified) strip area 3' is marked and will not be bonded with any strip 2'. If a yield of the strip area 3' of the lower conductive structure 3 is greater than or equal to the predetermined yield such as 80% (which is specified as known good component or qualified component), then the known good upper conductive structure 2a (or strip 2') can be bonded to the known good strip area 3' of the lower conductive structure 3. It is noted that the upper conductive structure 2a (or strip 2') having a yield of 80% will not be bonded to the strip area 3' of the lower conductive structure 3 having a yield of 80%, since the resultant yield of the wiring structure 1a (FIG. 2) is 64%, which is lower than the desired yield of 80%. The upper conductive structure 2a (or strip 2') having a yield of 80% can be bonded to the strip area 3' of the lower conductive structure 3 having a yield of 100%; thus, the resultant yield of the wiring structure 1a (FIG. 2) can be 80%. In addition, an upper conductive structure 2a (or strip 2') having a yield of 90% can be bonded to the strip area 3' of the lower conductive structure 3 having a yield of greater than 90%, since the resultant yield of the wiring structure 1a (FIG. 2) can be greater than 80%.

Figure 51:
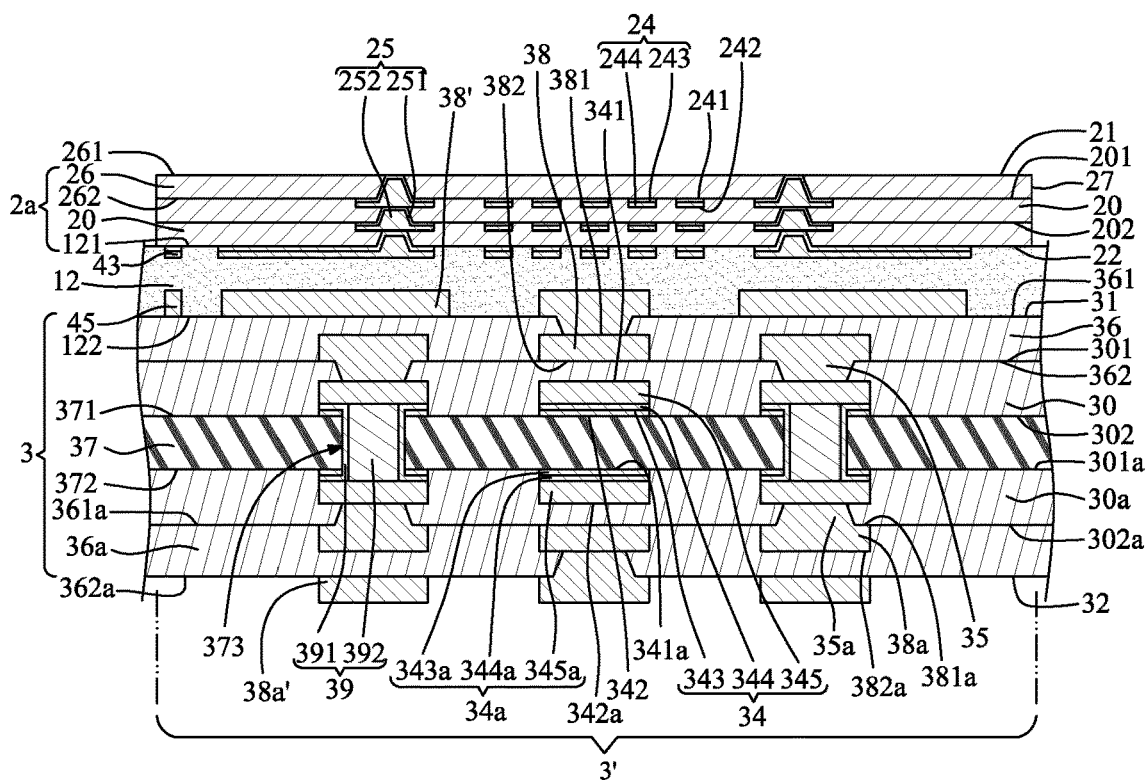
FIG. 51 illustrates one or more stages of an example of a method for manufacturing a wiring structure according to some embodiments of the present disclosure.

Referring to FIG. 51, the adhesive layer 12 is cured to form the intermediate layer 12. Then, the carrier 65, the release layer 66 and the conductive layer 67 are removed. Then, the stages subsequent to that shown in FIG. 51 of the illustrated process are similar to the stages illustrated in FIG. 44 to FIG. 47. Then, the lower conductive structure 3 and the intermediate layer 12 are cut along the strip areas 3', so as to obtain the wiring structure 1a of FIG. 2.

Figure 52:
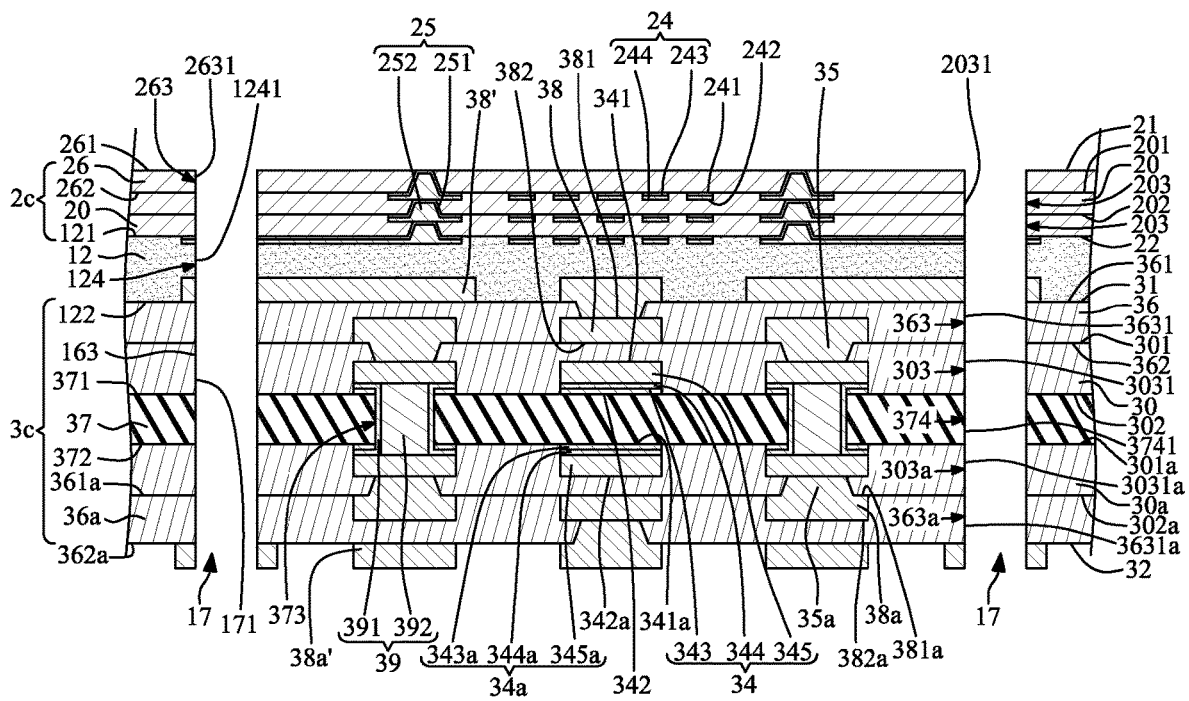
FIG. 52 illustrates one or more stages of an example of a method for manufacturing a wiring structure according to some embodiments of the present disclosure.

FIG. 52 through FIG. 55 illustrate a method for manufacturing a wiring structure according to some embodiments of the present disclosure. In some embodiments, the method is for manufacturing the wiring structure 1c shown in FIG. 4. The initial stages of the illustrated process are the same as, or similar to, the stages illustrated in FIG. 10 to FIG. 43. FIG. 52 depicts a stage subsequent to that depicted in FIG. 43. Referring to FIG. 52, at least one through hole 17 is formed to extend through the upper conductive structure 2, the intermediate layer 12 and the lower conductive structure 3 by drilling (such as mechanical drilling or laser drilling). Meanwhile, the upper conductive structure 2 becomes an upper conductive structure 2c, and the lower conductive structure 3 becomes a lower conductive structure 3c. The through hole 17 may include a through hole 263 of the second dielectric layer 26, a plurality of through holes 203 of the first dielectric layers 20, a through hole 124 of the intermediate layer 12, a through hole 363 of the second upper dielectric layer 36, a through hole 303 of the first upper dielectric layer 30, a second through hole 374 of the core portion 37, a through hole 303a of the first lower dielectric layer 30a and a through hole 363a of the second lower dielectric layer 36a. As shown in FIG. 52, the through hole 17 may not taper; that is, a size of a top portion of the through hole 17 is substantially equal to a size of a bottom portion of the through hole 17.

Figure 53:
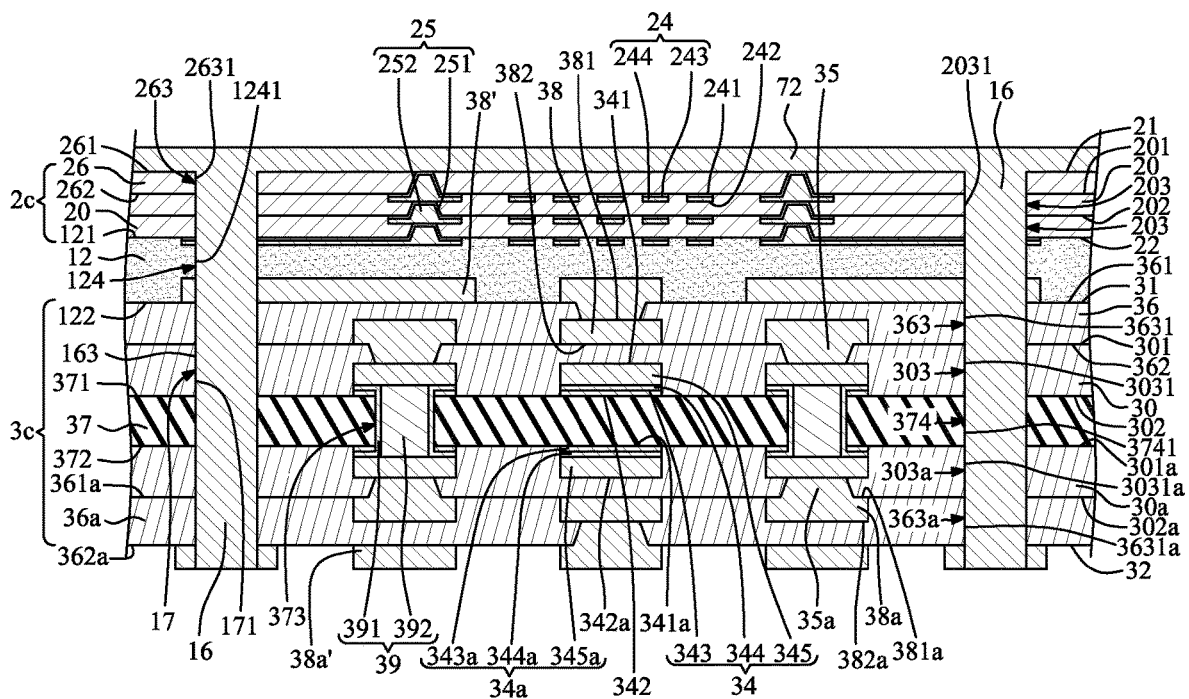
FIG. 53 illustrates one or more stages of an example of a method for manufacturing a wiring structure according to some embodiments of the present disclosure.

Referring to FIG. 53, a metallic layer 72 is formed on the top surface 21 of the upper conductive structure 2 and in the through hole 17 to form at least one through via 16 in the through hole 17 by a plating technique or other suitable techniques.

Figure 54:
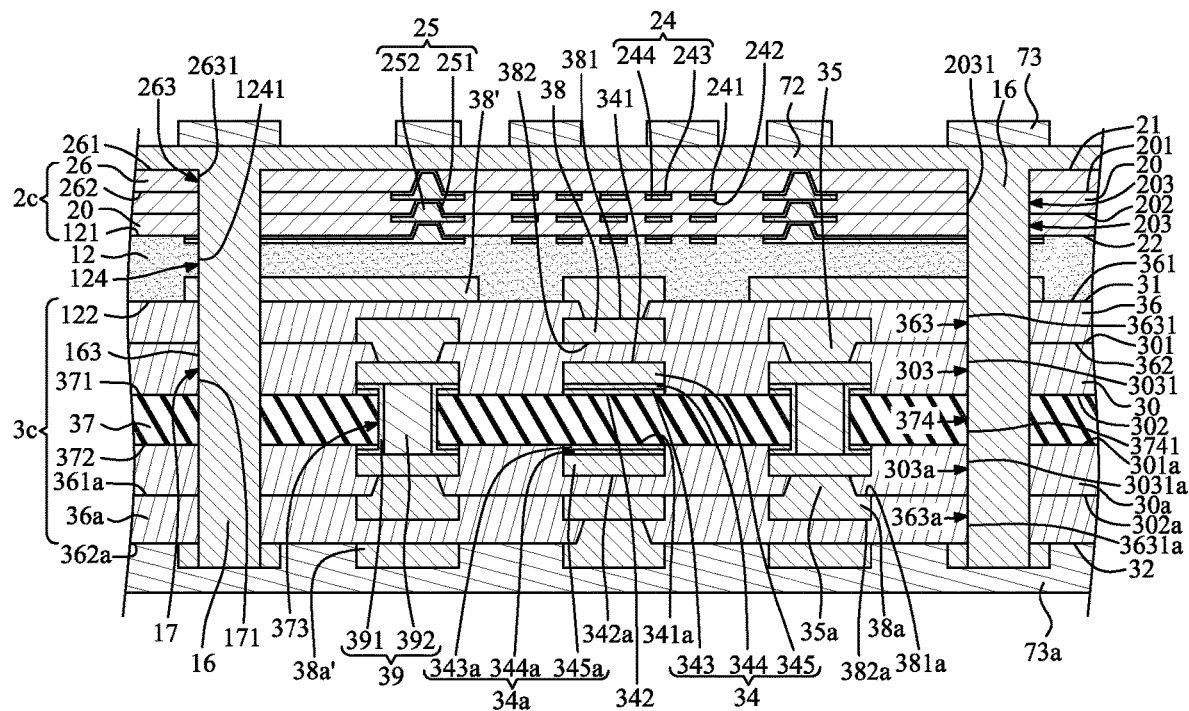
FIG. 54 illustrates one or more stages of an example of a method for manufacturing a wiring structure according to some embodiments of the present disclosure.

Referring to FIG. 54, a top photoresist layer 73 is formed or disposed on the metallic layer 72, and a bottom photoresist layer 73a is formed or disposed on the bottom surface 32 of the lower conductive structure 3. Then, the top photoresist layer 73 is patterned by an exposure and development technique or other suitable techniques.

Figure 55:
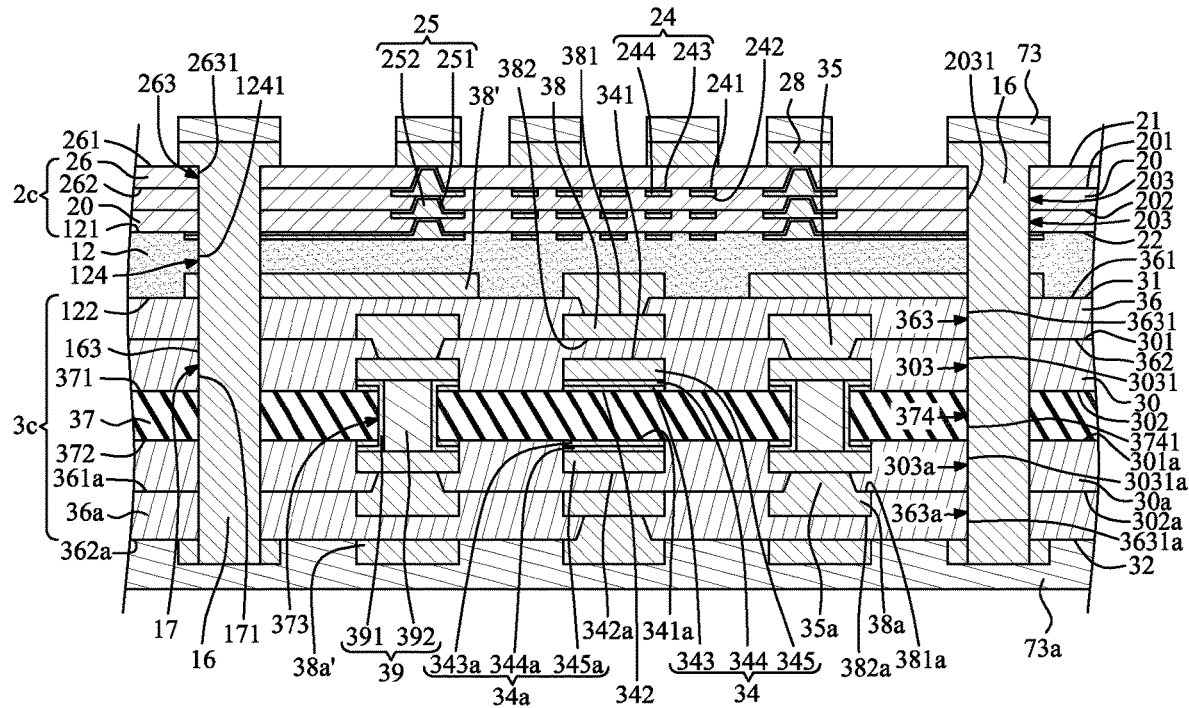
FIG. 55 illustrates one or more stages of an example of a method for manufacturing wiring structure according to some embodiments of the present disclosure.

Referring to FIG. 55, portions of the metallic layer 72 that are not covered by the top photoresist layer 73 are removed by an etching technique or other suitable techniques. Portions of the metallic layer 72 that are covered by the top photoresist layer 73 remain to form an outer circuit layer 28. Then, the top photoresist layer 73 and the bottom photoresist layer 73a are removed by a stripping technique or other suitable techniques, so as to obtain the wiring structure 1c of FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
   a redistribution structure including at least one upper dielectric layer and at least one circuit redistribution layer in contact with the upper dielectric layer;
   substrate structure including a core portion, at least one lower dielectric layer, and at least one lower circuit layer in contact with the lower dielectric layer, wherein the at least one lower dielectric layer of the lower conductive structure is substantially free of glass fiber, wherein the at least one lower dielectric layer and the at least one lower circuit layer of the substrate structure are disposed adjacent to a surface of the core portion, wherein the core portion is substantially free of glass fiber, and wherein the core portion includes an insulating film;
   an adhesive layer disposed between the redistribution structure and the substrate structure and bonding the redistribution structure and the substrate structure together, wherein the redistribution structure is electrically connected to the substrate structure; and
   at least one upper through via extending through at least a portion of the redistribution structure and the adhesive layer, and electrically connected to the lower circuit layer of the substrate structure.

2. The wiring structure of claim 1, wherein a Young's modulus of the at least one lower dielectric layer of the substrate structure is greater than or equal to about 4.0 GPa.

3. The wiring structure of claim 1, wherein the substrate structure is a resin coated copper-foil substrate.

4. The wiring structure of claim 1, wherein a coefficient of thermal expansion (CTE) of the redistribution structure is less than a CTE of the adhesive layer, and the CTE of the adhesive layer is less than a CTE of the substrate structure.

5. The wiring structure of claim 1, wherein a line space of the lower circuit layer of the substrate structure is greater than a line space of the circuit redistribution layer of the redistribution structure.

6. A wiring structure, comprising:
   a redistribution structure including at least one upper dielectric layer and at least one-circuit redistribution layer in contact with the upper dielectric layer;
   a substrate structure including at least one lower dielectric layer and at least one lower circuit layer in contact with the lower dielectric layer;
   an adhesive layer disposed between the redistribution structure and the substrate structure and bonding the redistribution structure and the substrate structure together, wherein the redistribution structure is electrically connected to the substrate structure, a coefficient of thermal expansion (CTE) of the redistribution structure is less than a CTE of the adhesive layer, and the CTE of the adhesive layer is less than a CTE of the substrate structure; and
   at least one upper through via extending through at least a portion of the redistribution structure and the adhesive layer, and electrically connected to the lower circuit layer of the substrate structure.

7. The wiring structure of claim 6, wherein the CTE of the adhesive layer is greater than about 0.8 times the CTE of the substrate structure.

8. The wiring structure of claim 6, wherein the at least one lower dielectric layer of the substrate structure includes an insulating film.

9. The wiring structure of claim 6, wherein the substrate structure further includes a core portion, the at least one lower dielectric layer and the at least one lower circuit layer of the substrate structure are disposed adjacent to a surface of the core portion, and the core portion includes an insulating film.

10. The wiring structure of claim 6, wherein the adhesive layer includes an insulating film.

11. A wiring structure, comprising:
    a low-density stacked substrate structure including at least one dielectric layer and at least one low-density circuit layer in contact with the dielectric layer, wherein the at least one dielectric layer of the low-density stacked substrate structure includes a first insulating film;
    a high-density stacked redistribution structure disposed on the low-density stacked substrate structure, wherein the high-density stacked redistribution structure includes at least one dielectric layer and at least one high-density circuit redistribution layer in contact with the dielectric layer of the high-density stacked redistribution structure;

an adhesive layer disposed between the low-density stacked substrate structure and the high-density stacked redistribution structure and bonding the low-density stacked substrate structure and the high-density stacked redistribution structure together, wherein the low-density stacked substrate structure is electrically connected to the high-density stacked redistribution structure, and the adhesive layer includes a second insulating film; and at least one upper through via extending through at least a portion of the high-density stacked redistribution structure and the adhesive layer, and electrically connected to the lower-density circuit layer of the low-density stacked substrate structure, wherein a coefficient of thermal expansion (CTE) of the high-density stacked redistribution structure is less than a CTE of the adhesive layer, and the CTE of the adhesive layer is less than a CTE of the low-density stacked substrate structure.

12. The wiring structure of claim 11, wherein the low-density stacked substrate structure and the adhesive layer are substantially free of glass fiber.

13. The wiring structure of claim 1, wherein the redistribution structure further comprises at least one inner via, and wherein the at least one inner via tapers in a direction away from the adhesive layer.

14. The wiring structure of claim 6, wherein the redistribution structure further comprises at least one inner via, and wherein the at least one inner via tapers in a direction away from the adhesive layer.

15. The wiring structure of claim 11, wherein the high-density stacked redistribution structure further comprises at least one inner via, and wherein the at least one inner via tapers in a direction away from the adhesive layer.

16. The wiring structure of claim 1, wherein the redistribution structure further comprises at least one inner via, wherein a tapering direction of the at least one upper through via is opposite to a tapering direction of the at least one inner via in the redistribution structure.

17. The wiring structure of claim 6, wherein the redistribution structure further comprises at least one inner via, wherein a tapering direction of the at least one upper through via is opposite to a tapering direction of the at least one inner via in the redistribution structure.

18. The wiring structure of claim 11, wherein the high-density stacked redistribution structure further comprises at least one inner via, wherein a tapering direction of the at least one upper through via is opposite to a tapering direction of the at least one inner via in the high-density stacked redistribution structure.

* * * * *